(12) United States Patent
Toda

(10) Patent No.: US 10,401,619 B2
(45) Date of Patent: Sep. 3, 2019

(54) IMAGING DEVICE, MANUFACTURING APPARATUS, MANUFACTURING METHOD, AND ELECTRONIC APPARATUS

(71) Applicant: SONY CORPORATION, Tokyo (JP)

(72) Inventor: Atsushi Toda, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 14/911,590

(22) PCT Filed: Sep. 10, 2014

(86) PCT No.: PCT/JP2014/004647
§ 371 (c)(1),
(2) Date: Feb. 11, 2016

(87) PCT Pub. No.: WO2015/040825
PCT Pub. Date: Mar. 26, 2015

(65) Prior Publication Data
US 2016/0202475 A1 Jul. 14, 2016

(30) Foreign Application Priority Data
Sep. 18, 2013 (JP) .................. 2013-193376

(51) Int. Cl.
*G02B 1/06* (2006.01)
*G03B 21/56* (2006.01)
(Continued)

(52) U.S. Cl.
CPC ........... *G02B 27/0025* (2013.01); *G02B 3/04* (2013.01); *G02B 3/12* (2013.01); *G02B 3/14* (2013.01);
(Continued)

(58) Field of Classification Search
CPC .... G02B 27/145; G02B 3/0056; G02B 5/045; G02B 3/14; G02B 15/173; G02B 15/14;
(Continued)

(56) References Cited

U.S. PATENT DOCUMENTS 6,483,093 B1 * 11/2002 Takemura ............... F24J 2/085
250/203.4
7,729,055 B2 * 6/2010 Liu ....................... G02B 3/0062
359/619
(Continued)

FOREIGN PATENT DOCUMENTS

| JP | 10-062609 A | 3/1998 |
| JP | 2007-184322 A | 7/2007 |
| JP | 2013-509208 A | 3/2013 |

OTHER PUBLICATIONS

Office Action for CN Patent Application No. 201480050326.3, dated May 3, 2018, 03 pages of Office Action and 05 pages of English Translation.

*Primary Examiner* — Dawayne Pinkney
(74) *Attorney, Agent, or Firm* — Chip Law Group

(57) ABSTRACT

An imaging device includes: a photoelectric conversion unit; and a correction unit that corrects the angle of light incident on the photoelectric conversion unit, the correction unit being located on the side of the light incident on the photoelectric conversion unit. The correction unit has a curved surface, and the surface shape of the curved surface is a spherical surface. The surface shape is a shape according to a predetermined equation involving the radius of the spherical surface, the distance from the center of the optical axis of the imaging plane to the edge of the imaging plane, and the refractive index of the material forming the correction unit.

20 Claims, 24 Drawing Sheets

(51) Int. Cl.
*G02B 27/10* (2006.01)
*G02B 15/14* (2006.01)
*G02B 7/02* (2006.01)
*B29D 11/00* (2006.01)
*G02B 27/00* (2006.01)
*G02B 3/12* (2006.01)
*G02B 13/18* (2006.01)
*G02B 3/04* (2006.01)
*G02B 3/14* (2006.01)
*G02B 26/00* (2006.01)
*H01L 27/146* (2006.01)
*H04N 5/357* (2011.01)
*G02B 3/00* (2006.01)

(52) U.S. Cl.
CPC ............ *G02B 13/18* (2013.01); *G02B 26/004* (2013.01); *H01L 27/14618* (2013.01); *H01L 27/14625* (2013.01); *H01L 27/14627* (2013.01); *H04N 5/3572* (2013.01); *G02B 2003/0093* (2013.01); *H01L 2924/0002* (2013.01); *H04N 2209/047* (2013.01)

(58) Field of Classification Search
CPC ........ G02B 7/08; G03B 21/56; G03B 21/625; G03B 21/602; B29L 2011/0016; B29D 11/0073; H01L 41/22; H01L 41/042; H01L 41/044; F04B 43/046; A45B 25/02; G11B 5/0552
USPC ........ 359/665–666, 618–621, 625–626, 443, 359/454–455, 676–677, 683, 824; 264/1.1, 1.32, 2.7; 29/25, 35; 310/311, 310/317–318; 360/294.4
See application file for complete search history.

(56) References Cited

U.S. PATENT DOCUMENTS

2001/0017985 A1* 8/2001 Tsuboi .................... G02B 3/14
396/506
2011/0032376 A1* 2/2011 Takizawa .......... H01L 27/14627
348/222.1
2012/0228481 A1* 9/2012 Tanaka ................ H01L 31/0524
250/214.1
2015/0303656 A1* 10/2015 Morita .................... H01S 5/143
372/44.01

* cited by examiner

FIG. 21
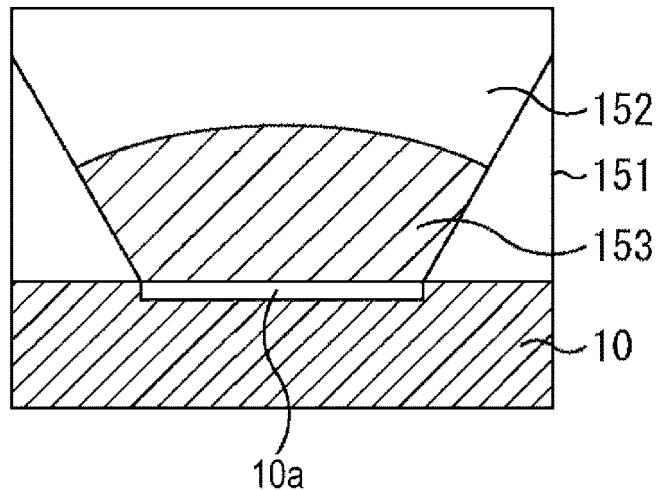
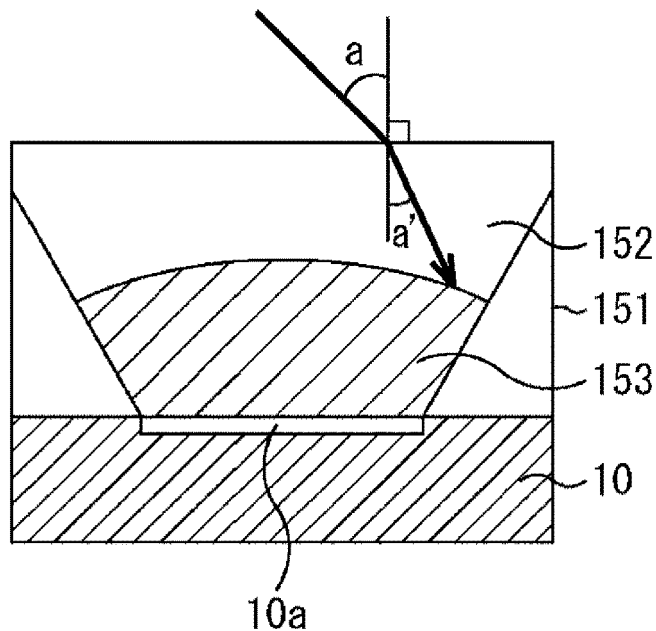

IMAGING DEVICE, MANUFACTURING APPARATUS, MANUFACTURING METHOD, AND ELECTRONIC APPARATUS

TECHNICAL FIELD

The present technique relates to imaging devices, manufacturing apparatuses, manufacturing methods, and electronic apparatuses. More particularly, the present technique relates to an imaging device, a manufacturing apparatus, a manufacturing method, and an electronic apparatus that is suitable for correcting shading properties.

CROSS REFERENCE TO RELATED APPLICATIONS

This application claims the benefit of Japanese Priority Patent Application JP 2013-193376 filed on Sep. 18, 2013, the entire contents of which are incorporated herein by reference.

BACKGROUND ART

In camera optics, it is known that sensitivity becomes lower at a location further away from the center of the imaging plane due to oblique incidence of a principal ray. This is called "shading". Particularly, if the respective colors of RGB (Red, Green, and Blue) differ in sensitivity decrease rate, white balance is degraded, and colors are generated. This is called "color shading", for example. Color mixing also occurs, as light reaches adjacent pixels at the same time.

Correcting such shading and color mixing is preferable in improving the performance of an image sensor. In an image sensor in which the RGB photodiodes (PDs) or photoelectric conversion layers are stacked in the vertical direction (vertical spectrum), shading, color shading, color mixing become conspicuous due to oblique incidence. This is because light that enters obliquely does not easily reach the PDs or photoelectric conversion layers on the back side.

PTLs 1 and 2 disclose pupil correction to be performed on the organic photoelectric conversion films or on-chip lenses of the respective pixels. However, it is not possible to avoid shading due to the difficulty of pupil correction on the red (R) and blue (B) PDs, and color mixing caused by light entering adjacent pixels due to oblique incidence in the PDs.

In view of those problems, PTLs 3 and 4 discloses shading correction to be performed by modifying the lens shapes of on-chip lenses, and converting oblique incidence of light into normal incidence. When the lens shapes of on-chip lenses are modified, shading correction sufficient to achieve normal incidence of a principal ray can be performed. However, the shapes of the on-chip lenses of the respective pixels are preferably varied in accordance with the inclination of the principal ray.

As a result, the design cost and the process cost for forming OCLs become higher. In a camera that has a telescopic function, oblique incidence of a principal ray can be corrected at the nearest end of depth of field, but a principal ray enters almost perpendicularly even at an edge of the imaging plane at the furthest end of depth of field, if the shapes of the OCLs are fixed. As a result, degradation in characteristics might occur.

PTLs 5 through 7 disclose shading correction by attaching a transparent material having a convex curved surface. However, any specific structure for that has not been disclosed, and there is a possibility that sufficient correction will not be performed, and further degradation will occur, depending on shapes such as curvatures. With a convex transparent material of a fixed type, oblique incidence of a principal ray can be corrected at the nearest end. However, as long as the shape of the convex curved surface is fixed, the principal ray enters almost perpendicularly even at the edge of the imaging plane at the furthest end of depth of field. As a result, more characteristics degradation might occur.

CITATION LIST

Patent Literature

[PTL 1]
JP 2006-269923 A
[PTL 2]
U.S. Pat. No. 7,550,797
[PTL 3]
JP 2006-351972 A
[PTL 4]
JP 2009-15315 A
[PTL 5]
JP 2007-184322 A
[PTL 6]
JP 2006-254864 A
[PTL 7]
JP 2005-347075 A

SUMMARY OF INVENTION

Technical Problem

As described above, correcting shading and color mixing is preferable in improving the performance of an image sensor. Therefore, optimum correction is expected to be performed on any incidence angles of principal rays, and optimum shading correction is expected to be performed on any changes in principal rays from the nearest end to the furthest end.

The present technique has been developed in view of those circumstances, and aims to perform appropriate shading correction.

Solution to Problem

An imaging device as disclosed herein includes: a photoelectric conversion unit; and a correction unit configured to correct an angle of light incident on the photoelectric conversion unit, wherein the correction unit is located on a light incident side of the photoelectric conversion unit.

The correction unit can have a curved surface. More particularly, a surface shape of the curved surface can be a spherical surface, and wherein the surface shape satisfies the following condition:

$$(1.15 \times n - 0.38 - 0.0067473 \times ((n-1.2)^2/0.4^2) \times 30) \times x1 \leq r \leq (((n-1.35)^2/0.25^2) \times 23.157/(20-24.925)^{0.46551} + 44.5978 - 29 \times n) \times x1$$

where r represents a radius of the spherical surface, x1 represents a distance from the center of an optical axis of an imaging plane to an edge of the imaging plane, and n represents a refractive index of a material forming the correction unit.

In accordance with further embodiments, a surface shape of the curved surface is a spherical surface that satisfies the following condition:

$$(1.15 \times n - 0.38 - 0.0067473 \times ((n-1.2)^2/0.4^2) \times 20) \times x1 \leq r \leq$$
$$(((n-1.35)^2/0.25^2) \times 23.157/(30-24.925)^{0.46551} +$$
$$44.5978 - 29 \times n) \times x1$$

where r represents a radius of the spherical surface, x1 represents a distance from the center of an optical axis of an imaging plane to an edge of the imaging plane, and n represents a refractive index of a material forming the correction unit.

In accordance with still other embodiments, the correction unit has a spherical surface that satisfies the following condition:

$$(0.1733 + 1.7 \times n - 0.02993 \times ((n-0.9)^2) \times 30) \times x1 \leq r \leq (((n-1.1)^2/0.5^2) \times 9.2769/(20-19.206)^{0.3767} + 9.94712 - 6.5 \times n) \times x1$$

where r represents a radius of the spherical surface, x1 represents a distance from the center of an optical axis of an imaging plane to an edge of the imaging plane, and n represents a refractive index of a material forming the correction unit.

In accordance with still other embodiments, the correction unit has a spherical surface that satisfies the following condition:

$$(0.1733 + 1.7 \times n - 0.02993 \times ((n-0.9)^2) \times 20) \times x1 \leq r \leq (((n-1.1)^2/0.5^2) \times 9.2769/(30-19.206)^{0.3767} + 9.94712 - 6.5 \times n) \times x1$$

where r represents a radius of the spherical surface, x1 represents a distance from the center of an optical axis of an imaging plane to an edge of the imaging plane, and n represents a refractive index of a material forming the correction unit.

In accordance with still other embodiments, the correction unit has an aspherical surface that satisfies the following condition:

Arc Cos [Sqrt[$n^2 - 2 \times n \times$Cos [Tan [$x/(x1/$Arc Tan $[a_{max}])$]]]+Cos [Tan [$x/(x1/$Arc Tan $[a_{max}])$]]$^2$]/ sqrt[$n^2 - 2 \times n \times$Cos [Tan [$x/(x1/$Arc Tan $[a_{max}])$]]]+ Cos [Tan [$x/(x1/$Arc Tan $[a_{max}])$]]$^2$+Sin [Tan [$x/(x1/$Arc Tan $[a_{max}])$]]$^2$]]$-5 \leq e \leq$ Arc Cos [Sqrt[$n^2 - 2 \times n \times$Cos [Tan [$x/(x1/$Arc Tan $[a_{max}])$]]]+Cos [Tan [$x/(x1/$Arc Tan $[a_{max}])$]]$^2$]/ sqrt[$n^2 - 2 \times n \times$Cos [Tan [$x/(x1/$Arc Tan $[a_{max}])$]]]+ Cos [Tan [$x/(x1/$Arc Tan $[a_{max}])$]]$^2$+Sin [Tan [$x/(x1/$Arc Tan $[a_{max}])$]]$^2$]]$+5$ where e represents an angle between a line perpendicular to a surface of the correction unit and a line perpendicular to an imaging plane, n represents a refractive index of a material forming the correction unit, x represents a distance from the center of an optical axis, x1 represents a distance from the center of the optical axis to an edge, $a_{max}$ represents a maximum incidence angle of the light, and $a_{max}$ is from 20 to 30 degrees.

In accordance with still other embodiments, the correction unit has an aspherical surface that satisfies the following condition:

Arc Cos [Sqrt[$n^2 - 2 \times n \times$Cos [Tan [$x/(x1/$Arc Tan $[a_{max}])$]]]+Cos [Tan [$x/(x1/$Arc Tan $[a_{max}])$]]$^2$]/ sqrt[$n^2 - 2 \times n \times$Cos [Tan [$x/(x1/$Arc Tan $[a_{max}])$]]]+ Cos [Tan [$x/(x1/$Arc Tan $[a_{max}])$]]$^2$+Sin [Tan [$x/(x1/$Arc Tan $[a_{max}])$]]$^2$]]$-2 \leq e \leq$ Arc Cos [Sqrt[$n^2 - 2 \times n \times$Cos [Tan [$x/(x1/$Arc Tan $[a_{max}])$]]]+Cos [Tan [$x/(x1/$Arc Tan $[a_{max}])$]]$^2$]/ sqrt[$n^2 - 2 \times n \times$Cos [Tan [$x/(x1/$Arc Tan $[a_{max}])$]]]+ Cos [Tan [$x/(x1/$Arc Tan $[a_{max}])$]]$^2$+Sin [Tan [$x/(x1/$Arc Tan $[a_{max}])$]]$^2$]]$+2$ where e represents an angle in degrees between a line perpendicular to a surface of the correction unit and a line perpendicular to an imaging plane, n represents a refractive index of a material forming the correction unit, x represents a distance from the center of an optical axis, x1 represents a distance from the center of the optical axis to an edge, $a_{max}$ represents a maximum incidence angle of the light, and $a_{max}$ is from 20 to 30 degrees. The correction unit can be one of a convertible lens and a shape-variable lens, and the surface shape of the correction unit can be controlled by a tension stress. Furthermore, the correction unit can be one of a convertible lens and a shape-variable lens formed with two layers of liquids, wherein one of the liquids has a convex interference shape, and wherein the convex interference shape of the one of the liquids is controlled by a voltage application. The convex interference shape can be a shape satisfying the following condition:

$$(1.15 \times n - 0.38 - 0.0067473 \times ((n-1.2)^2/0.4^2) \times \text{Arc Sin}$$
$$[\text{Sin } 30/n1]) \times x1 \leq r \leq (((n-1.35)^2/0.25^2) \times 23.157/$$
$$(\text{Arc Sin } [\text{Sin } 20/n1] - 24.925)^{0.46551} + 44.5978 -$$
$$29 \times n) \times x1$$

where n is equal to n1/n2, n1 represents a refractive index of a first liquid on a side of the light incidence, n2 represents a refractive index of a second liquid on a side of the photoelectric conversion unit, x1 represents a distance from the center of an optical axis of an imaging plane to an edge of the imaging plane, and r represents a radius of the convex shape, the first liquid and the second liquid being the two layers of liquids. Alternatively, the convex interference shape is a shape satisfying the following condition:

$$(1.15 \times n - 0.38 - 0.0067473 \times ((n-1.2)^2/0.4^2) \times \text{Arc Sin}$$
$$[\text{Sin } 20/n1]) \times x1 \leq r \leq (((n-1.35)^2/0.25^2) \times 23.157/$$
$$(\text{Arc Sin } [\text{Sin } 30/n1] - 24.925)^{0.46551} + 44.5978 -$$
$$29 \times n) \times x1$$

where n is equal to n1/n2, n1 represents a refractive index of a first liquid on a side of the light incidence, n2 represents a refractive index of a second liquid on a side of the photoelectric conversion unit, x1 represents a distance from the center of an optical axis of an imaging plane to an edge of the imaging plane, and r represents a radius of the convex shape, the first liquid and the second liquid being the two layers of liquids. As yet another example, the convex interference shape is a shape satisfying the following condition:

$$(0.1733 + 1.7 \times n - 0.02993 \times ((n-0.9)^2) \times \text{Arc Sin } [\text{Sin }$$
$$30/n1]) \times x1 \leq r \leq (((n-1.1)^2/0.5^2) \times 9.2769/(\text{Arc Sin}$$
$$[\text{Sin } 20/n1] - 19.206)^{0.3767} + 9.94712 - 6.5 \times n) \times x1$$

where n is equal to n1/n2, n1 represents a refractive index of a first liquid on a side of the light incidence, n2 represents a refractive index of a second liquid on a side of the photoelectric conversion unit, x1 represents a distance from the center of an optical axis of an imaging plane to an edge of the imaging plane, and r represents a radius of the convex shape, the first liquid and the second liquid being the two layers of the liquids. As yet another alternative, the convex interference shape is a shape satisfying the following condition:

$$(0.1733 + 1.7 \times n - 0.02993 \times ((n-0.9)^2) \times \text{Arc Sin } [\text{Sin}$$
$$20/n1]) \times x1 \leq r \leq (((n-1.1)^2/0.5^2) \times 9.2769/(\text{Arc Sin}$$
$$[\text{Sin } 30/n1] - 19.206)^{0.3767} + 9.94712 - 6.5 \times n) \times x1$$

where n is equal to n1/n2, n1 represents a refractive index of a first liquid on a side of the light incidence, n2 represents a refractive index of a second liquid on a side of the photoelectric conversion unit, x1 represents a distance from the center of an optical axis of an imaging plane to an edge of the imaging plane, and r represents a radius of the convex shape, the first liquid and the second liquid being the two layers of the liquids. In accordance with still other embodiments, the convex interference shape is a shape satisfying the following condition:

$$d_{max}'=\text{Arc Sin }[n1 \times \text{Sin }[c_{max}']/n2]-b'$$

Arc Cos [Sqrt[$n^2-2 \times n \times$Cos [Tan [$x/(x1/$Arc Tan [$d_{max}'$])]]+Cos[Tan [$x/(x1/$Arc Tan [$d_{max}'$])]]$^2$]/ sqrt[$n^2-2 \times n \times$Cos [Tan [$x/(x1/$Arc Tan [$d_{max}'$])]]+ Cos [Tan [$x/(x1/$Arc Tan [$d_{max}'$])]]$^2$+Sin [Tan [$x/(x1/$Arc Tan [$d_{max}'$])]]$^2$]]−5≤e≤

Arc Cos [Sqrt[$n^2-2 \times n \times$Cos [Tan [$x/(x1/$Arc Tan [$d_{max}'$])]]+Cos [Tan [$x/(x1/$Arc Tan [$d_{max}'$])]]$^2$]/ sqrt[$n^2-2 \times n \times$Cos [Tan [$x/(x1/$Arc Tan [$d_{max}'$])]]+ Cos [Tan [$x/(x1/$Arc Tan [$d_{max}'$])]]$^2$+Sin [Tan [$x/(x1/$Arc Tan [$d_{max}'$])]]$^2$]]+5 where e represents an angle between a line perpendicular to a surface of the correction unit and a line perpendicular to an imaging plane, n is equal to n1/n2, n1 represents a refractive index of a first liquid on a side of the light incidence, n2 represents a refractive index of a second liquid on a side of the photoelectric conversion unit, x represents a distance from the center of an optical axis, x1 represents a distance from the center of the optical axis to an edge, cmax' represents a maximum incidence angle of the light incident on the second liquid, and $d_{max}'$ represents a maximum incidence angle of the light in the second liquid, the first liquid and the second liquid being the two layers of the liquids. In accordance with still other embodiments, the interference convex shape is a shape satisfying the following condition:

$$d_{max}'=\text{Arc Sin }[n1 \times \text{Sin }[c_{max}']/n2]-b'$$

Arc Cos [Sqrt[$n^2-2 \times n \times$Cos [Tan [$x/(x1/$Arc Tan [$d_{max}'$])]]+Cos [Tan [$x/(x1/$Arc Tan [$d_{max}'$])]]$^2$]/ sqrt[$n^2-2 \times n \times$Cos [Tan [$x/(x1/$Arc Tan [$d_{max}'$])]]+ Cos [Tan [$x/(x1/$Arc Tan [$d_{max}'$])]]$^2$+Sin [Tan [$x/(x1/$Arc Tan [$d_{max}'$]))]]$^2$]]−2≤e≤

Arc Cos [Sqrt[$n^2-2 \times n \times$Cos [Tan [$x/(x1/$Arc Tan [$d_{max}'$])]]+Cos [Tan [$x/(x1/$Arc Tan [$d_{max}'$])]]$^2$]/ sqrt[$n^2-2 \times n \times$Cos [Tan [$x/(x1/$Arc Tan [$d_{max}'$])]]+ Cos [Tan [$x/(x1/$Arc Tan [$d_{max}'$])]]$^2$+Sin [Tan [$x/(x1/$Arc Tan [$d_{max}'$])]]$^2$]]+2 where e represents an angle between a line perpendicular to a surface of the correction unit and a line perpendicular to an imaging plane, n is equal to n1/n2, n1 represents a refractive index of a first liquid on a side of the light incidence, n2 represents a refractive index of a second liquid on a side of the photoelectric conversion unit, x represents a distance from the center of an optical axis, x1 represents a distance from the center of the optical axis to an edge, cmax' represents a maximum incidence angle of the light incident on the second liquid, and $d_{max}'$ represents a maximum incidence angle of the light in the second liquid, the first liquid and the second liquid being the two layers of the liquids.

An apparatus for manufacturing an imaging device as described herein includes: a photoelectric conversion unit; and a correction unit configured to correct an angle of light incident on the photoelectric conversion unit, the correction unit being located on a light incident side of the photoelectric conversion unit, wherein the correction unit has a curved surface, wherein a surface shape of the curved surface is spherical, and wherein the surface shape satisfies one of the following conditions:

$$(1.15 \times n - 0.38 - 0.0067473 \times ((n-1.2)^2/0.4^2) \times 30) \times x1 \leq r \leq (((n-1.35)^2/0.25^2) \times 23.157/(20-24.925)^{0.46551} + 44.5978 - 29 \times n) \times x1$$

or $$(1.15 \times n - 0.38 - 0.0067473 \times ((n-1.2)^2/0.4^2) \times 20) \times x1 \leq r \leq (((n-1.35)^2/0.25^2) \times 23.157/(30-24.925)^{0.46551} + 44.5978 - 29 \times n) \times x1$$

where r represents a radius of the spherical surface, x1 represents a distance from the center of an optical axis of an imaging plane to an edge of the imaging plane, and n represents a refractive index of a material forming the correction unit.

A further apparatus for manufacturing an imaging device as described herein can include: a photoelectric conversion unit; and a correction unit configured to correct an angle of light incident on the photoelectric conversion unit, the correction unit being located on a light incident side of the photoelectric conversion unit, wherein the correction unit has a curved surface, wherein a surface shape of the curved surface is spherical, and wherein the surface shape satisfies one of the following conditions:

$$(0.1733+1.7 \times n - 0.02993 \times ((n-0.9)^2) \times 30) \times x1 \leq r \leq (((n-1.1)^2/0.5^2) \times 9.2769/(20-19.206)^{0.3767} + 9.94712 - 6.5 \times n) \times x1$$

or $$(0.1733+1.7 \times n - 0.02993 \times ((n-0.9)^2) \times 20) \times x1 \leq r \leq (((n-1.1)^2/0.5^2) \times 9.2769/(30-19.206)^{0.3767} + 9.94712 - 6.5 \times n) \times x1$$

where r represents a radius of the spherical surface, x1 represents a distance from the center of an optical axis of an imaging plane to an edge of the imaging plane, and n represents a refractive index of a material forming the correction unit.

A further apparatus for manufacturing an imaging device as described herein can include: a photoelectric conversion unit; and a correction unit configured to correct an angle of light incident on the photoelectric conversion unit, wherein the correction unit is located on a light incident side of the photoelectric conversion unit, wherein the correction unit has a curved surface, wherein a surface shape of the curved surface is aspherical, and wherein the surface shape satisfies one of the following conditions:

Arc Cos [Sqrt[$n^2-2 \times n \times$Cos [Tan [$x/(x1/$Arc Tan [$a_{max}$])]]+Cos [Tan [$x/(x1/$Arc Tan [$a_{max}$])]]$^2$]/ sqrt[$n^2-2 \times n \times$Cos [Tan [$x/(x1/$Arc Tan [$a_{max}$])]]+ Cos [Tan [$x/(x1/$Arc Tan [$a_{max}$])]]$^2$+Sin [Tan [$x/(x1/$Arc Tan [$a_{max}$])]]$^2$]]−5≤e≤

Arc Cos [Sqrt[$n^2-2 \times n \times$Cos [Tan [$x/(x1/$Arc Tan [$a_{max}$])]]+Cos [Tan [$x/(x1/$Arc Tan [$a_{max}$])]]$^2$]/ sqrt[$n^2-2 \times n \times$Cos [Tan [$x/(x1/$Arc Tan [$a_{max}$])]]+ Cos [Tan [$x/(x1/$Arc Tan [$a_{max}$])]]$^2$+Sin [Tan [$x/(x1/$Arc Tan [$a_{max}$])]]$^2$]]+5 or

Arc Cos [Sqrt[$n^2-2 \times n \times$Cos [Tan [$x/(x1/$Arc Tan [$a_{max}$])]]+Cos [Tan [$x/(x1/$Arc Tan [$a_{max}$])]]$^2$]/ sqrt[$n^2-2 \times n \times$Cos [Tan [$x/(x1/$Arc Tan [$a_{max}$])]]+ Cos [Tan [$x/(x1/$Arc Tan [$a_{max}$])]]$^2$+Sin [Tan [$x/(x1/$Arc Tan [$a_{max}$])]]$^2$]]−2≤e≤

Arc Cos [Sqrt[$n^2-2 \times n \times$Cos [Tan [$x/(x1/$Arc Tan [$a_{max}$])]]+Cos [Tan [$x/(x1/$Arc Tan [$a_{max}$])]]$^2$]/ sqrt[$n^2-2 \times n \times$Cos [Tan [$x/(x1/$Arc Tan [$a_{max}$])]]+ Cos [Tan [$x/(x1/$Arc Tan [$a_{max}$])]]$^2$+Sin [Tan [$x/(x1/$Arc Tan [$a_{max}$])]]$^2$]]+2 where e represents an angle between a line perpendicular to a surface of the correction unit and a line perpendicular to an imaging plane, n represents a refractive index of a material forming the correction unit, x represents a distance from the center of an optical axis, x1 represents a distance from the center of the optical axis to an edge, $a_{max}$ represents a maximum incidence angle of the light, and the $a_{max}$ is from 20 to 30 degrees.

A method of manufacturing an apparatus for manufacturing an imaging device as described herein can include: a photoelectric conversion unit; and a correction unit configured to correct an angle of light incident on the photoelectric conversion unit, the correction unit being located on a light incident side of the photoelectric conversion unit, the method comprising: manufacturing the correction unit, the correction unit having one of: 1) a spherical surface shape; and 2) an aspherical surface shape, wherein the surface shape satisfies one of the following conditions:

$(1.15 \times n - 0.38 - 0.0067473 \times ((n-1.2)^2/0.4^2) \times a_{max}) \times x1 \le r \le (((n-1.35)^2/0.25^2) \times 23.157/(a_{max}-24.925)^{0.46551} + 44.5978 - 29 \times n) \times x1$ $(0.1733 + 1.7 \times n - 0.02993 \times ((n-0.9)^2) \times a_{max}) \times x1 \le r \le (((n-1.1)^2/0.5^2) \times 9.2769/(a_{max}-19.206)^{0.3767} + 9.94712 - 6.5 \times n) \times x1$ Arc Cos $[Sqrt[n^2-2 \times n \times Cos\ [a] + Cos\ [a]^2]/sqrt[n^2 - 2 \times n \times Cos\ [a] + Cos\ [a]^2 + Sin\ [a]^2]] - 5 \le e \le$ Arc Cos $[Sqrt[n^2-2 \times n \times Cos\ [a] + Cos\ [a]^2]/sqrt[n^2-2 \times n \times Cos\ [a] + Cos\ [a]^2 + Sin\ [a]^2]] + 5$ or Arc Cos $[Sqrt[n^2-2 \times n \times Cos\ [a] + Cos\ [a]^2]/sqrt[n^2 - 2 \times n \times Cos\ [a] + Cos\ [a]^2 + Sin\ [a]^2]] - 2 \le e \le$ Arc Cos $[Sqrt[n^2-2 \times n \times Cos\ [a] + Cos\ [a]^2]/sqrt[n2-2 \times n \times Cos\ [a] + Cos\ [a]^2 + Sin\ [a]^2]] + 2$ where r represents a radius of the spherical surface, x1 represents a distance from the center of an optical axis of an imaging plane to an edge of the imaging plane, n represents a refractive index of a material forming the correction unit, $a_{max}$ represents a maximum incidence angle of the light, a represents the incidence angle of the light, and e represents an angle between a line perpendicular to a surface of the correction unit and a line perpendicular to the imaging plane.

An electronic apparatus as disclosed herein can include: an imaging device including: a photoelectric conversion unit; a correction unit configured to correct an angle of light incident on the photoelectric conversion unit, the correction unit being located on a light incident side of the photoelectric conversion unit; and a signal processing unit configured to perform signal processing on a pixel signal, the pixel signal being output from the photoelectric conversion unit.

In the first and second manufacturing apparatuses and the manufacturing method of one aspect of the present technique, the correction unit that corrects the angle of light incident on a photoelectric conversion unit is designed to be located on the side of the light incident on the photoelectric conversion unit. Also, the correction unit is designed to have a curved surface, and the surface shape of the curved surface is a shape that satisfies a predetermined condition.

An electronic apparatus of one aspect of the present technique includes: an imaging device that includes: a photoelectric conversion unit; and a correction unit that corrects the angle of light incident on the photoelectric conversion unit, the correction unit being located on the side of the light incident on the photoelectric conversion unit; and a signal processing unit that performs signal processing on a pixel signal that is output from the photoelectric conversion unit.

The electronic apparatus of one aspect of the present technique is designed to include: an imaging device that includes: a photoelectric conversion unit; and a correction unit that corrects the angle of light incident on the photoelectric conversion unit and is located on the side of the light incident on the photoelectric conversion unit; and a signal processing unit that performs signal processing on a pixel signal that is output from the photoelectric conversion unit.

Advantageous Effects of Invention

According to one aspect of the present technique, shading correction can be appropriately performed.

The effects described herein are not limited to the above, and may be any of the effects described in the present disclosure.

BRIEF DESCRIPTION OF DRAWINGS

FIG. 21 is a diagram for explaining a shape-variable lens.

DESCRIPTION OF EMBODIMENTS

Figure 1:
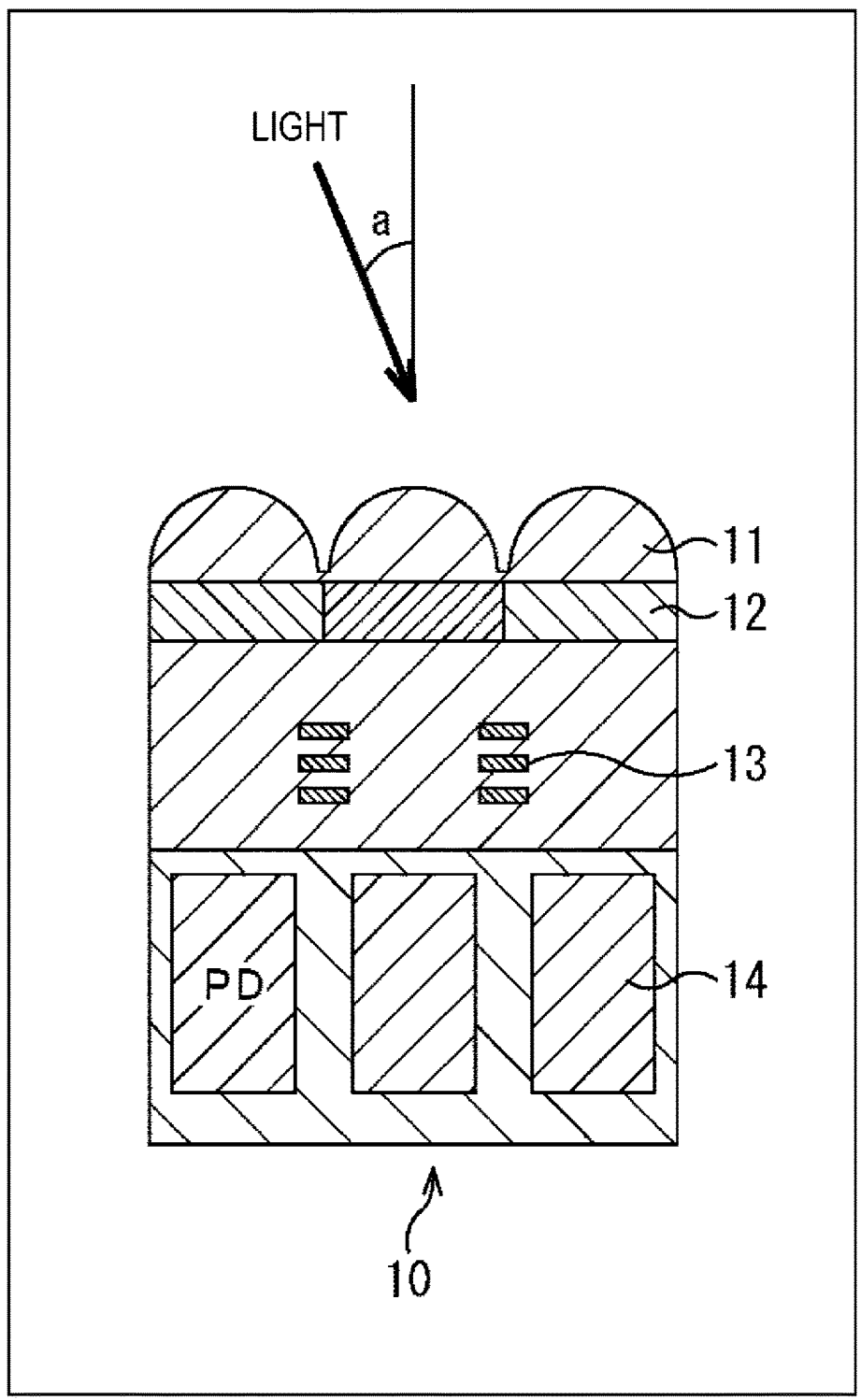
FIG. 1 is a diagram for explaining the structure of an imaging device.

The following is a description of modes (hereinafter referred to as embodiments) for carrying out the present technique. Explanation will be made in the following order.

1. Shading correction
2. Conditions to be satisfied by a correcting lens
3. Shading correction with a spherical shape
4. Attachment of a spherical correcting lens to an imaging device
5. Manufacture of a correcting lens
6. Shading correction with an aspherical shape
7. Shading correction by a correcting lens having a telescopic function
8. Shading correction with vertical spectrum
9. Electronic apparatus
<Shading Correction>

In camera optics, it is known that sensitivity becomes lower at a location further away from the center of the imaging plane due to oblique incidence of a principal ray. Such a decrease in sensitivity is called "shading", for example. Since the present technique described below is suitable for shading correction, examples of shading correction will be explained below.

FIG. 1 schematically shows the structure of an on-chip-lens (OCL) imaging device. The imaging device 10 shown in FIG. 1 includes microlenses 11, color filter layers 12, light shielding films 13, and photodiodes (PDs) 14.

Light that enters via the microlenses 11 is dispersed in accordance with the colors of the color filter layers 12, and is received by the photodiodes 14. The light shielding films 13 are provided between the adjacent photodiodes 14, and are designed to prevent light from leaking into each adjacent photodiode 14.

When a principal ray obliquely enters the imaging device 10 as shown in FIG. 1, sensitivity might become lower, or color mixing might occur due to light leaking into the adjacent photodiodes 14. Here, the incidence angle of a principal ray with respect to a line perpendicular to the substrate of the imaging device 10 is defined as "a", as shown in FIG. 1. A principal ray is a ray of light that passes through the center of a stop aperture.

Figure 2:
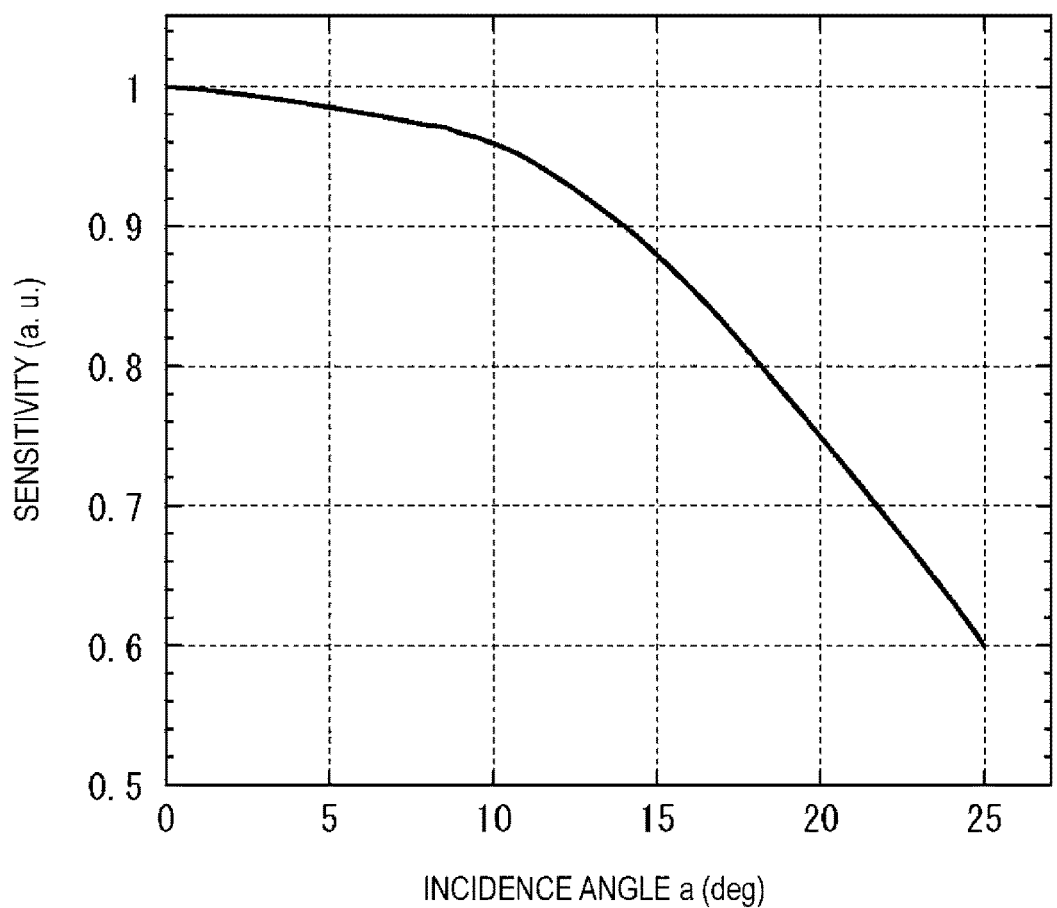
FIG. 2 is a diagram for explaining the relationship between an incidence angle of light and sensitivity.

FIG. 2 is a graph showing the shading properties in the imaging device 10. As shown in FIG. 2, the sensitivity becomes lower as the incidence angle "a" becomes larger. Since the incidence angle "a" becomes larger from the chip center toward the chip edge of the imaging device 10, the sensitivity becomes lower from the chip center toward the chip edge.

The color filter layers 12 are RGB (Red, Green, and Blue) layers. If the respective colors of RGB differ in dependence on the incidence angle "a" from one another, color unevenness might occur. So as to prevent such shading and color unevenness, the length from the microlenses 11 to the photodiodes 14 is shortened, or the aperture ratio is increased. However, a reduction in height or an increase in aperture ratio does not mean that the oblique incidence angle of the principal ray is made smaller, and there is a limit to the correction of shading properties.

In view of this, so as to reduce the oblique incidence angle of the principal ray, the incidence angle "a" is corrected to be as close to 0 degrees as possible. Where the incidence angle "a" is 0, the principal ray enters the substrate perpendicularly, and the highest sensitivity is achieved, as can be seen from FIG. 2. Where the incidence angle "a" is 15 degrees or higher, for example, the sensitivity becomes 0.9 or lower. Therefore, the sensitivity can be maintained at 0.9 or higher by correcting the incidence angle "a" to be 15 degrees or lower.

Figure 3:
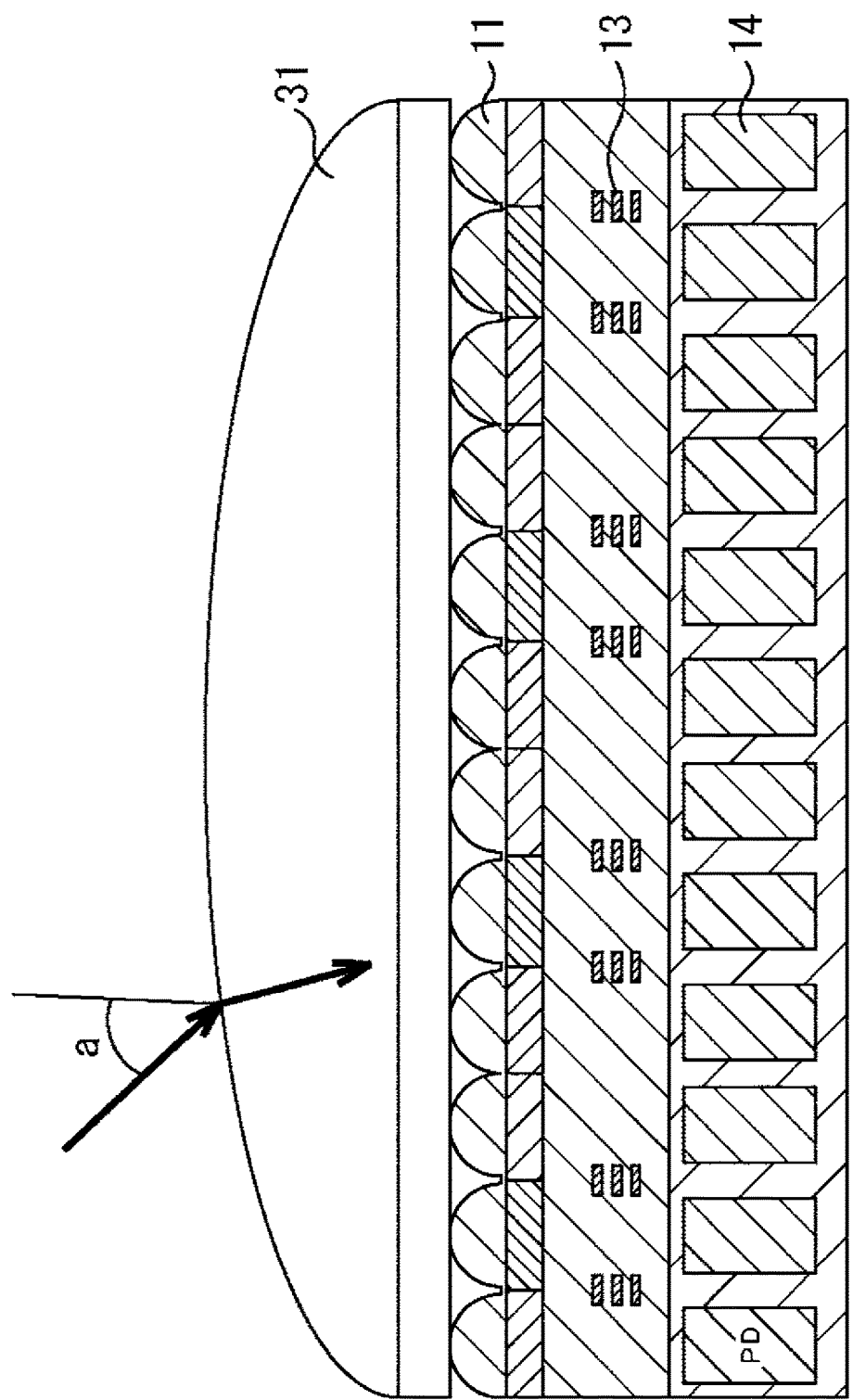
FIG. 3 is a diagram for explaining the structure of a correcting lens.

In view of this, a correcting lens 31 for shading correcting is provided over the microlenses 11, as shown in FIG. 3. The microlenses 11 are arranged in a matrix fashion, and the correcting lens 31 having such a size as to cover all the microlenses 11 are placed at such a position as to cover all the microlenses 11. The conditions to be satisfied by the correcting lens 31 are described below.

<Conditions to be Satisfied by a Correcting Lens>

As shown in FIG. 3, the correcting lens 31 has a curved surface on one side, and a flat surface on the other side. The curved surface is a spherical surface or an aspherical surface. A case with a spherical surface and a case with an aspherical surface are described below. The correcting lens 31 is formed with a transparent material, and is designed to transmit light.

In a camera that has a telescopic function, a transparent material that can control its shape to form an optimum spherical or aspherical surface satisfying predetermined conditions from the furthest end to the nearest end of depth of field is attached as the correcting lens 31 onto the imaging device 10.

As can be seen from FIG. 2, the incidence angle "a" is preferably adjusted to 15 degrees or less so as to restrict the decrease in sensitivity to 15% or less. More preferably, the incidence angle "a" is adjusted to 10 degrees or less so as to restrict the decrease in sensitivity to 5% or less.

Figure 4:
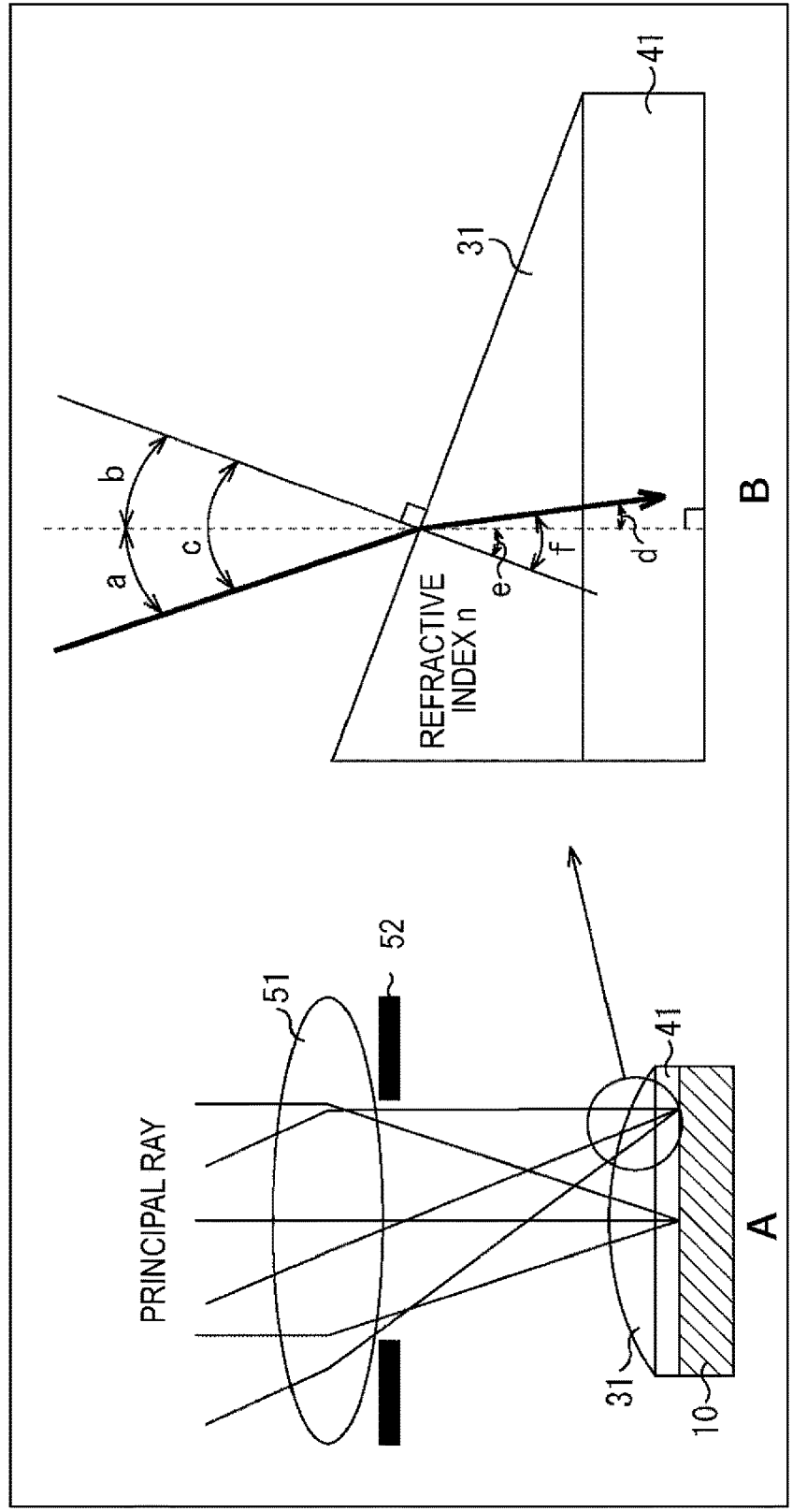
FIG. 4 is a diagram for explaining the Snell's law.

FIG. 4 is a diagram for explaining the principles of the correcting lens 31 correcting obliquely incident light. As shown in FIG. 4A, the correcting lens 31 is attached onto the imaging device 10, and a lens group 51 is provided above the correcting lens 31. The principal ray passes through the center of the aperture of a diaphragm 52. As shown in FIG. 4A, at the center of the optical axis of the imaging plane, the principal ray enters perpendicularly with respect to the surface of the imaging device 10, but enters the imaging device 10 more obliquely at portions closer to the edge of the imaging plane.

Without the correcting lens 31, light that enters obliquely enters the microlenses 11 obliquely. With the correcting lens 31, however, light that enters obliquely has its incidence angle converted to an angle of light that enters almost perpendicularly to the imaging plane, and then enters the microlenses 11 almost perpendicularly. FIG. 4B is an enlarged view of the left portion of the correcting lens 31 shown in FIG. 4A. In this example, the principal ray enters from the left. As shown in FIG. 4B, where the principal ray enters from the left, the inclined plane of the correcting lens 31 is higher at the left side, and the Snell's law is observed on this inclined plane. The Snell's law is the law for expressing the relationships among the propagation velocities, the incidence angles, and the refraction angles of the travelling waves in two media in a refractive phenomenon of general wave motion, and is also referred to as the law of refraction.

According to the Snell's law, the following equation (1) is established.

$$\mathrm{Sin}\, x = n \times \mathrm{Sin}\, y \qquad (1)$$

In the equation (1), n represents the ratio between the refractive index nx of a medium x and the refractive index ny of a medium y, and the relational expression, ny/nx=n, is satisfied. In a case where the medium x is the air, the refractive index nx is 1, and therefore, the refractive index n is equal to the refractive index ny of the medium y.

According to the Snell's law, light that enters obliquely can be refracted in the perpendicular direction. Now, to what degree is the light to be refracted is described.

The equation (1) is applied to the situation shown in FIG. 4B. This situation is based on the assumption that the angle of incident light is an angle "a" with respect to the direction perpendicular to the imaging plane (the line that is represented by the dashed line in the drawing, and is perpendicular to the imaging plane). The angle of the light travelling in the correcting lens 31 with respect to the direction perpendicular to the imaging plane is an angle "d". The refractive index of the correcting lens 31 is a refractive index "n".

The angle of the direction perpendicular to the inclined plane of the correcting lens 31 (the line that is represented by the thin line in the drawing, and is perpendicular to the inclined plane) with respect to the direction perpendicular to the imaging plane is an angle "b". In FIG. 4B, an angle "c" is the sum of the angle "a" and the angle "b", and satisfies the relationship, c=a+b.

The angle of the direction perpendicular to the inclined plane of the correcting lens 31 (the thin line in the drawing) with respect to the direction perpendicular to the imaging plane inside the correcting lens 31 is an angle "e". In FIG. 4B, an angle "f" is the sum of the angle "d" and the angle "e", and satisfies the relationship, f=d+e. The angle "b" and the angle "e" satisfy the relationship, b=e.

In FIG. 4B, when the angle "d" is 0 degrees, light that enters obliquely is refracted to form light that is perpendicular to the imaging plane. Therefore, the conditions under which the angle "d" becomes as close to 0 degrees as possible are described. The equation (1) is applied to the situation shown in FIG. 4B, and is transformed into an equation relating to the angle "d", to obtain the following equation (2).

$$d = \text{Arc Sin} [(1/n) \times \text{Sin}(b+a)] - b \quad (2)$$

If the maximum incidence angle of the principal ray of the correcting lens 31 is represented by an angle "amax", the equation (2) is converted into the following equation (3). The maximum incidence angle "amax" is the angle obtained at the left edge or the right edge of the correcting lens 31.

$$d_{max} = \text{Arc Sin} [(1/n) \times \text{Sin}(b+a_{max})] - b \quad (3)$$

Under the condition that light entering at the maximum incidence angle "amax" is converted into light that enters almost perpendicularly, light that enters obliquely is corrected, and the quantity of light that enters the imaging device 10 perpendicularly is increased. In this manner, sensitivity is increased.

As described above with reference to FIG. 4B, the relationship, b+a=c, is satisfied. Accordingly, (b+a) in the equation (2) can be substituted by (c), and can also be written like the following equation (2'). Likewise, (b+amax) can be substituted by (cmax), and the equation (3) can also be written like the following equation (3').

$$d = \text{ArcSin} [(1/n) \times \text{Sin}(c)] - b \quad (2')$$

$$d_{max} = \text{ArcSin} [(1/n) \text{Sin}(c_{max})] - b \quad (3')$$

<Shading Correction with a Spherical Shape>

Figure 5:
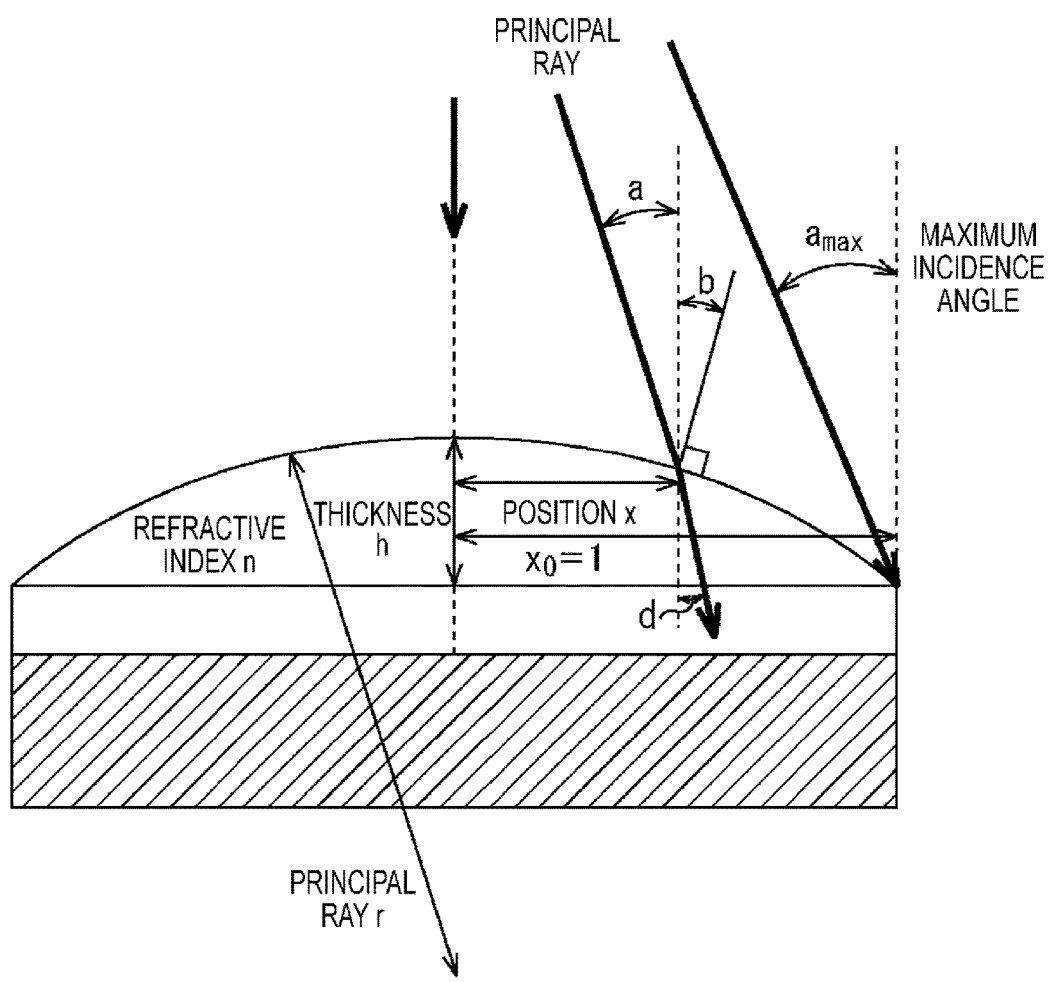
FIG. 5 is a diagram for explaining an incidence angle and a radius.

A case where the correcting lens 31 has a spherical shape is now described in detail. The portion having a curved surface in the correcting lens 31 has the spherical shape. FIG. 5 is a diagram for explaining the conditions to be satisfied so as to appropriately perform shading correcting when the curved surface of the correcting lens 31 has a spherical shape, FIG. 5 is a diagram showing the correcting lens 31, together with the sizes of the respective components and respective distances. The same components as those shown in FIG. 4 are denoted by the same reference numerals as those used in FIG. 4. As shown in FIG. 5, the distance from the center of the correcting lens 31 to the position where light enters is represented by a distance x or a position x. Particularly, the distance from the center to the edge of the correcting lens 31 is represented by a distance x0. The radius of the spherical portion of the correcting lens 31 is represented by a radius r.

As shown in FIG. 5, even when light enters from one direction, the angle "amax" of the light that enters at the position x0 is clearly larger than the angle "a" of the light that enters at the position x. The angle "a" and the angle "amax" have the relationship that satisfies the following equation.

$$a = \text{Tan} [x/(x1/\text{ArcTan} [amax])]$$

As shown in FIG. 5, at the edge of the imaging plane, the principal ray enters at the maximum incidence angle "amax". Where the position of the center of the imaging plane is 0, and the distance from the center of the imaging plane to the edge of the imaging plane is 1 (or any value), the angle "d" of the principal ray with respect to the line perpendicular to the substrate of the imaging device 10 at the position x inside the correcting lens 31 formed with a transparent material can be calculated by using the above mentioned Snell's law.

Figure 6:
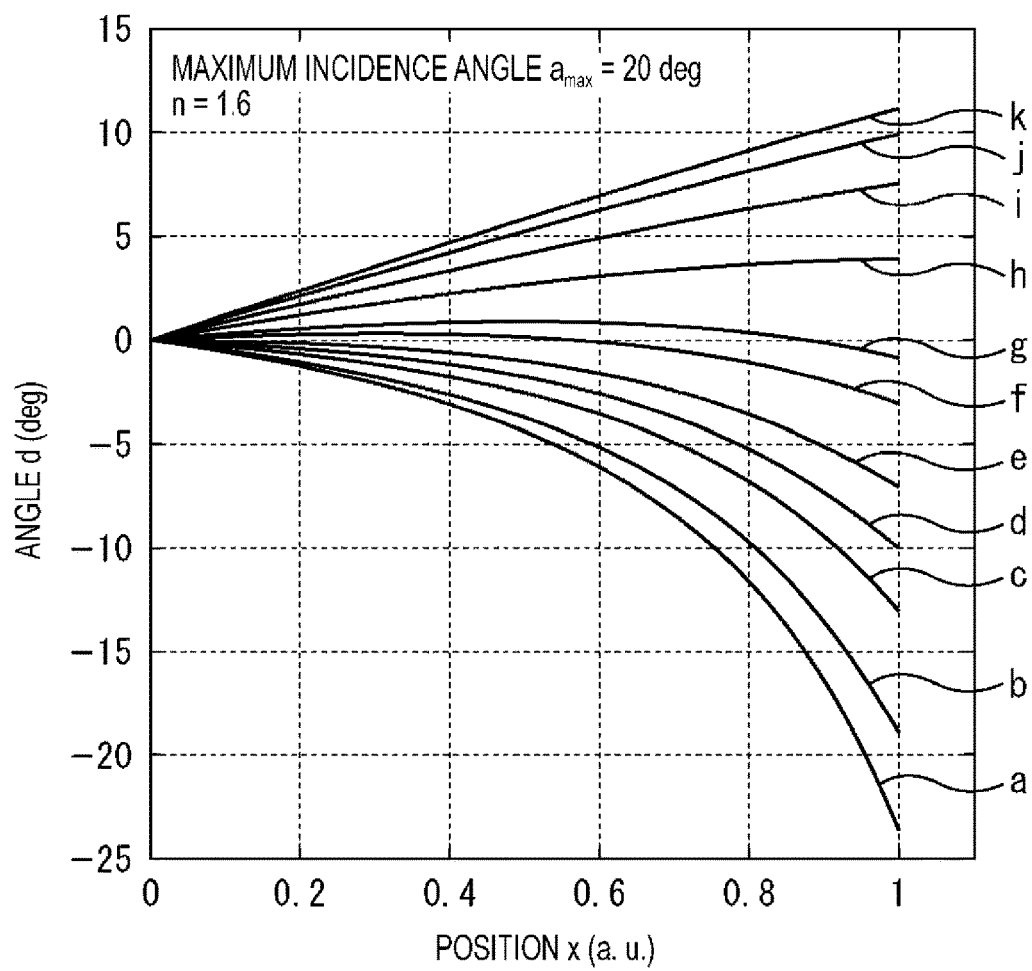
FIG. 6 is a diagram showing angles of light incident on an imaging device when the incidence angle is 20 degrees.
Figure 7:
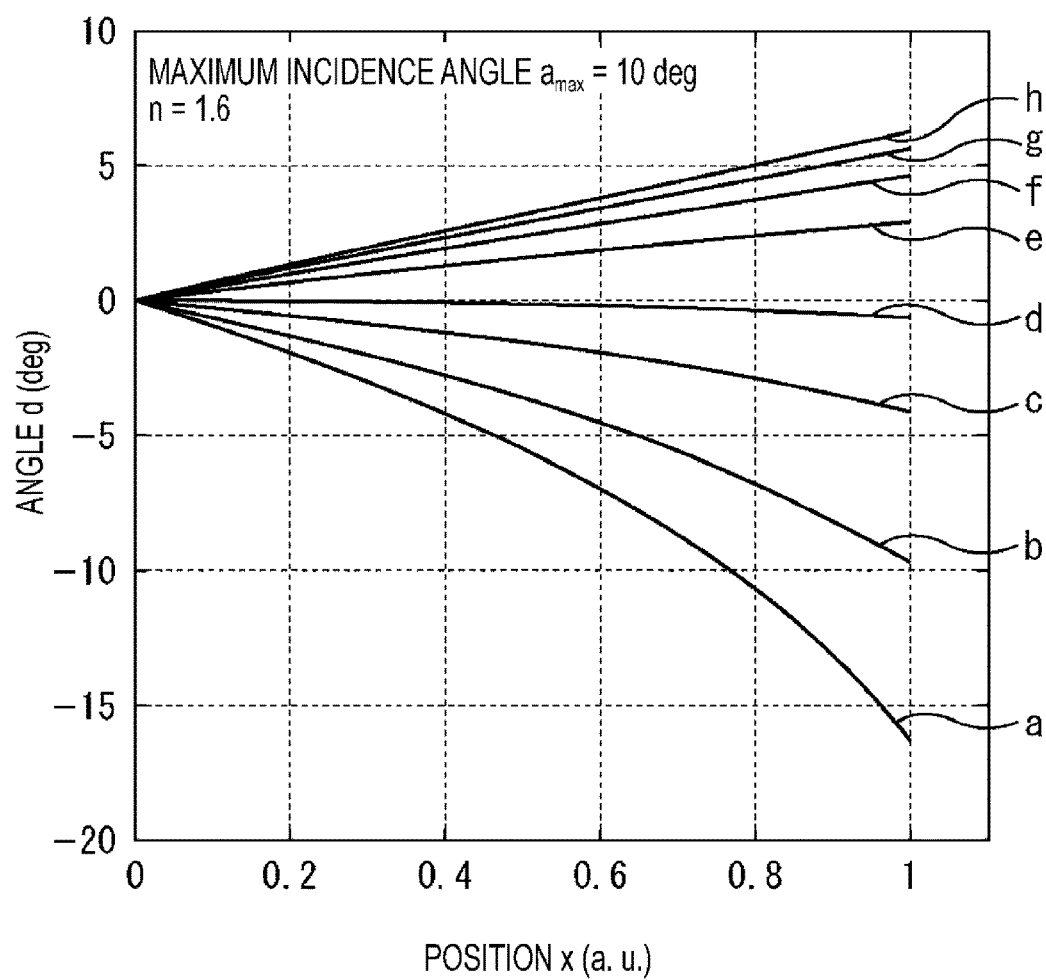
FIG. 7 is a diagram showing angles of light incident on an imaging device when the incidence angle is 10 degrees.
Figure 8:
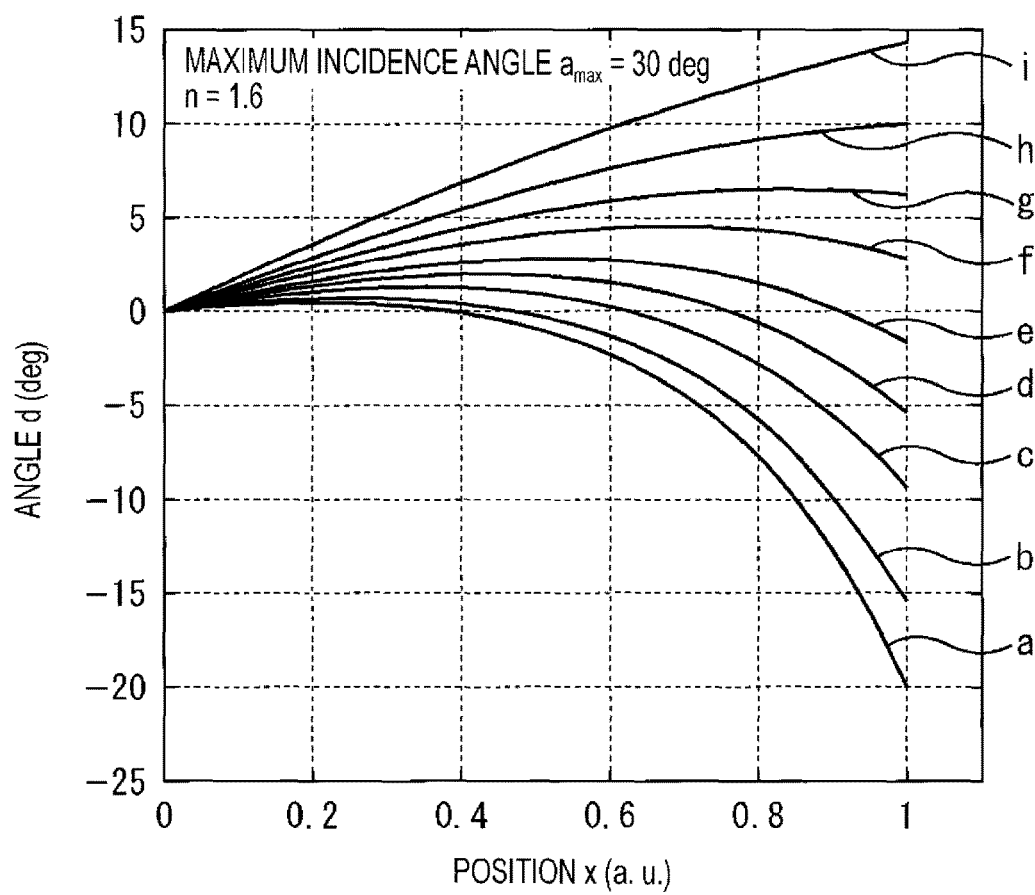
FIG. 8 is a diagram showing angles of light incident on an imaging device when the incidence angle is 30 degrees.

The results of calculations are shown in FIGS. 6 through 8. The respective graphs shown in FIGS. 6 through 8 are graphs formed by plotting the values that are calculated with respective radiuses "r" in cases where the refractive index "n" of the transparent material forming the correcting lens 31 is 1.6, and the radius "r" of the spherical surface is varied. The graphs in FIG. 6 are the graphs showing cases where the maximum incidence angle "amax" is 20 degrees, the graphs in FIG. 7 are the graphs showing cases where the maximum incidence angle "amax" is 10 degrees, and the graphs in FIG. 8 are the graph showing cases where the maximum incidence angle "amax" is 30 degrees.

The abscissa axis of each of the graphs shown in FIGS. 6 through 8 indicates the position "x" relative to the center of the correcting lens 31, and the ordinate axis indicates the angle "d" of travelling light with respect to the perpendicular direction inside the correcting lens 31.

Among the graphs in FIG. 6, graph a is the graph showing a case where the radius "r" is 3.4/3, graph b is the graph showing a case where the radius "r" is 3.6/3, and graph c is the graph showing a case where the radius "r" is 4/3. Graph d is the graph showing a case where the radius "r" is 4.3/3, graph e is the graph showing a case where the radius "r" is 4.7/3, graph f is the graph showing a case where the radius "r" is 5.5/3, graph g is the graph showing a case where the radius "r" is 6.2/3, graph h is the graph showing a case where the radius "r" is 9/3, graph i is the graph showing a case where the radius "r" is 15/3, graph j is the graph showing a case where the radius "r" is 29/3, and graph k is the graph showing a case where the radius "r" is 60/3.

Among the graphs in FIG. 7, graph a is the graph showing a case where the radius "r" is 4/3, graph b is the graph showing a case where the radius "r" is 5/3, graph c is the graph showing a case where the radius "r" is 7/3, graph d is the graph showing a case where the radius "r" is 10/3, graph e is the graph showing a case where the radius "r" is 100/3, and graph f is the graph showing a case where the radius "r" is 100000/3.

Among the graphs in FIG. 8, graph a is the graph showing a case where the radius "r" is 3.5/3, graph b is the graph showing a case where the radius "r" is 3.7/3, graph c is the graph showing a case where the radius "r" is 4.1/3, graph d is the graph showing a case where the radius "r" is 4.5/3, graph e is the graph showing a case where the radius "r" is 5/3, graph f is the graph showing a case where the radius "r" is 7/3, graph g is the graph showing a case where the radius "r" is 10/3, and graph h is the graph showing a case where the radius "r" is 20/3.

As can be seen from those graphs, the correcting lens 31 is effective when the position "x" is 1, or when the angle "d" is smaller than a predetermined angle at the edge of the correcting lens 31. Cases where the predetermined angle is 15 degrees, for example, are now described.

Referring to FIG. 6, the graphs showing angles that are outside the range of −15 to 15 degrees when the position x is 1 are graph a and graph b. In graph b, the angle "d" when the maximum incidence angle "amax" is 20 degrees is −20 degrees (20 degrees in absolute value) or smaller. Therefore, the use of the correcting lens 31 is effective, but the angle "d" is not 15 degrees or smaller. As can be seen from FIG. 2, the sensitivity becomes 0.9 or lower, and the effect of the correcting lens 31 is considered to be small.

In graph a, the angle "d" when the maximum incidence angle "amax" is 20 degrees is −20 degrees (20 degrees in absolute value) or larger. Accordingly, with the use of the correcting lens 31, the direction is converted to a more oblique direction. In other words, as can be seen from graph a, it is preferable not to use the correcting lens 31 when the radius "r" of the correcting lens 31 is 3.4/3.

In graphs c through k, the angle "d" is 15 degrees or smaller in absolute value, and therefore, the use of the correcting lens 31 is effective for increasing sensitivity. That is, in a case where the correcting lens 31 is designed so that the angle "d" will become 15 degrees or smaller in absolute value, the radius "r" of the correcting lens 31 is preferably in the range of 4/3 to 60/3 ($1.3 \leq r \leq 20$).

In a case where the correcting lens 31 is designed so that the angle "d" will become 10 degrees or smaller in absolute value, graph c and graph k are also excluded.

That is, the radius of 4/3 and the radius of 60/3 are also excluded from the radiuses "r" for the correcting lens 31. If the correcting lens 31 is designed so that the angle "d" will become 10 degrees or smaller in absolute value, the radius "r" of the correcting lens 31 is preferably in the range of 4.3/3 to 29/3 ($1.43 \leq r \leq 9.67$).

Likewise, the graphs shown in FIG. 7 are now explained. FIG. 7 shows graphs where the maximum incidence angle "amax" is 10 degrees.

Among the graphs in FIG. 7, the graph showing an angle that is outside the range of −15 to 15 degrees when the position x is 1 is graph a. In graph a, the angle "d" when the maximum incidence angle "amax" is 10 degrees is −15 degrees (15 degrees in absolute value) or smaller. Accordingly, with the use of the correcting lens 31, the direction is converted to a more oblique direction. In other words, as can be seen from graph a, it is preferable not to use the correcting lens 31 when the radius "r" of the correcting lens 31 is 4/3.

In graphs b through h, the angle "d" is 15 degrees or smaller in absolute value, and therefore, sensitivity can be restricted to 0.85 or higher as can be seen from FIG. 2. Accordingly, the use of the correcting lens 31 is effective for increasing or at least maintaining sensitivity. That is, in a case where the correcting lens 31 is designed so that the angle "d" will become 15 degrees or smaller in absolute value, the radius "r" of the correcting lens 31 is preferably in the range of 5/3 to 100000/3 ($1.7 \leq r \leq 533333$).

In a case where the correcting lens 31 is designed so that the angle "d" will become 10 degrees or smaller in absolute value, graph a is also excluded. Therefore, in a case where the correcting lens 31 is designed so that the angle "d" will become 10 degrees or smaller in absolute value, the radius "r" of the correcting lens 31 is preferably in the range of 5/3 to 100000/3 ($1.7 \leq r \leq 33333$).

Further, the graphs shown in FIG. 8 are now explained. FIG. 8 shows graphs where the maximum incidence angle "amax" is 30 degrees.

Among the graphs in FIG. 8, the graphs showing angles that are outside the range of −15 to 15 degrees when the position x is 1 are graph a and graph b. In graph a and graph b, the angle "d" when the maximum incidence angle "amax" is 30 degrees is −30 degrees (30 degrees in absolute value) or smaller, and is smaller than the incidence angle. Accordingly, a certain effect can be expected from the correcting lens 31. However, since the angle "d" is −15 degrees (15 degrees in absolute value) or smaller, radiuses "r" that can achieve desired effects are not obtained.

In graphs c through i, the angle "d" is 15 degrees or smaller in absolute value, and therefore, sensitivity can be restricted to 0.85 or higher as can be seen from FIG. 2. Accordingly, the use of the correcting lens 31 is effective for increasing sensitivity. That is, in a case where the correcting lens 31 is designed so that the angle "d" will become 15 degrees or smaller in absolute value, the radius "r" of the correcting lens 31 is preferably in the range of 4.1/3 to 20/3 ($1.37 \leq r \leq 6.67$).

In a case where the correcting lens 31 is designed so that the angle "d" will become 10 degrees or smaller in absolute value, graph i is also excluded. That is, the radius of 20/3 is also excluded from the radiuses "r" for the correcting lens 31. If the correcting lens 31 is designed so that the angle "d" will become 10 degrees or smaller in absolute value, the radius "r" of the correcting lens 31 is preferably in the range of 4.1/3 to 10/3 ($1.37 \leq r \leq 3.33$).

Figure 9:
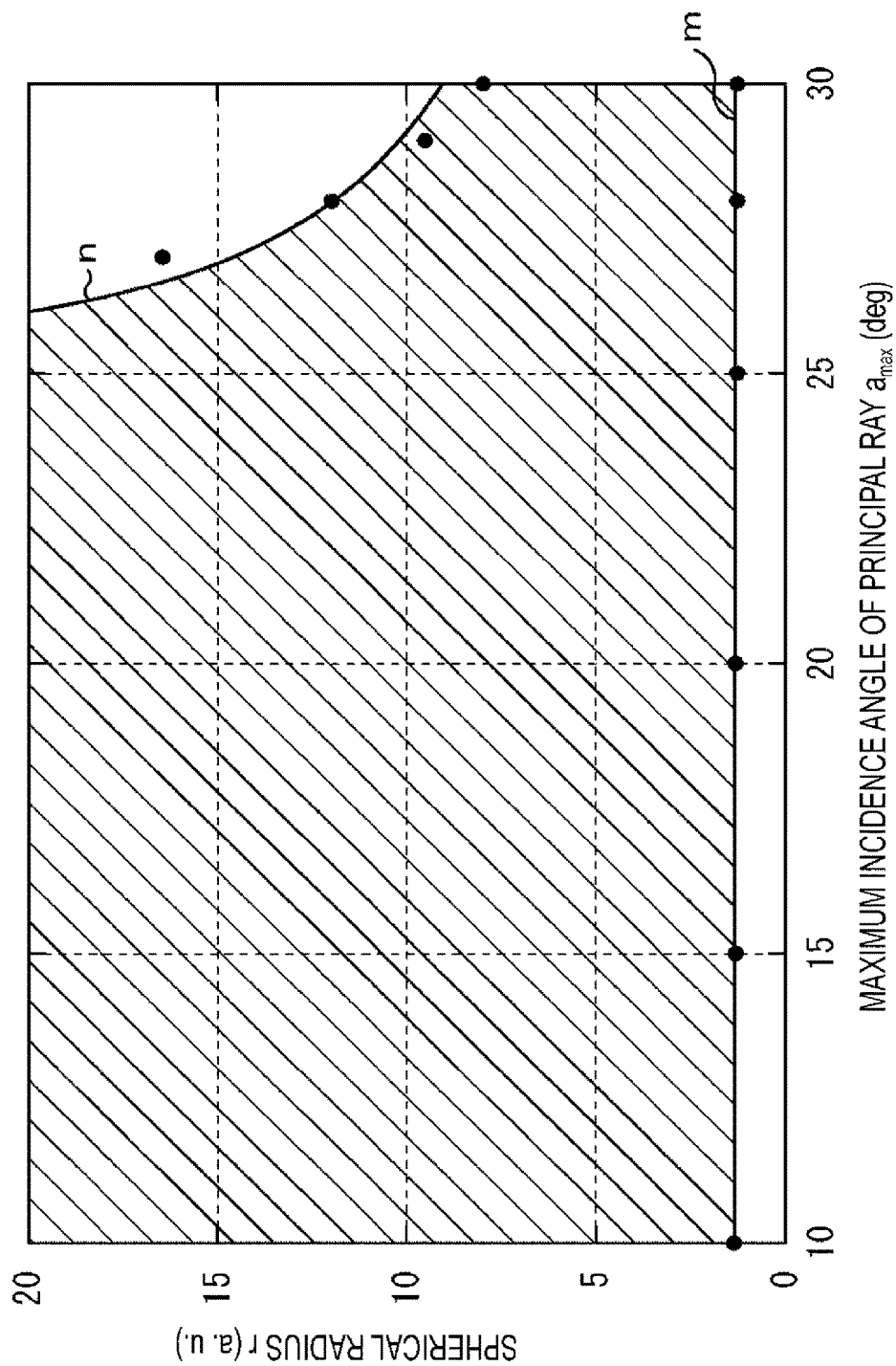
FIG. 9 is a diagram showing the conditions for the angle of light incident on an imaging device to be 15 degrees or smaller.
Figure 10:
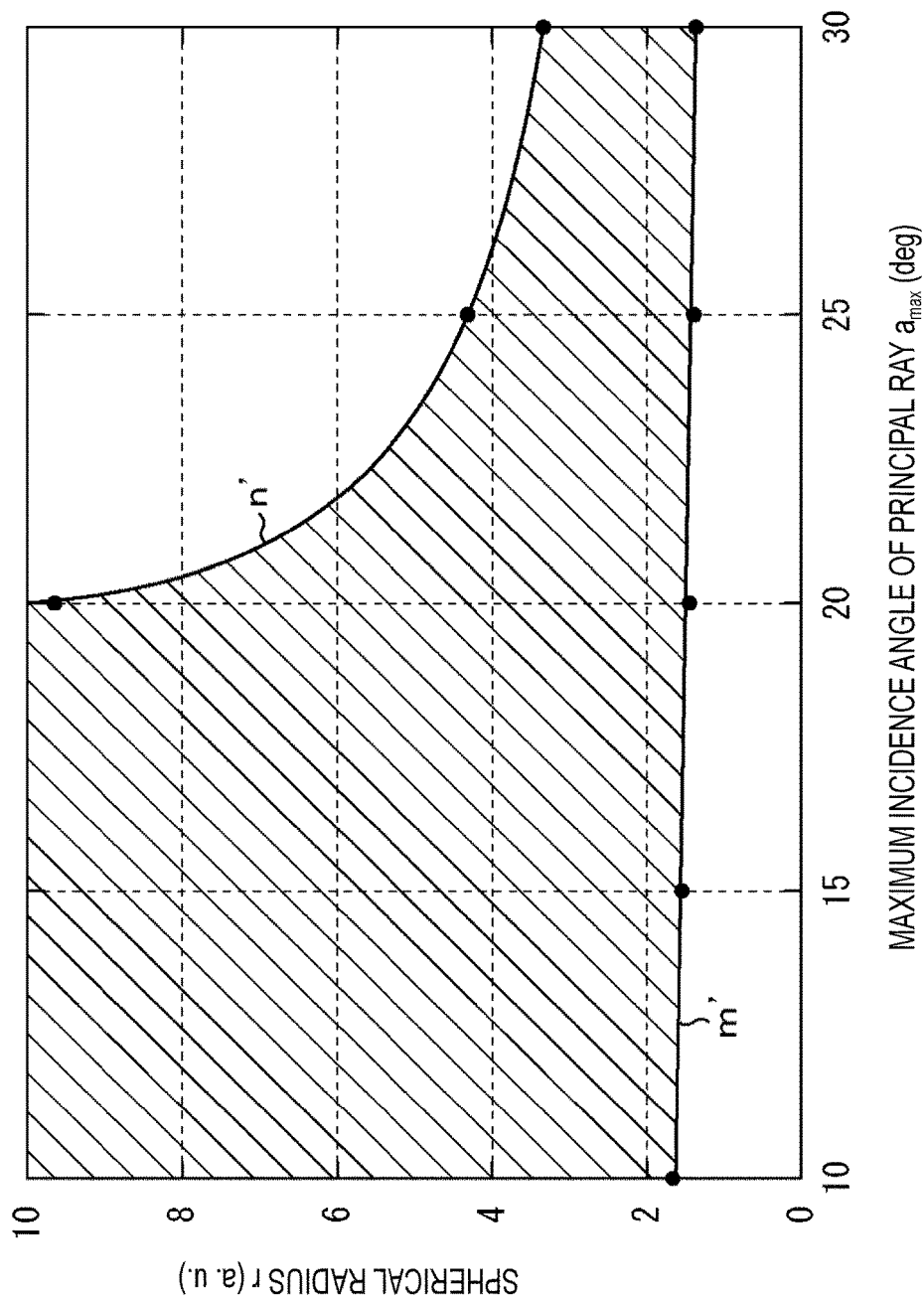
FIG. 10 is a diagram showing the conditions for the angle of light incident on an imaging device to be 10 degrees or smaller.

Although not shown in the drawings, the applicant has also conducted experiments with other maximum incidence angles "amax", and the results of the experiments are shown in FIGS. 9 and 10. FIG. 9 is a diagram showing the range of the radiuses "r" of the correcting lens 31 for restricting the angle "d" to 15 degrees or smaller in absolute value. FIG. 10 is a diagram showing the range of the radiuses "r" of the correcting lens 31 for restricting the angle "d" to 10 degrees or smaller in absolute value.

In each of FIGS. 9 and 10, the abscissa axis indicates the maximum incidence angle "amax" of the principal ray, and the ordinate axis indicates the radius "r" of the spherical surface of the correcting lens 31.

The graph in FIG. 9 shows a line m and a line n. Within the region between the line m and the line n, the radius "r" of the correcting lens 31 satisfies the condition, "$-15 \leq \text{angle } d \leq 15$".

The line m satisfies the following equation (4).

$$r = 1.15 \times n - 0.38 - 0.0067473 \times ((n-1.2)^2/0.4^2) \times a_{max} \quad (4)$$

In the equation (4), "r" represents the radius of the correcting lens 31, "amax" represents the maximum incidence angle "amax", and "n" represents the refractive index of the material forming the correcting lens 31. These symbols are also used in the other equations.

As long as the radius "r" of the correcting lens 31 is equal to or larger than the value calculated according to the equation (4), the angle "d" is almost 15 degrees or smaller in absolute value. So as to restrict the angle "d" to almost 15 degrees or smaller in absolute value, the condition, "equation(4)≤r", should be satisfied. Further, the radius "r" is preferably equal to or smaller than the value represented by the line n.

The line n satisfies the following equation (5), $$r=((n-1.35)^2/0.25^2) \times 23.157/(a_{max}-24.925)^{0.46551} + 44.5978-29 \times n \quad (5)$$

As long as the radius "r" of the correcting lens 31 is equal to or smaller than the value calculated according to the equation (5), the angle "d" is almost 15 degrees or smaller in absolute value. So as to restrict the angle "d" to almost 15 degrees or smaller in absolute value, the condition, "r≤equation(5)", should be satisfied.

As long as the radius "r" of the correcting lens 31 satisfies at least one of the conditions, "equation(4)≤r" and "r≤equation(5)", the travelling direction of light that enters from an oblique direction can be converted by the correcting lens 31, so that the angle "d" (the angle of light incident on the microlenses 11) can be restricted to 15 degrees or smaller in absolute value. Accordingly, the quantity of light that enters the imaging device 10 can be increased, and sensitivity can be made higher.

More preferably, if the correcting lens 31 has a radius "r" that satisfies the condition, "equation(4)≤r≤equation(5)", the quantity of light that enters the imaging device 10 can be increased, and sensitivity can be made higher.

The equations (4) and (5) are equations that are satisfied when the distance x0 from the center to the edge of the correcting lens 31 is "1". In a case where the distance x0 is 20 mm, for example, 20 mm is regarded as "1", and 10 mm is regarded as "0.5". In this manner, the distance from the center to the edge of the correcting lens 31 may be set as a unit distance, and the other positions may be expressed in ratio. Where the other positions are expressed in ratio, the radius "r" of the correcting lens 31 is set according to the equations (4) and (5).

In a case where the distance x0 from the center to the edge of the correcting lens 31 (from the optical-axis center to the edge of the imaging plane) may not be "1" but may be x1, and x1 is set at any value, the equations (4) and (5) are converted into the following equations (6) and (7), respectively.

$$r=(1.15 \times n-0.38-0.0067473 \times ((n-1.2)^2/0.4^2) \times a_{max}) \times x1 \quad (6)$$

$$r=(((n-1.35)^2/0.25^2) \times 23.157/(a_{max}-24.925)^{0.46551} + 44.5978-29 \times n) \times x1 \quad (7)$$

The equation (6) is formed by multiplying the right-hand side of the equation (4) by x1, and the equation (7) is formed by multiplying the right-hand side of the equation (5) by x1. Here, x1 represents the distance from the center portion of the correcting lens 31 (the distance from the optical-axis center to the edge of the imaging plane). The radius "r" of the correcting lens 31 may be calculated by using an equation multiplied by x1 in the above manner.

Referring now to FIG. 10, the range of the radiuses "r" of the correcting lens 31 for restricting the angle "d" to 10 degree or smaller in absolute value is described.

The graph in FIG. 10 shows a line m' and a line n'. To be distinguished from the line m and the line n shown in FIG. 9, those lines are denoted by alphabets with prime marks. Within the region between the line m' and the line n', the radius "r" of the correcting lens 31 satisfies the condition, "−10≤angle d≤10".

The line m' satisfies the following equation (8).

$$r=0.1733+1.7 \times n-0.02993 \times ((n-0.9)^2) \times a_{max} \quad (8)$$

As long as the radius "r" of the correcting lens 31 is equal to or larger than the value calculated according to the equation (8), the angle "d" is almost 10 degrees or smaller in absolute value. So as to restrict the angle "d" to almost 10 degrees or smaller in absolute value, the radius "r" should be equal to or larger than the value calculated according to the equation (8). Further, the radius "r" is preferably equal to or smaller than the value represented by the line n'.

The line n' satisfies the following equation (9).

$$r=((n-1.1)^2/0.5^2) \times 9.2769/(a_{max}-19.206)^{0.3767} + 9.94712-6.5 \times n \quad (9)$$

As long as the radius "r" of the correcting lens 31 is equal to or smaller than the value calculated according to the equation (9), the angle "d" is almost 15 degrees or smaller in absolute value. So as to restrict the angle "d" to almost 15 degrees or smaller in absolute value, the condition, "r≤equation(9)", should be satisfied.

As long as the radius "r" of the correcting lens 31 satisfies at least one of the conditions, "equation(8)≤r" and "r≤equation(9)", the travelling direction of light that enters from an oblique direction can be converted by the correcting lens 31, so that the angle "d" can be restricted to 10 degrees or smaller in absolute value. Accordingly, the quantity of light that enters the imaging device 10 can be increased, and sensitivity can be made higher.

More preferably, if the correcting lens 31 has a radius "r" that satisfies the condition, "equation(8)≤r≤equation(9)", the quantity of light that enters the imaging device 10 can be increased, and sensitivity can be made higher.

The equations (8) and (9) are equations that are satisfied when the distance x0 from the center to the edge of the correcting lens 31 is "1". In a case where the distance x0 from the center to the edge of the correcting lens 31 may not be "1" but may be x1, and x1 is set at any value, the equations (8) and (9) are converted into the following equations (10) and (11), respectively.

$$r=(0.1733+1.7 \times n-0.02993 \times ((n-0.9)^2) \times a_{max}) \times x1 \quad (10)$$

$$r=(((n-1.1)^2/0.5^2) \times 9.2769/(a_{max}-19.206)^{0.3767} + 9.94712-6.5 \times n) \times x1 \quad (11)$$

The equation (10) is formed by multiplying the right-hand side of the equation (8) by x1, and the equation (11) is formed by multiplying the right-hand side of the equation (9) by x1. Here, x1 represents the distance from the center portion of the correcting lens 31. The radius "r" of the correcting lens 31 may be calculated by using an equation multiplied by x1 in the above manner.

<Attachment of a Spherical Correcting Lens to an Imaging Device>

Figure 11:
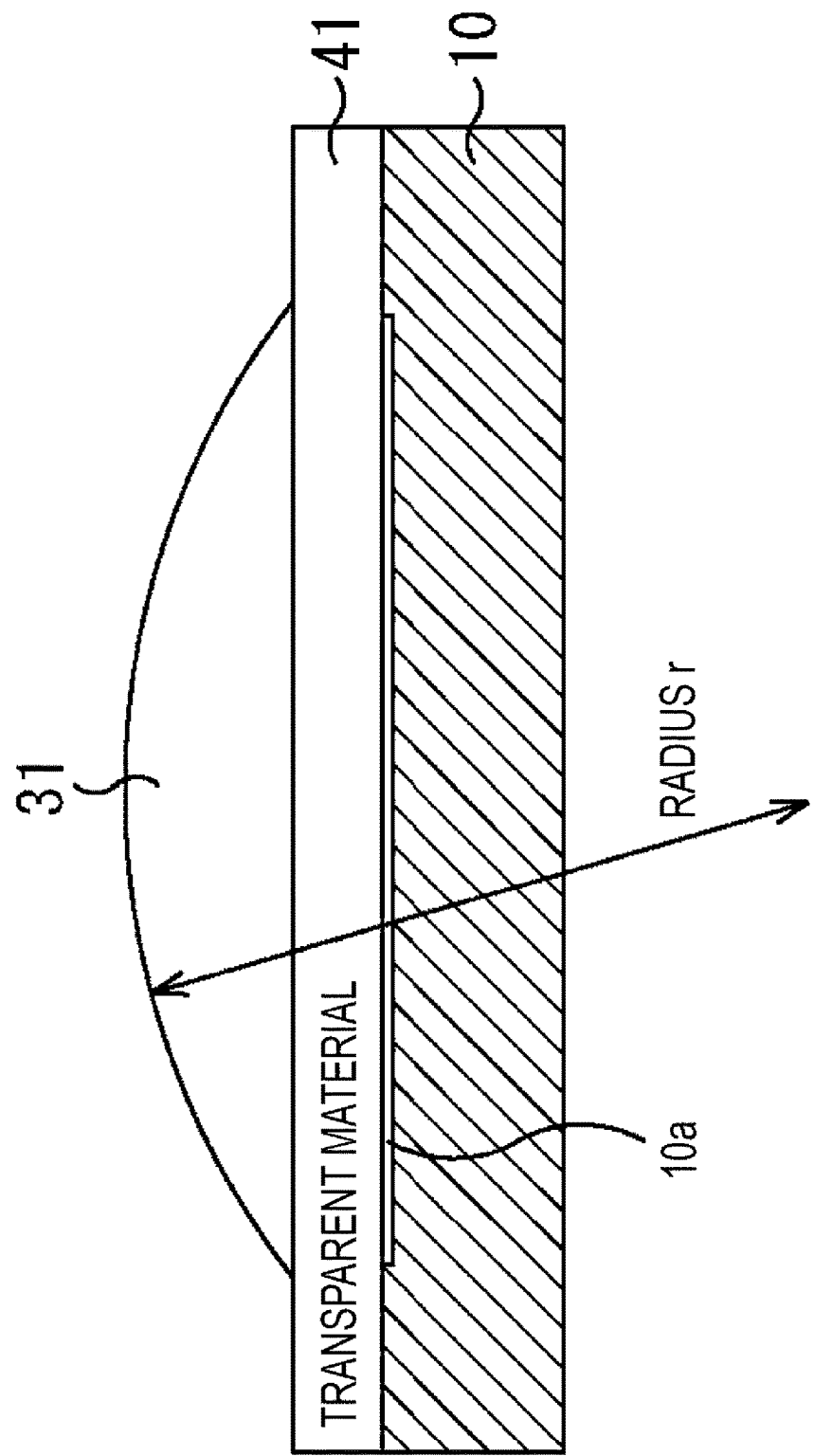
FIG. 11 is a diagram for explaining attachment of a correcting lens onto an imaging device.

FIG. 11 is a cross-sectional view of the correcting lens 31 attached onto the imaging device 10. The correcting lens 31 is placed on the imaging device 10, with a transparent material 41 being interposed in between. In the imaging device 10, the photodiodes 14 are provided, and the microlenses 11 are provided at the positions corresponding to the photodiodes 14. The photodiodes 14 are arranged in a matrix fashion, and the microlenses 11 are arranged in accordance with the photodiodes 14.

The correcting lens 31 is designed to have such a size as to cover the photodiodes 14. Where the plane that includes the upper portions of the microlenses 11 and is in contact with the transparent material 41 is the imaging plane 10a, the correcting lens 31 is designed to have such a size as to cover the imaging plane 10a, and is placed at such a position as to cover the imaging plane 10a. The radius thereof is a radius "r" within the range described above with reference to FIGS. 9 and 10.

<Manufacture of a Correcting Lens>

Figure 12:
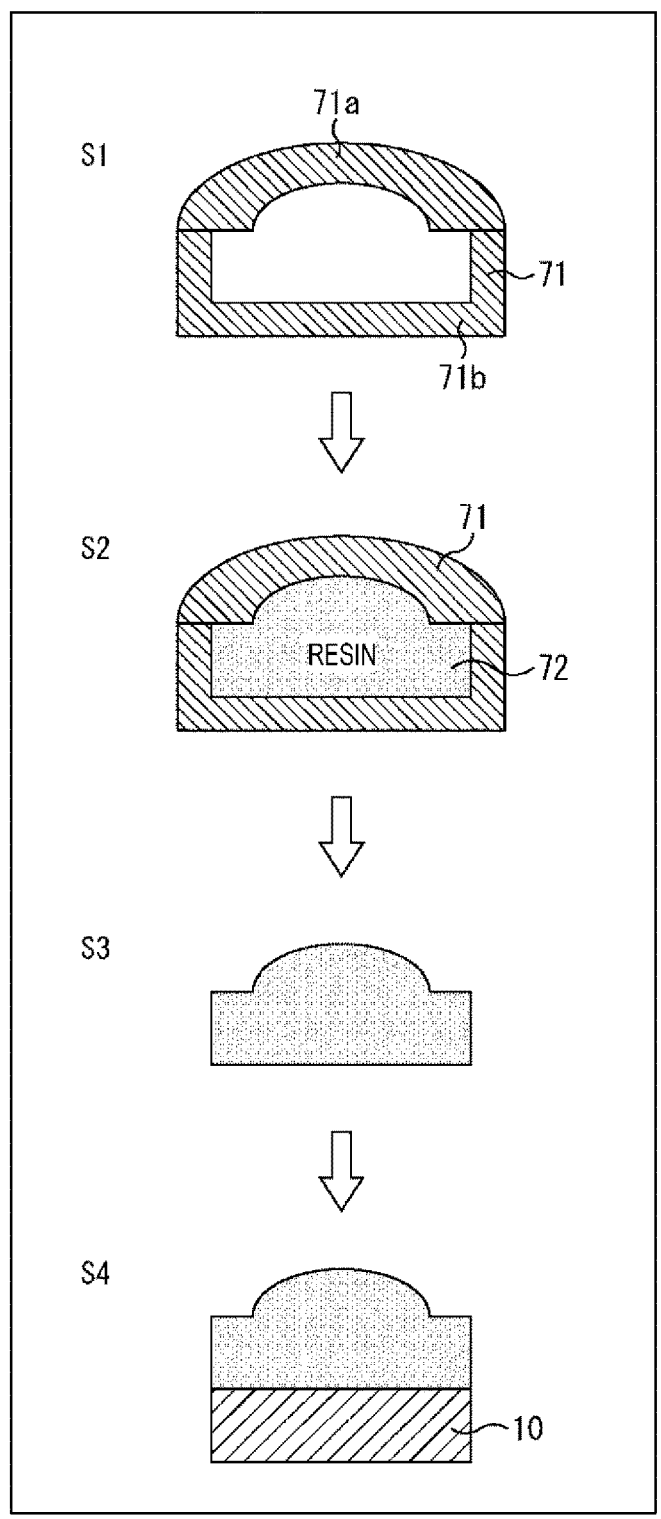
FIG. 12 is a diagram for explaining the manufacture of a correcting lens.

This correcting lens 31 can be manufactured by a manufacturing method as shown in FIG. 12, for example. In step S1, a metal mold 71 is formed. An upper portion 71a of the metal mold 71 is the portion for manufacturing the correcting lens 31, and a lower portion 71b of the metal mold 71 is the portion for manufacturing the portion of the transparent material 41 (FIG. 11).

The curved portion of the upper portion 71a (the inner side of the upper portion 71a) of the metal mold 71 is turned into a smoothly curved surface by metal processing and electrolytic polishing. The curve of the curved potion is a curved line that forms part of the circle with the radius "r" of the correcting lens 31 that satisfies the conditions shown in the above equations (4) through (11). For example, in a case where the correcting lens 31 is designed to have such a spherical shape that the angle of light incident on the imaging plane 10a is 10 degree or smaller, the inner side of the upper portion 71a is designed to have a shape that satisfies "equation(8)≤r≤equation(9)".

In step S2, a resin material 72 is inserted in the metal mold 71, and is molded by pressing with heat. In step S3, the metal mold 71 is removed. In step S4, the formed correcting lens 31 is bonded onto the imaging device 10 with an adhesive agent. The attachment may not be performed with an adhesive agent, but may be performed by heating.

As the resin material 72, optical polycarbonate having a refractive index of 1.60 can be used. Also, a resin material other than polycarbonate or a glass material can be used in place of the resin material 72. The refractive index depends on the material forming the correcting lens 31. Therefore, the radius "r" and the thickness "h" in the above equations are calculated with the refractive index of the material that is used as the correcting lens 31, and the metal mold 71 is formed in accordance with those values.

Figure 13:
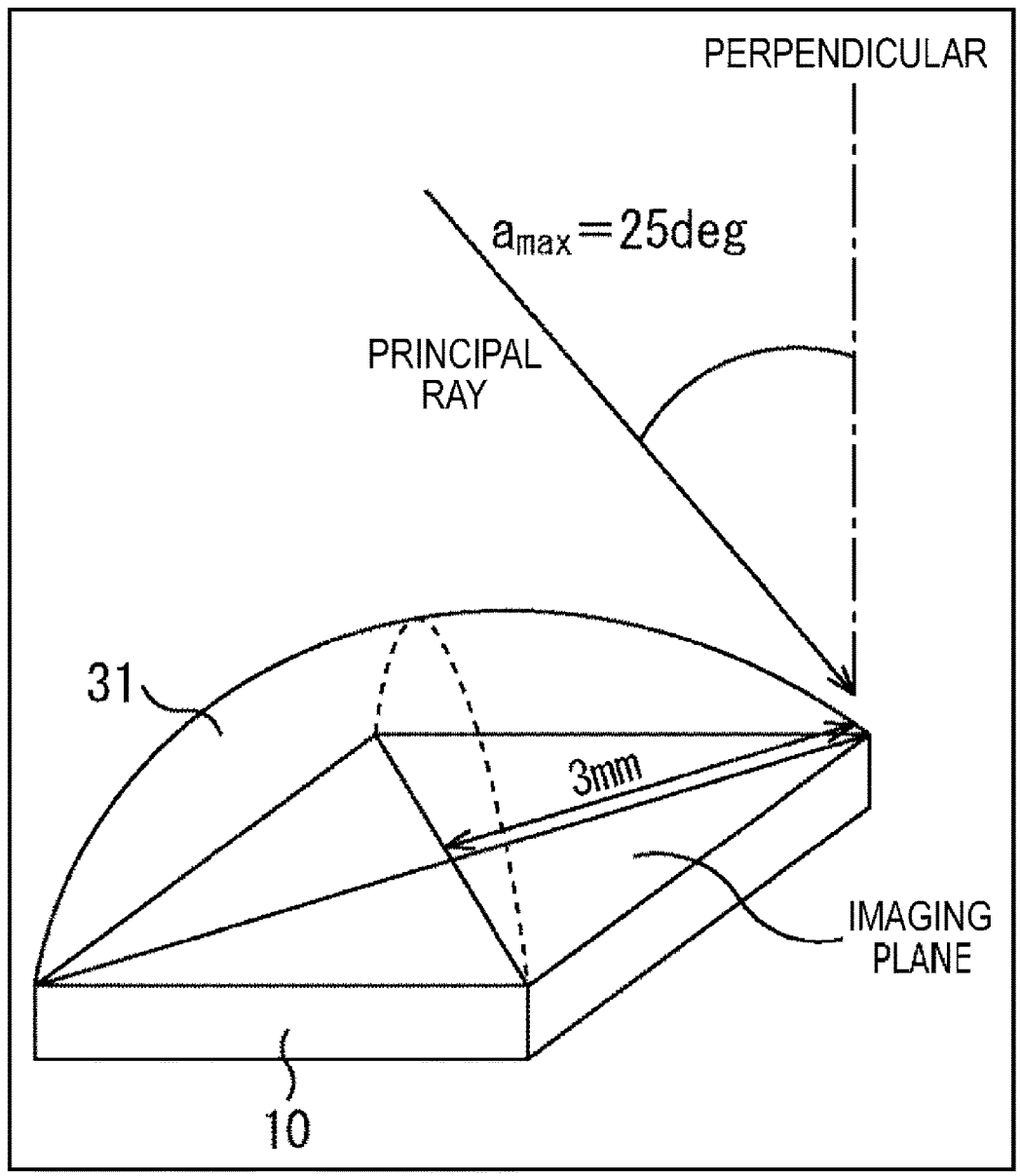
FIG. 13 is a diagram for explaining the shape of a correcting lens.

As shown in FIG. 13, the maximum incidence angle "amax" of the principal ray at the end of the imaging plane is set at 25 degrees, the incidence angle "amax" of the principal ray becomes largest at the four corners of the imaging plane, and each corner is located at 3 mm from the center of the imaging plane. The radius "r" of the spherical surface of the correcting lens 31 is set at 9 mm to satisfy the equation (5). As a result, the absolute value of the angle "d" of the principal ray incident on the imaging device 10 is 10 degrees or smaller, and shading properties are greatly corrected. In this case, the equation (4) is also satisfied.

In the above described embodiment, the distance x0 from the center to an edge of the imaging plane is 1. Therefore, a radius "r" of 9 mm is equivalent to a radius "r" of 3 (a.u.) in FIGS. 9 and 10, for example. As can be seen from FIG. 10, "−10≤angle d≤10"

is satisfied when the radius "r" is 3.

As "−10≤angle d≤10" is satisfied, sensitivity is increased from 0.6 to 0.95 as shown in FIG. 2. At the same like, color shading and color mixing are reduced, and image quality is improved.

Figure 14:
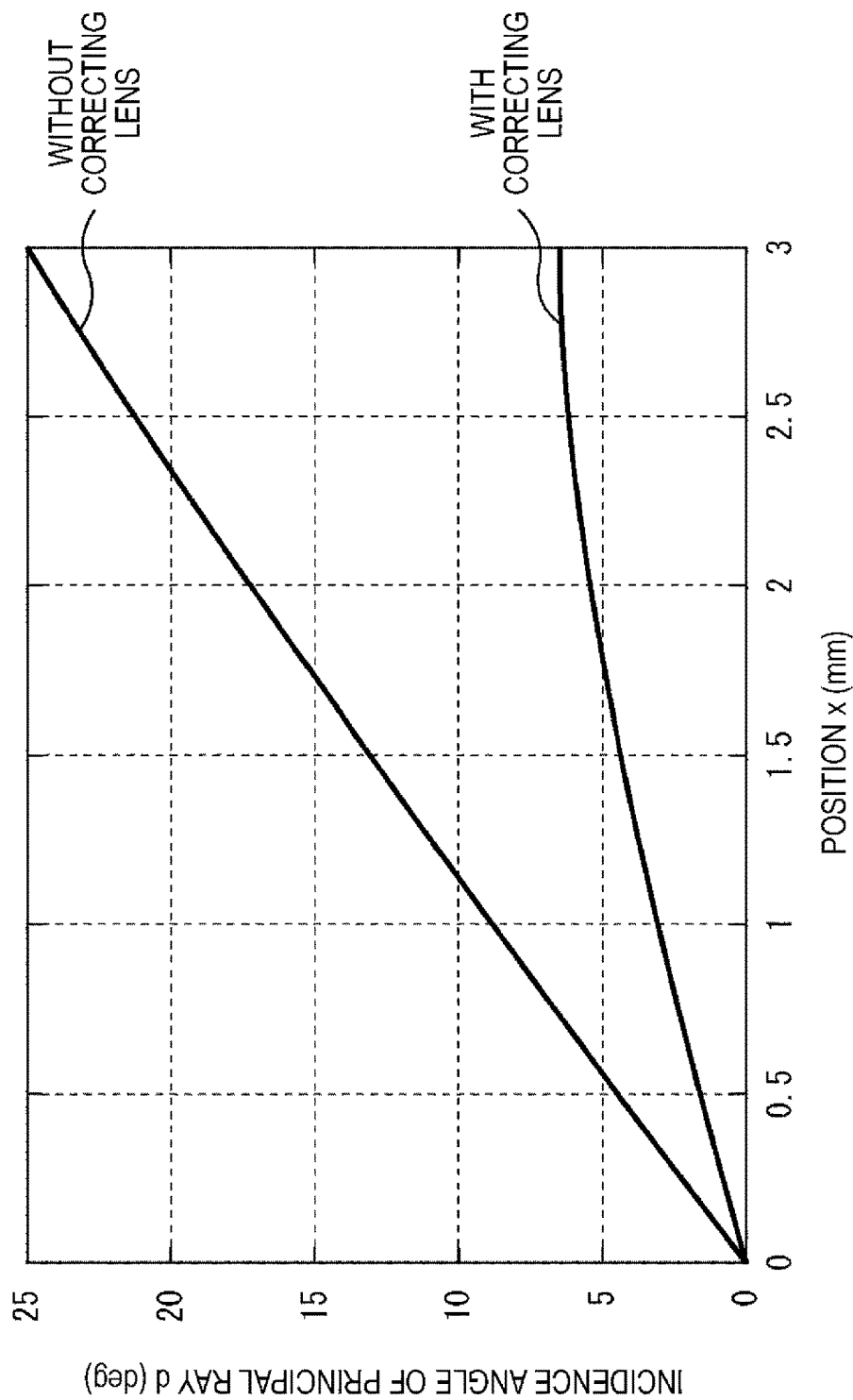
FIG. 14 is a diagram for explaining the effects of a correcting lens.

FIG. 14 shows the results of sensitivity measurement in an imaging device 10 on which the correcting lens 31 satisfying the above described conditions is attached thereon, and in an imaging device 10 not having the correcting lens 31 attached thereon. Although a shading correction effect is shown in FIG. 14, the incidence angle "d" of the principal ray is improved to 6.5 degrees in maximum incidence angle "amax" by attaching the correcting lens 31 having a spherical shape to the imaging device, and has been proved to be 10 degrees or smaller.

As described above, according to the present technique, the curved surface of the correcting lens 31 is a spherical surface, and the radius "r" of the spherical surface is made to satisfy predetermined conditions. Accordingly, light that enters from an oblique direction can be converted into light from an almost perpendicular direction, and light sensitivity can be increased.

<Shading Correction with an Aspherical Shape>

In the above described embodiment, the curved surface of the correcting lens 31 has a spherical shape, for example. The curved surface of the correcting lens 31 is not limited to a spherical shape. A case where the curved surface of the correcting lens 31 has an aspherical shape is now described in detail.

Figure 15:
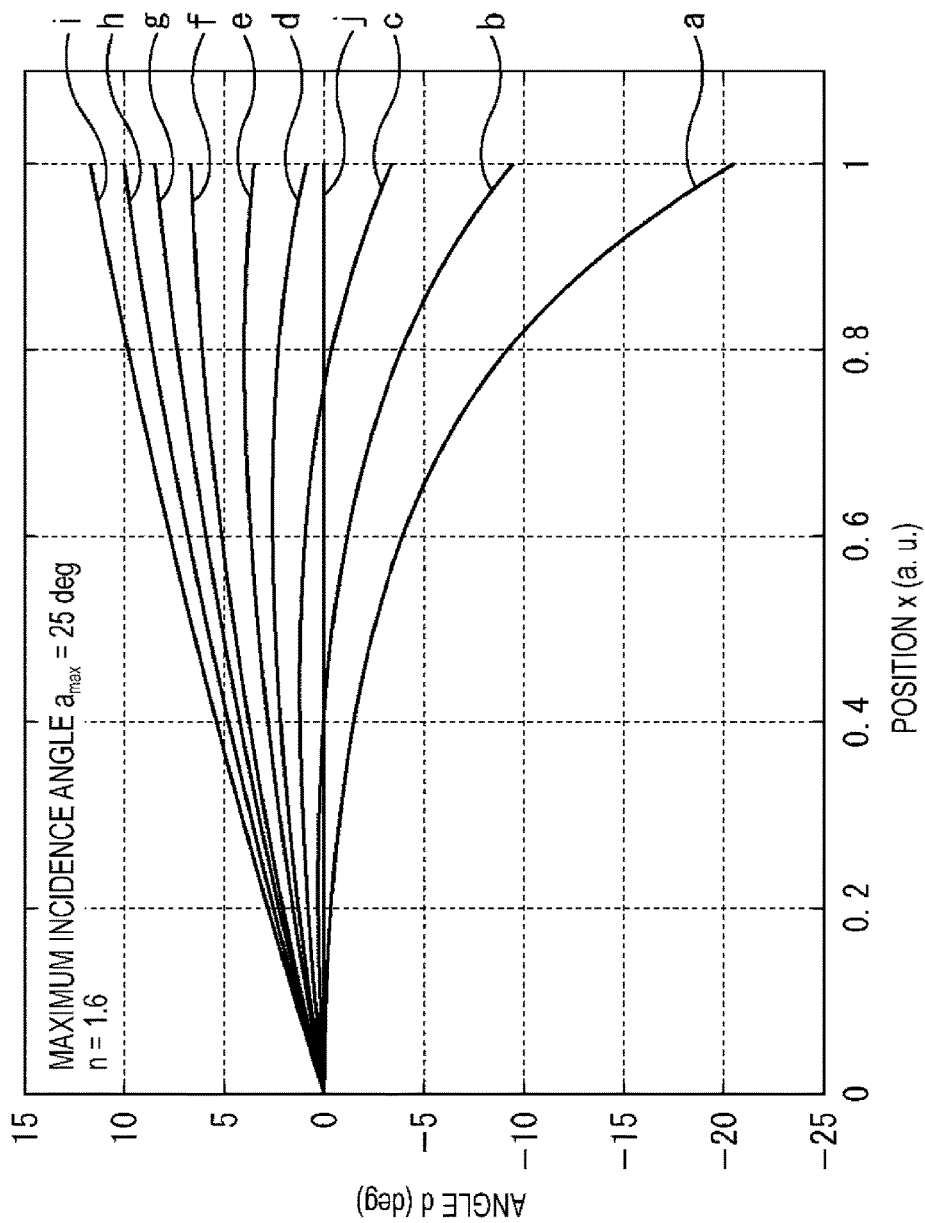
FIG. 15 is a diagram showing angles of light incident on an imaging device when the incidence angle is 25 degrees.

FIG. 15 is a diagram showing the relationship between the position of the correcting lens 31 and the angle "d" in a case where the correcting lens 31 is designed to have an aspherical shape, as well as graphs showing cases where the correcting lens 31 is designed to have a spherical shape. The abscissa axis of each of the graphs shown in FIG. 15 indicates the position "x" relative to the center of the correcting lens 31, and the ordinate axis indicates the angle "d" of travelling light with respect to the perpendicular direction inside the correcting lens 31.

The graphs in FIG. 15 are graphs showing cases where the maximum incidence angle "amax" is 25 degrees, and the refractive index "n" of the correcting lens 31 is 1.6. Among the graphs in FIG. 15, graphs a through i are graphs showing cases where the correcting lens 31 having a spherical shape is used, and graph j is a graph showing a case where the correcting lens 31 having an aspherical shape is used.

Among the graphs in FIG. 15, graph a is the graph showing a case where the radius "r" is 3.5/3, graph b is the graph showing a case where the radius "r" is 4.2/3, and graph c is the graph showing a case where the radius "r" is 5/3. Graph d is the graph showing a case where the radius "r" is 6/3, graph e is the graph showing a case where the radius "r" is 7/3, graph f is the graph showing a case where the radius "r" is 9/3, graph g is the graph showing a case where the radius "r" is 11/3, graph h is the graph showing a case where the radius "r" is 13/3, and graph i is the graph showing a case where the radius "r" is 20/3, Graph j is the graph showing a case where the correcting lens 31 having an aspherical shape is used, and is also the graph showing a case where the correcting lens 31 having a curved surface that satisfies the following equation (12) is used.

$$e = \text{Arc Cos} [\text{Sqrt}[n^2 - 2 \times n \times \text{Cos}[a] + \text{Cos}[a]^2]/\text{sqrt}[n^2 - 2 \times n \times \text{Cos}[a] + \text{Cos}[a]^2 + \text{Sin}[a]^2]] \quad (12)$$

In the equation (12), "e" represents the angle "e" shown in FIG. 4B. The angle "e" is the angle between a line perpendicular to the curved surface of the correcting lens 31 and a line perpendicular to the imaging plane. Further, in the equation (12), "a" represents the incidence angle "a", and "n" represents the refractive index of the material forming the correcting lens 31.

Figure 16:
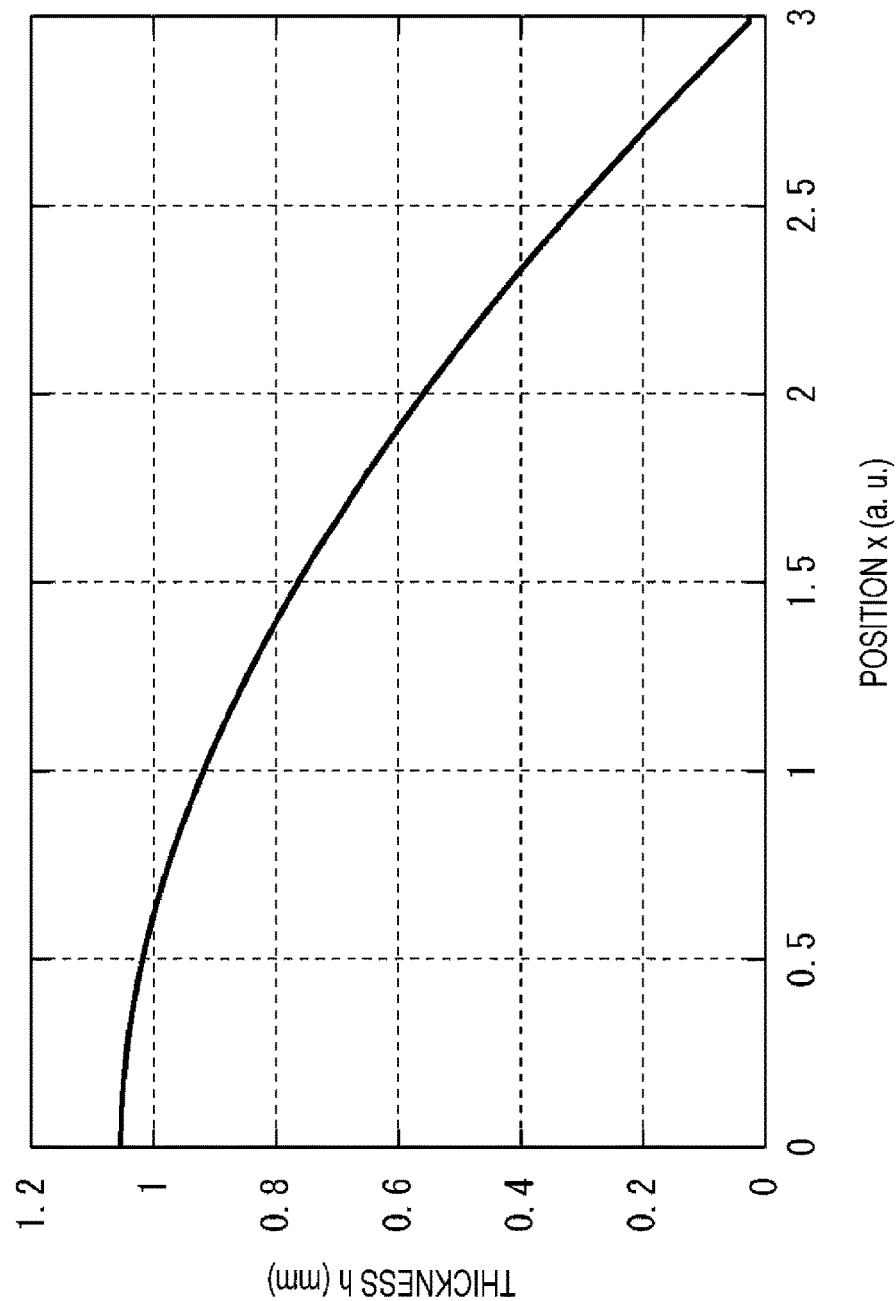
FIG. 16 is a diagram for explaining the shape of a correcting lens.

FIG. 16 is a diagram showing the relationship between the position and the thickness of the correcting lens 31 in a case where the maximum incidence angle "amax" is 25 degrees, the refractive index "n" is 16, and the angle "e" is calculated according to the equation (12) and is converted into the thickness "h" (FIG. 5) of the correcting lens 31. In FIG. 16, the abscissa axis indicates the position x of the correcting lens 31, and the ordinate axis indicates the thickness "h". The curve shown in FIG. 16 indicates the shape of a cross-section of the right half of the correcting lens 31. A solid of revolution having the curve shown in FIG. 16 as a curved surface is the correcting lens 31.

In a case where the correcting lens 31 having the curve shown in FIG. 16 as a curved surface, the graph j shown in FIG. 15 is obtained. Referring to FIG. 15, in the graphs a through i obtained by using the correcting lens 31 having a spherical shape, there are no positions "x" at which the angle "d" is 0 degrees, or there is only one position "x". Where the angle "d" is 0 degrees, the travelling direction of light that enters from an oblique direction is changed by the correcting lens 31, and light that enters the imaging plane 10a perpendicularly is obtained. Therefore, the larger the number of positions "x" at which the angle "d" is 0 degrees, the better.

The graph j obtained by using the correcting lens 31 having an aspherical shape indicates 0 degrees at almost all positions. That is, by using the correcting lens 31 having an aspherical shape, light that enters from an oblique direction is converted into light that enters the imaging plane almost perpendicularly at any position "x".

Such a correcting lens 31 having an aspherical shape can be manufactured in the same manner as in the case where the correcting lens 31 having a spherical shape is manufactured as described above with reference to FIG. 12. Therefore, detailed explanation of the manufacturing method is not repeated herein. When the metal mold 71 is formed in step S1, the inner curved surface of the upper portion 71a of the metal mold is calculated according to the equation (12), and the curve shown in FIG. 16 is rotated about the center of the optical axis of the imaging plane, to form a curved surface. In this manner, the correcting lens 31 having an aspherical shape can be manufactured.

In step S4, the manufactured correcting lens 31 is attached onto the imaging device 10. At this point, like the correcting lens 31 having a spherical shape, the correcting lens 31 having an aspherical shape is designed to have such a size as to cover the photodiodes 14, and is placed at such a position as to cover the photodiodes 14, as described above with reference to FIG. 3, As described above, by using the correcting lens 31 having an aspherical shape, light that enters from an oblique direction is converted into light that enters from an almost perpendicular direction. Accordingly, light sensitivity can be increased.

In a case where correcting lenses 31 each having an aspherical shape are mass-produced, the metal mold 71 may be formed so that the variation due to the mass production will fall within the range of ±5 degrees, or more preferably, the range of ±2 degrees, with respect to the angle "e" calculated according to the equation (12), so as to achieve a sufficient effect.

<Shading Correction by a Correcting Lens Having a Telescopic Function>

As described above, sensitivity can be increased by using the correcting lens 31 having a spherical shape or the correcting lens 31 having an aspherical shape. Particularly, such a correcting lens is effective in a camera that does not have a telescopic function. In a camera that has a telescopic function, however, oblique incidence of a principal ray at the nearest end of depth of field can be corrected, but a principal ray enters almost perpendicularly even at an edge of the imaging plane at the furthest end of depth of field. As a result, degradation in characteristics might occur.

Next, shading correction performed from the nearest end to the furthest end in a camera that has a telescopic function is described. In this case, the correcting lens 31 is a shape-variable lens or a convertible lens, and is attached onto the imaging device 10 so that shading correction can be performed.

Figure 17:
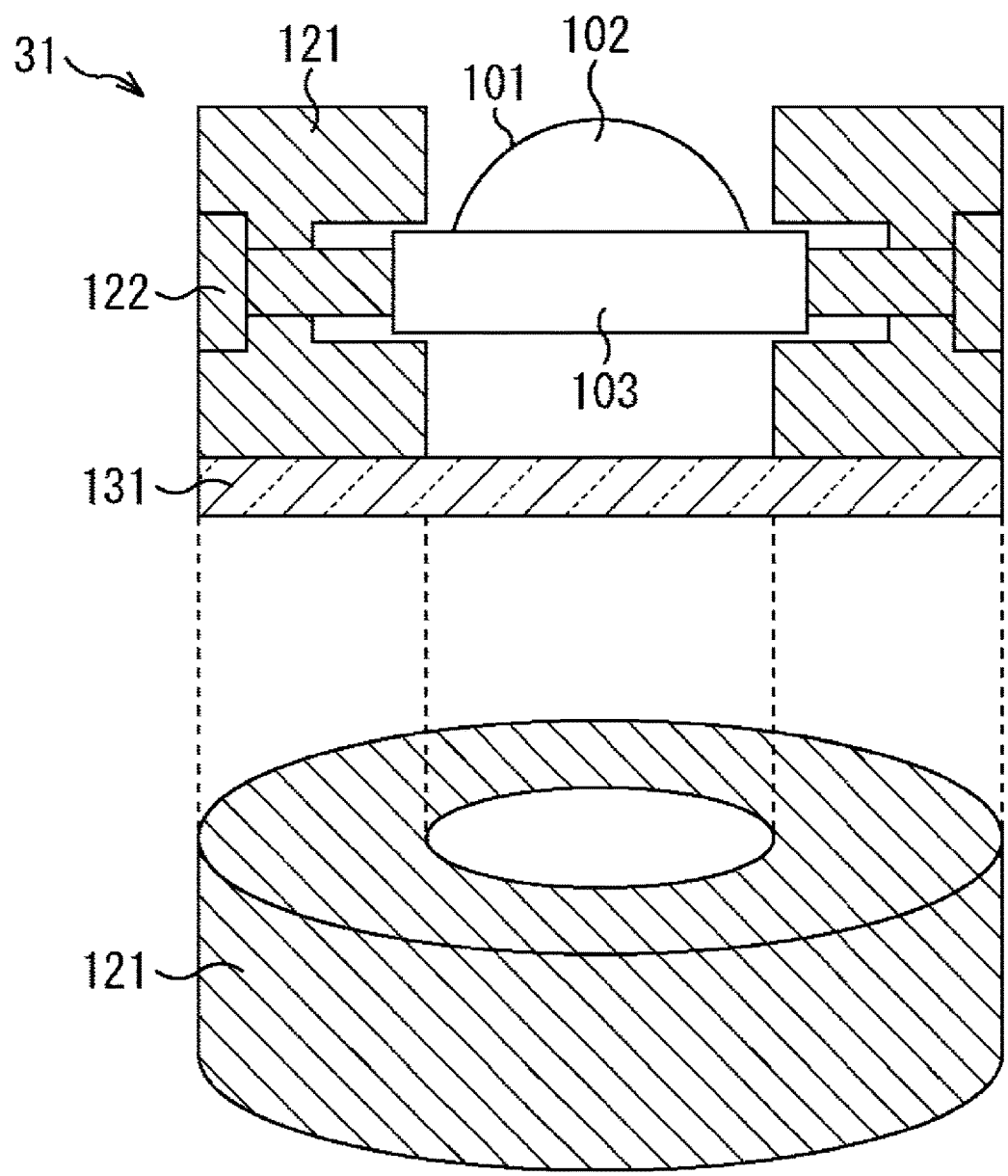
FIG. 17 is a diagram for explaining a shape-variable lens.

In a case where the correcting lens 31 is a shape-variable lens, the lens shown in FIG. 17 can be used, for example. This correcting lens 31 can be divided into a lens unit 101 and a transforming unit 121 that changes the shape of the lens. The lens unit 101 is formed with a lens 102 and a base 103, and the side surface of the base 103 is connected to a drive unit 122 for the transforming unit 121.

Figure 18:
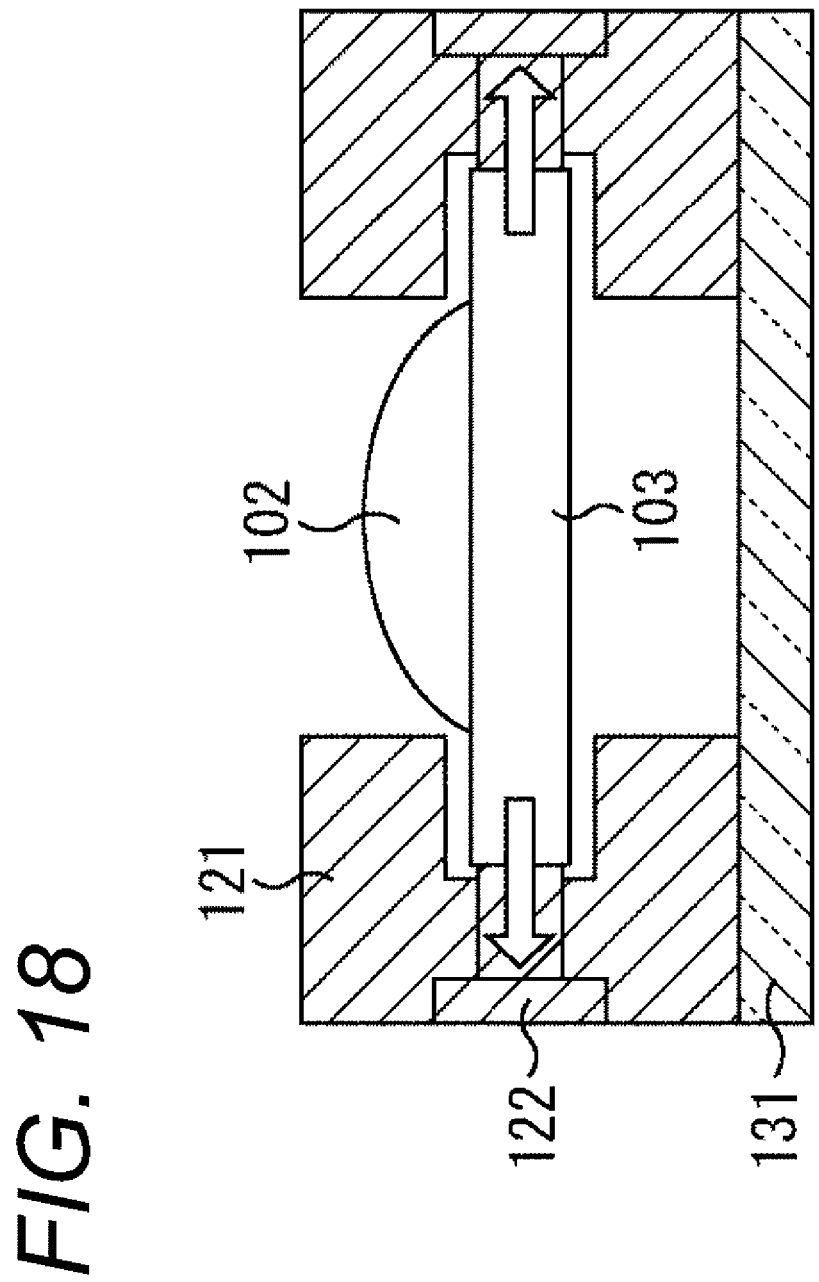
FIG. 18 is a diagram for explaining a shape-variable lens.

The lens 102 is formed integrally with the base 103. The lens 102 and the base 103 are formed with a silicone lens made of a material that is transparent and elastic, such as silicone. As shown in FIG. 18, when the drive unit 122 is operated, the portion of the base 103 of the silicone lens is pulled outward, and the shape of the lens 102 is changed. In other words, the surface shape of the lens unit 101 is controlled by tension stress.

In a case where the lens 102 is the correcting lens 31 having a spherical shape, the radius "r" is varied, as the shape of the lens 102 is varied. In a case where the lens 102 is the correcting lens 31 having an aspherical shape, the thickness "h" is varied, as the shape of the lens 102 is varied. The drive unit 122 is operated, and the shape of the lens 102 is changed so that the radius "r" or the thickness "h" has an optimum value at both the nearest end and the furthest end.

That is, the shape of the surface of the lens 102 is changed to a shape that satisfies the above described conditions and can cope with telescopic situations at the nearest end and the furthest end. As the shape of the surface of the lens 102 is changed in this manner, shading correction from the nearest end to the furthest end can also be performed in a camera that has a telescopic function.

Figure 19:
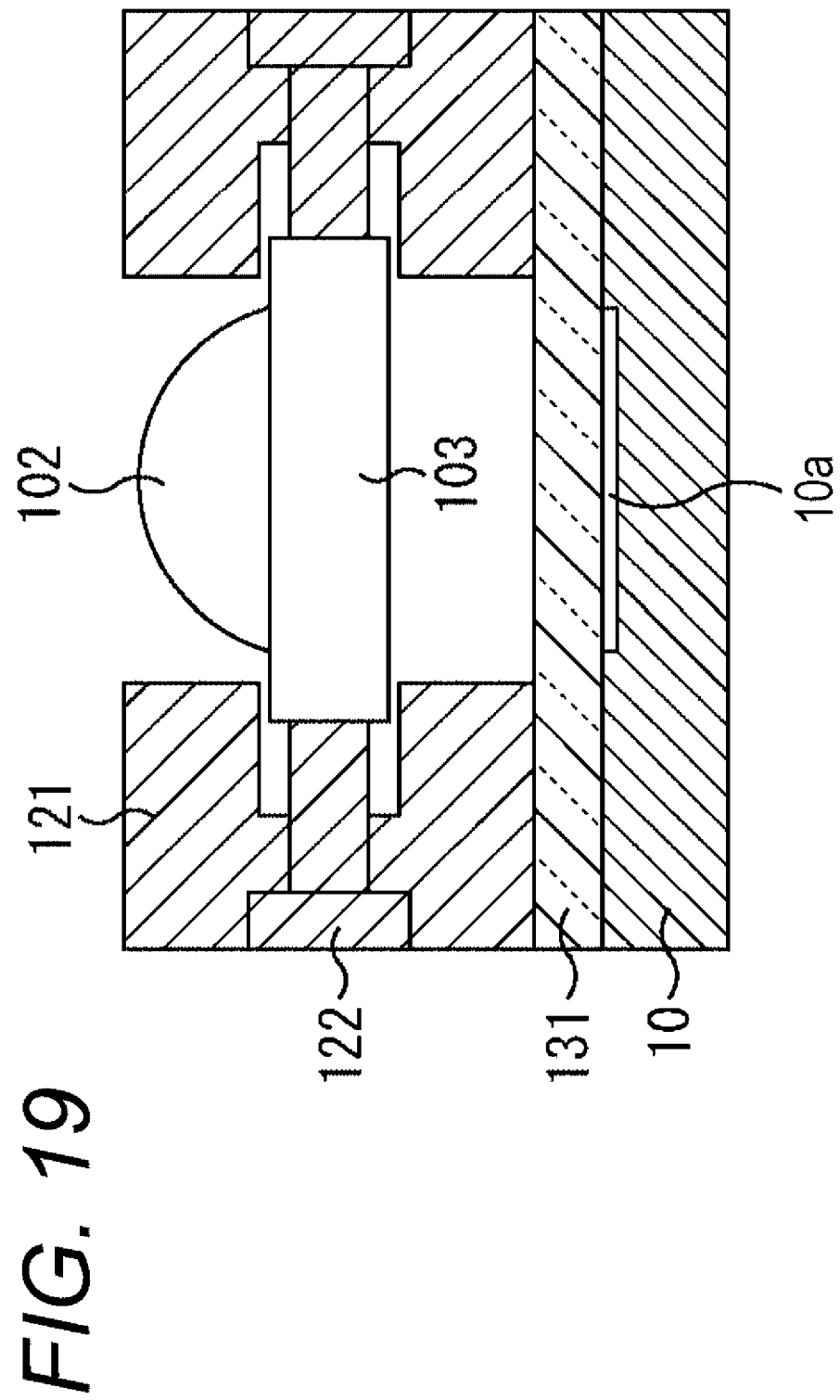
FIG. 19 is a diagram for explaining a shape-variable lens.

In a case where the correcting lens 31 is a shape-variable lens, the lens unit 101 is placed so that the lens unit 101 is located above the imaging plane 10a of the imaging device 10, as shown in FIG. 19. At the portion in contact with the imaging plane 10a, a transparent material such as glass 131 is provided, and the correcting lens 31 is placed on the imaging device 10.

The correcting lens 31 is attached onto the imaging device 10 with an adhesive agent or by heating.

Figure 20:
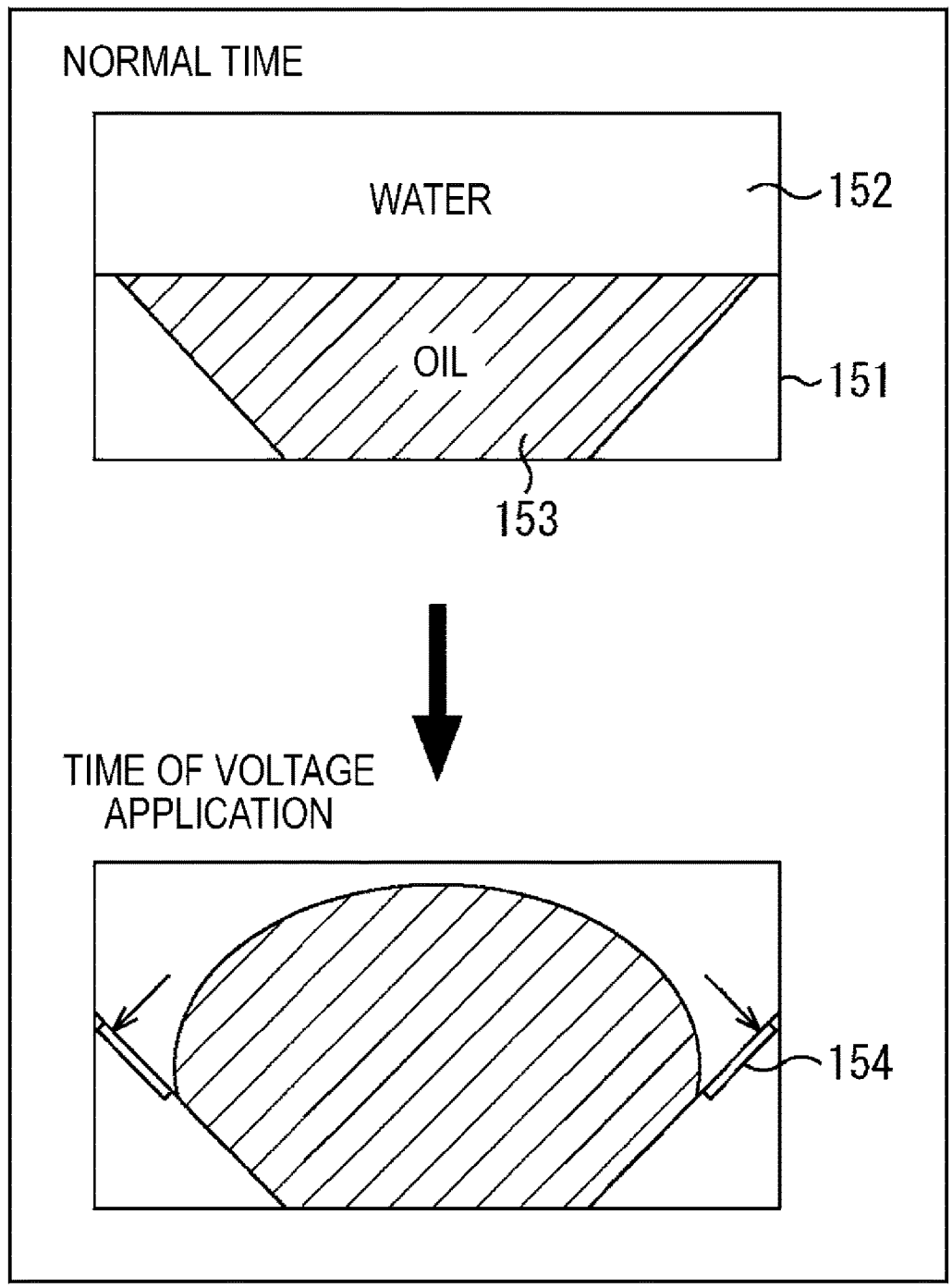
FIG. 20 is a diagram for explaining a shape-variable lens.

In a case where the correcting lens 31 is a shape-variable lens or a convertible lens, a liquid lens may be used. FIG. 20 shows the structure of a liquid lens 151 serving as the correcting lens 31. The upper half of FIG. 20 shows the shape of the liquid lens 151 at a normal time when no voltage is applied, and the lower half shows the shape of the liquid lens 151 at a voltage application time when a voltage is applied.

The liquid lens 151 is formed with an aqueous solution 152 and oil 153. As voltage control is performed, the shape of the interface between the two layers of the aqueous solution 152 and the oil 153 can be changed so as to change the shape of the lens. The two kinds of liquids, which are the aqueous solution 152 and the oil 153, and electrodes 154 are contained therein. When a voltage is applied to the electrodes 154, the aqueous solution 152 moves toward the electrodes 154, and the shape of the plane in contact with the oil 153 changes. In this manner, the interface shape can be changed freely.

In a case where the liquid lens 151 is used as the correcting lens 31, the liquid lens 151 is also provided on the imaging device 10, as shown in FIG. 21A. Of the liquid lens 151, the portion that functions as a lens is placed above the imaging plane 10a of the imaging device 10.

The intensity of the voltage to be applied to the electrodes 154 varies with telescopic situations. In a case where the liquid lens 151 is the correcting lens 31 having a spherical shape, the radius "r" is varied, as the interface shape of the liquid lens 151 is varied. In a case where the liquid lens 151 is the correcting lens 31 having an aspherical shape, the thickness "h" is varied, as the interface shape of the liquid lens 151 is varied. The voltage to be applied to the electrodes 154 is controlled so that the radius "r" or the thickness "h" has an optimum value at the nearest end and the furthest end.

That is, the interface shape of the liquid lens 151 is changed to a shape that satisfies the above described conditions and can cope with telescopic situations at the nearest end and the furthest end. As the interface shape of the liquid lens 151 is changed in this manner, shading correction from the nearest end to the furthest end can be performed in a camera that has a telescopic function.

In a case where a double-layered lens such as the liquid lens 151 is used as the correcting lens 31, the refractive indexes of the two liquids, the aqueous solution 152 and the oil 153, should be taken into consideration. Here, the refractive index of the aqueous solution 152 is a refractive index n1, and the refractive index of the oil 153 is a refractive index n2.

The relationship between angles of light that travels from the air into the aqueous solution 152 is shown in FIG. 21B. Specifically, the incidence angle of the principal ray in the air is represented by "a", and the incidence angle of the principal ray in the aqueous solution 152 is represented by a'. Here, the equation (13) shown below is satisfied according to the Snell's law. The maximum incidence angle amax' formed when the principal ray enters the aqueous solution 152 from the air is expressed by the equation (14) shown below.

$$a' = \text{Arc Sin } [\text{Sin } [a]/n1] \quad (13)$$

$$a_{max}' = \text{Arc Sin } [\text{Sin } [a_{max}]/n1] \quad (14)$$

Accordingly, where the incidence angle of the principal ray in the oil 153 is represented by d', the angle d' and the maximum incidence angle amax' are expressed by the equations (15) and (16) shown below, respectively, as is apparent from FIG. 4B.

$$d' = \text{Arc Sin } [n1 \times \text{Sin } [b'+a']/n2] - b' \quad (15)$$

$$d_{max}' = \text{Arc Sin } [n1 \times \text{Sin } [b'+a_{max}']/n2] - b' \quad (16)$$

Referring to FIG. 4B, (b'+a') in the equation (15) is (c'), and accordingly, the equation (15) can also be written like the equation (15') shown below. Likewise, the equation (16) can also be written like the equation (16') shown below.

$$d' = \text{ArcSin } [n1 \times \text{Sin } [c']/n2] - b' \quad (15')$$

$$d_{max}' = \text{ArcSin } [n1 \times \text{Sin } [c_{max}']/n2] - b' \quad (16')$$

The equations (15') and (16') can be made equivalent to the equations (2) and (3) by replacing n with n2/n1, respectively.

The incidence angle d' of the principal ray in the oil 153 is the incidence angle of the principal ray incident on the imaging plane 10a. Therefore, in a case where the correcting lens 31 having a spherical shape is used to perform shading correction, "amax" is replaced with amax', "n" is n1/n2, and the equation (16) is satisfied under the condition that "equation(4)≤r≤equation(5)"

or

"equation(8)≤r≤equation(9)".

In a case where the correcting lens 31 having an aspherical shape is used to perform shading correction, "a" is replaced with a', "n" is n1/n2, and the equation (15) is satisfied under the condition expressed by the equation (12).

In a case where a liquid lens is used as the correcting lens 31, the correcting lens 31 can be attached onto the imaging device 10 with an adhesive agent or by heating. As described above, the liquid lens has a two-layered structure formed with the aqueous solution 152 and the oil 153, and the interface shape is controlled by voltage. Under the shape control, the shape on the side of the oil 153 having the higher refractive index in the two-layered structure is controlled so as to satisfy the above described conditions. In this manner, shading correction is performed.

For example, the aqueous solution 152 is water, the refractive index of the water is n1=1.33, and the refractive index of the oil 153 is n2=1.6. As shown in FIG. 13, the maximum incidence angle is adjusted to 25 degrees at the edge of the imaging plane. With that, the maximum incidence angle "amax" of the principal ray becomes largest at the four corners of the imaging plane, and each of the four corners is at a distance of 3 mm from the center of the imaging plane. At this point, the maximum incidence angle a' of the principal ray in the water is amax'=18.5, according to the Snell's law. Also, "n" is n1/n2=0.831.

In a case where the correcting lens 31 having a spherical shape is designed to satisfy the conditions by replacing "amax" with amax' in "equation(8)≤r≤equation(9)", which is the condition for performing shading correction, the radius "r" is 3.9 rm. At this point, the absolute value of the angle "e" of light incident on the imaging plane is 10 degrees or smaller. Accordingly, sensitivity even to light that enters from an oblique direction can be increased.

As described above, the shape of the surface or the interfacial surface of the lens of the correcting lens 31 is changed, or the change is controlled to satisfy the above described conditions. In this manner, shading correction can be appropriately performed even at the furthest end or the nearest end in a camera having a telescopic function.

<Shading Correction with Vertical Spectrum>

The above described shading correction function can also be applied to an image sensor in which the RGB photodiodes 14 or photoelectric conversion layers are vertically stacked (vertical spectrum), and the effect of the correcting lens 31 is considered to be greater in such an imaging device of a vertical spectrum type.

Figure 22:
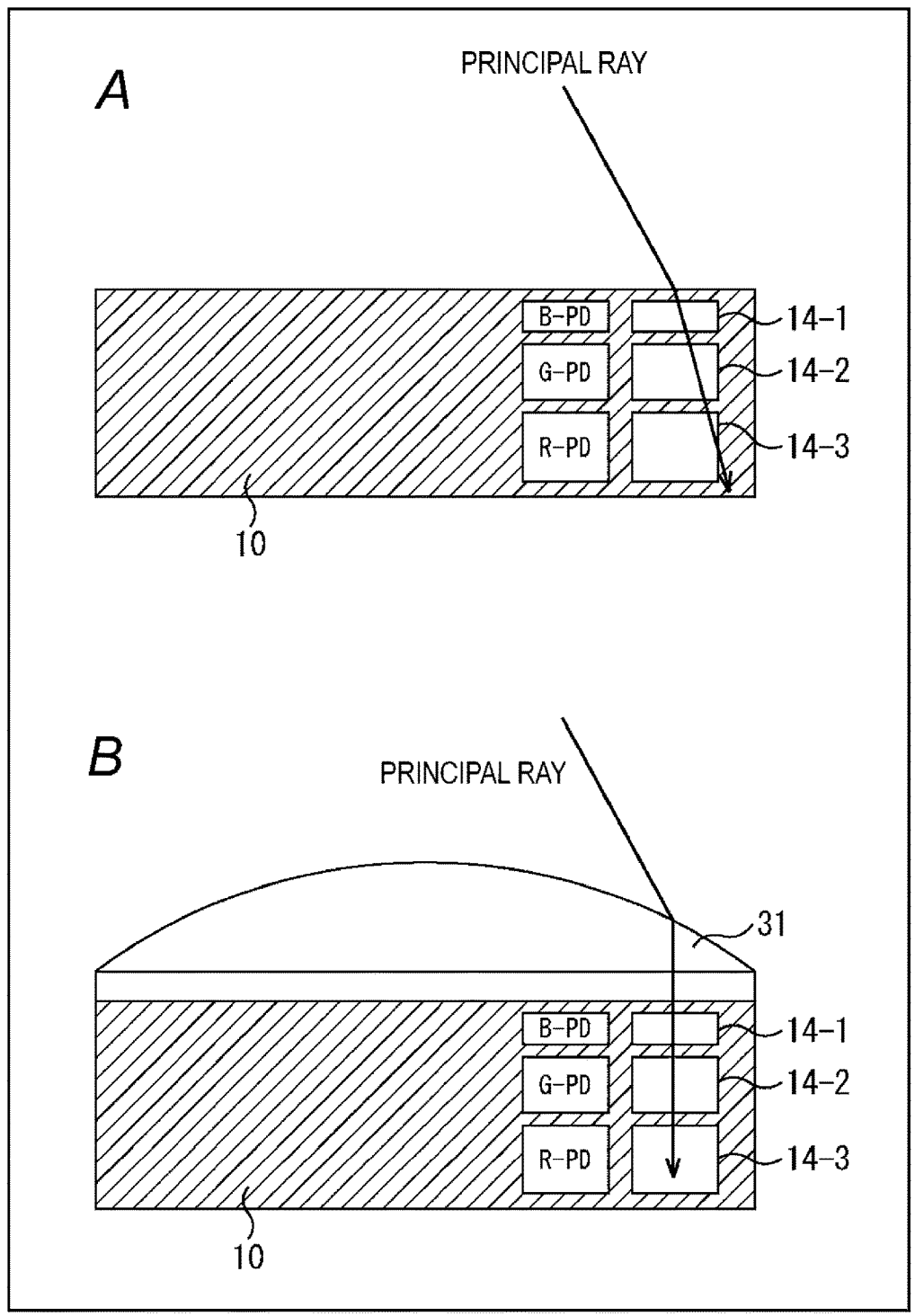
FIG. 22 is a diagram for explaining an application of a vertical spectrum to an imaging device.

FIG. 22 is a diagram for a comparison between a case where shading correction is not performed in the imaging device 10 of the vertical spectrum type, and a case where shading correction is performed in the imaging device 10 of the vertical spectrum type. As shown in FIG. 22, in the imaging device 10, a blue (B) photodiode 14-1, a green (G) photodiode 14-2, and a red (R) photodiode 14-3 are arranged in a vertical direction in this order from the top.

The imaging device 10 of the vertical spectrum type shown in FIG. 22 is manufactured by forming B-PD, G-PD, and R-PD, which are the photodiodes (PDs) 14 stacked in the vertical direction for dispersing the three primary colors in a Si bulk through ion implantation and epitaxial growth, and then forming transistors and electrodes.

Figure 23:
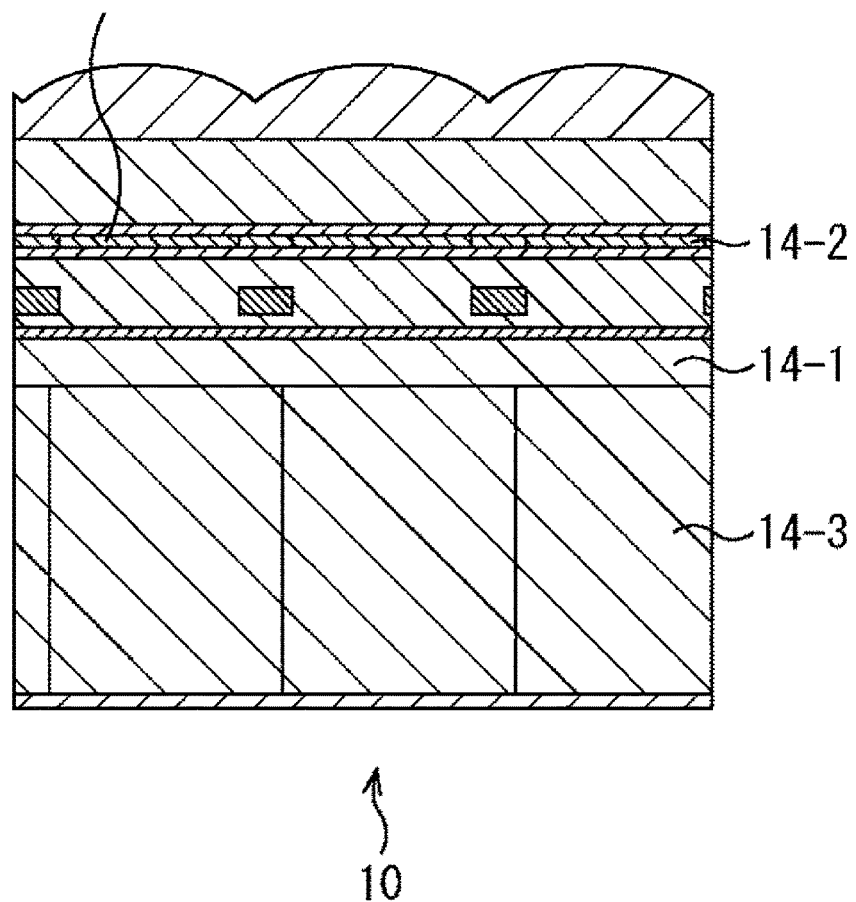
FIG. 23 is a diagram for explaining an application of a vertical spectrum to an imaging device.

FIG. 23 schematically shows the imaging device 10 of the vertical spectrum type. An organic photoelectric conversion film is provided in an upper portion of the imaging device 10, and transparent electrodes formed with ITO, for example, are formed on and under the organic photoelectric conversion film. The organic photoelectric conversion film is interposed between the transparent electrodes. A green (G) signal is extracted from the layer of the organic photoelectric conversion film.

The layer of the organic photoelectric conversion film is equivalent to the green (G) photodiode 14-2 shown in FIG. 22. While the blue photodiode 14-1 is the uppermost photodiode in the imaging device 10 shown in FIG. 22, the green photoelectric conversion region 14-2 is the uppermost photodiode in the structure shown in FIG. 23. The arrangement of the photodiodes 14 (photoelectric conversion regions) of the respective colors might vary depending on what kind of method is used as the vertical spectrum. However, the present technique can be used, regardless of the arrangement.

A Si substrate is provided below the organic photoelectric conversion film, and the photodiode 14-1 for extracting a blue (B) signal and the photodiode 14-3 for extracting a red (R) signal are stacked on the Si substrate.

In such a structure, the organic photoelectric conversion film for extracting a green signal is located at a distance from the photodiodes 14 for extracting a blue signal and a red signal, and therefore, there is particular concern about color shading. However, with the use of the correcting lens 31, color shading properties and color mixing, which are particularly problematic in the vertical spectrum, can be prevented as described below.

The structure of the imaging device 10 of the vertical spectrum type is not limited to the above described structure, and the correcting lens 31 according to the present technique can be used in other structures. Color shading properties and color mixing can be corrected by using the correcting lens 31.

Referring back to FIG. 22, in a case where the photodiodes 14 are arranged in the vertical direction, a principal ray that enters the imaging device 10 from an oblique direction might not reach the red photodiode 14-3 as shown in FIG. 22A, unless the correcting lens 31 is used and shading correction is performed.

In other words, in the situation illustrated in FIG. 22A, the photodiodes 14-1 through 14-3 differ in sensitivity from one another, and the sensitivity of the photodiode 14-3 becomes particularly lower. In such a situation, there is a possibility that conspicuous color shading will occur.

FIG. 22B shows a case where one of the above described correcting lenses 31 is used, and shading correction is performed. The travelling direction of light that enters from an oblique direction is converted to light that enters the imaging plane almost perpendicularly by the correcting lens 31. Accordingly, the sensitivity variation among the photodiodes 14-1 through 14-3 becomes smaller, and the photodiode 14-3 can be prevented from having a decrease in sensitivity and be designed to absorb sufficient light.

In other words, with the use of the correcting lens 31, oblique incidence of a principal ray can be corrected, and the principal ray passes through the pixel center even in the red (R) photodiode 14-3. Accordingly, sufficient light can be absorbed, and the correction effect becomes greater. As a result, color shading can be avoided. Furthermore, the quantity of light leaking into adjacent pixels becomes smaller, and accordingly, color mixing can also be reduced.

The correcting lens 31 having an aspherical shape or a spherical shape is used in a camera that does not have a telescopic function, and this correcting lens 31 can be manufactured by the process described above with reference to FIG. 12.

The above described correcting lens 31 according to the present technique, such as the liquid lens 151, can also be used in the imaging device 10 that is a camera having a telescopic function and is of the vertical spectrum type.

As described above, with the use of the correcting lens 31, perpendicular incidence of a principal ray is possible at any position in the imaging device 10 of the vertical spectrum type, and the problems such as shading properties, color shading, and color mixing can be solved in the imaging device 10.

As described above, according to the present technique, the correcting lens 31 that has a curved surface of a convex type and is formed with a transparent material is provided on the imaging device 10. Accordingly, shading correction can be performed. Also, according to the present technique, the shape of the curved surface of the correcting lens 31 can be optimized, and the sensitivity of the imaging device 10 can be increased.

Also, the correcting lens 31 can be optimized by a combination with a shape-variable or convertible lens. Accordingly, optimum shading correction can be continuously performed from the nearest end to the furthest end.

<Electronic Apparatus>

The present technique can be applied not only to imaging apparatuses, but also to imaging apparatuses such as digital still cameras and video cameras, portable terminal devices each having an imaging function such as portable telephone devices, and general electronic apparatuses that use imaging apparatuses as image capturing units (photoelectric conversion units) such as copying machines that use imaging apparatuses as image reading units. There are cases where the form of the above described module mounted on an electronic apparatus, or a camera module, serves as an imaging apparatus.

Figure 24:
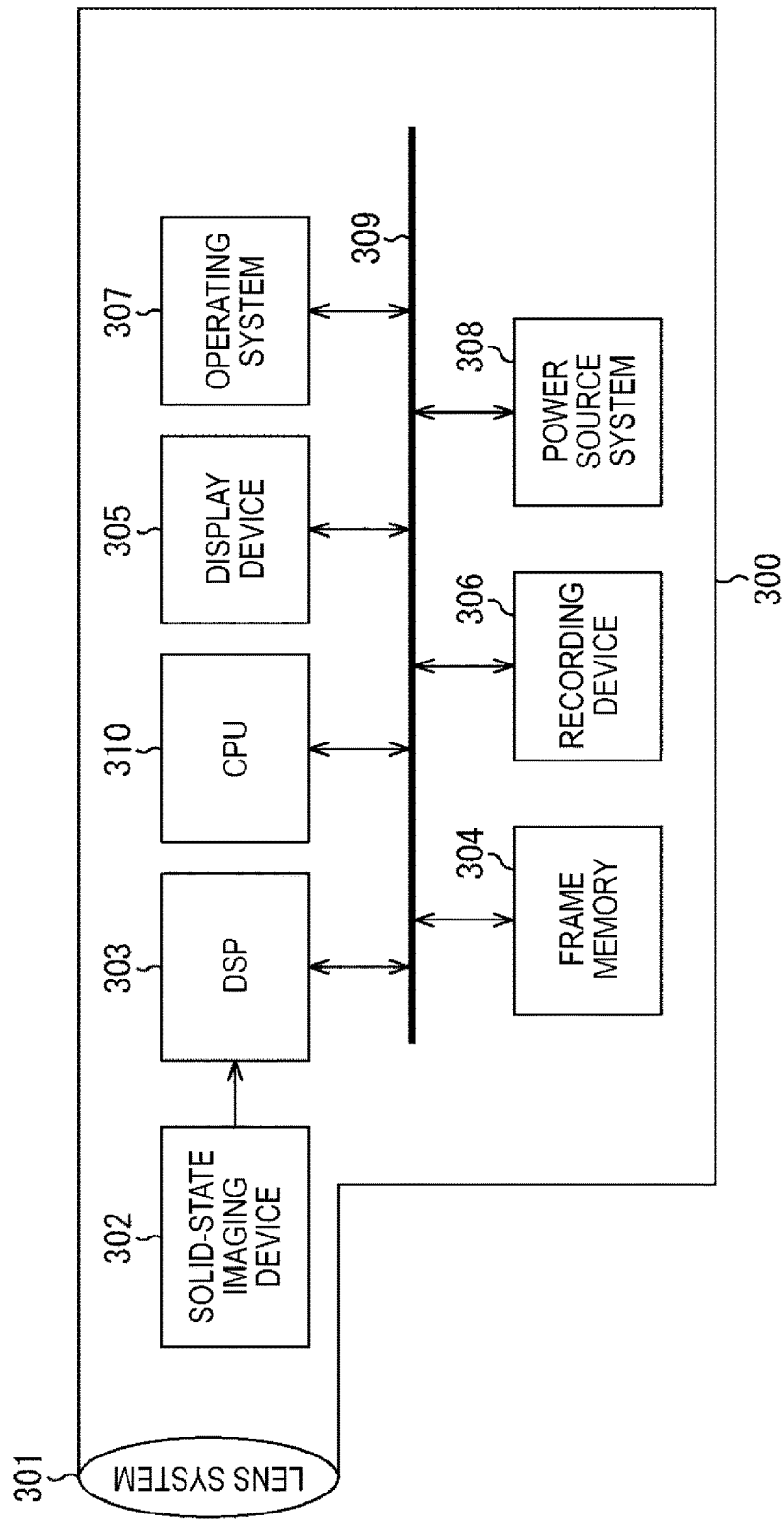
FIG. 24 is a diagram for explaining the structure of an electronic apparatus.

FIG. 24 is a block diagram showing an example structure of an imaging apparatus that is an example of an electronic apparatus of the present disclosure. As shown in FIG. 24, the imaging apparatus 300 of the present disclosure includes an optical system including a lens group 301 and the like, an imaging device 302, a DSP circuit 303 as a camera signal processing unit, a frame memory 304, a display device 305, a recording device 306, an operating system 307, a power source system 308, and the like.

The DSP circuit 303, the frame memory 304, the display device 305, the recording device 306, the operating system 307, and the power source system 308 are connected to one another via a bus line 309. A CPU 310 controls the respective components in the imaging apparatus 300.

The lens group 301 captures incident light (image light) from the object, and forms an image on the imaging plane of the imaging device 302. The imaging device 302 converts the quantity of the incident light of the image formed on the imaging plane by the lens group 301, into electric signals on a pixel-to-pixel basis, and outputs the electric signals as pixel signals. As the imaging device 302, a solid-state imaging device according to the above described embodiment can be used.

The display device 305 is a panel display device such as a liquid crystal display device or an organic EL (electroluminescence) display device, and displays a moving image or a still image captured by the imaging device 302. The recording device 306 records the moving image or the still image captured by the imaging device 302 on a recording medium such as a video tape or a DVD (Digital Versatile Disk).

Being operated by a user, the operating system 307 issues operation instructions as to various functions of this imaging apparatus. The power source system 308 supplies various kinds of power sources as the operating sources for the DSP circuit 303, the frame memory 304, the display device 305, the recording device 306, and the operating system 307, where necessary.

Such an imaging apparatus 300 is used in video cameras, digital still cameras, and camera modules for mobile devices such as portable telephone devices. In this imaging apparatus 300, an imaging device according to the above described embodiment can be used as the imaging device 302.

The effects disclosed in this specification are merely examples. Effects of the present technique are not limited to the above, and may include any other effects.

It should be noted that embodiments of the present technique are not limited to the above described embodiments, and various modifications may be made to them without departing from the scope of the present technique.

The present technique can also be in the following forms.

(1)
An imaging device including:
a photoelectric conversion unit; and
a correction unit that corrects the angle of light incident on the photoelectric conversion unit, the correction unit being located on the side of the light incident on the photoelectric conversion unit.

(2)
The imaging device of (1), wherein the correction unit has a curved surface, the surface shape of the curved surface being a spherical surface, the surface shape being a shape that satisfies the following condition:

$$(1.15 \times n - 0.38 - 0.0067473 \times ((n-1.2)^2/0.4^2) \times 30) \times x1 \leq r \leq (((n-1.35)^2/0.25^2) \times 23.157/(20-24.925)^{0.46551} + 44.5978 - 29 \times n) \times x1$$

where r represents the radius of the spherical surface, x1 represents the distance from the center of the optical axis of the imaging plane to the edge of the imaging plane, and n represents the refractive index of the material forming the correction unit.

(3)
The imaging device of (1), wherein the correction unit has a curved surface, the surface shape of the curved surface being a spherical surface, the surface shape being a shape that satisfies the following condition:

$$(1.15 \times n - 0.38 - 0.0067473 \times ((n-1.2)^2/0.4^2) \times 20) \times x1 \leq r \leq (((n-1.35)^2/0.25^2) \times 23.157/(30-24.925)^{0.46551} + 44.5978 - 29 \times n) \times x1$$

where r represents the radius of the spherical surface, x1 represents the distance from the center of the optical axis of the imaging plane to the edge of the imaging plane, and n represents the refractive index of the material forming the correction unit.

(4)
The imaging device of (1), wherein the correction unit has a curved surface, the surface shape of the curved surface being a spherical surface, the surface shape being a shape that satisfies the following condition:

$$(0.1733 + 1.7 \times n - 0.02993 \times ((n-0.9)^2) \times 30) \times x1 \leq r \leq (((n-1.1)^2/0.5^2) \times 9.2769/(20-19.206)^{0.3767} + 9.94712 - 6.5 \times n) \times x1$$

where r represents the radius of the spherical surface, x1 represents the distance from the center of the optical axis of the imaging plane to the edge of the imaging plane, and n represents the refractive index of the material forming the correction unit.

(5)
The imaging device of (1), wherein the correction unit has a curved surface, the surface shape of the curved surface being a spherical surface, the surface shape being a shape that satisfies the following condition:

$$(0.1733 + 1.7 \times n - 0.02993 \times ((n-0.9)^2) \times 20) \times x1 \leq r \leq (((n-1.1)^2/0.5^2) \times 9.2769/(30-19.206)^{0.3767} + 9.94712 - 6.5 \times n) \times x1$$

where r represents the radius of the spherical surface, x1 represents the distance from the center of the optical axis of the imaging plane to the edge of the imaging plane, and n represents the refractive index of the material forming the correction unit.

(6)
The imaging device of (1), wherein the correction unit has a curved surface, the surface shape of the curved surface being an aspherical surface, the surface shape being a shape that satisfies the following condition:

$$\text{Arc Cos }[\text{Sqrt}[n^2 - 2 \times n \times \text{Cos }[\text{Tan }[x/(x1/\text{Arc Tan }[a_{max}])]] + \text{Cos }[\text{Tan }[x/(x1/\text{Arc Tan }[a_{max}])]]^2]/\text{sqrt}[n^2 - 2 \times n \times \text{Cos }[\text{Tan }[x/(x1/\text{Arc Tan }[a_{max}])]] + \text{Cos }[\text{Tan }[x/(x1/\text{Arc Tan }[a_{max}])]]^2 + \text{Sin }[\text{Tan }[x/(x1/\text{Arc Tan }[a_{max}])]]^2]] - 5 \leq e \leq$$

$$\text{Arc Cos }[\text{Sqrt}[n^2 - 2 \times n \times \text{Cos }[\text{Tan }[x/(x1/\text{Arc Tan }[a_{max}])]] + \text{Cos }[\text{Tan }[x/(x1/\text{Arc Tan }[a_{max}])]]^2]/\text{sqrt}[n^2 - 2 \times n \times \text{Cos }[\text{Tan }[x/(x1/\text{Arc Tan }[a_{max}])]] + \text{Cos }[\text{Tan }[x/(x1/\text{Arc Tan }[a_{max}])]]^2 + \text{Sin }[\text{Tan }[x/(x1/\text{Arc Tan }[a_{max}])]]^2]] + 5$$

where e represents the angle between a line perpendicular to the surface of the correction unit and a line perpendicular to the imaging plane, n represents the refractive index of the material forming the correction unit, x represents the distance from the center of the optical axis, x1 represents the distance from the center of the optical axis to the edge, amax represents the maximum incidence angle of the light, and the amax is 20 to 30.

(7)

The imaging device of (1), wherein the correction unit has a curved surface, the surface shape of the curved surface being an aspherical surface, the surface shape being a shape that satisfies the following condition:

$$\text{Arc Cos } [\text{Sqrt}[n^2-2 \times n \times \text{Cos } [\text{Tan } [x/(x1/\text{Arc Tan } [a_{max}])]] + \text{Cos } [\text{Tan } [x/(x1/\text{Arc Tan } [a_{max}])]]^2]/ \text{sqrt}[n^2-2 \times n \times \text{Cos } [\text{Tan } [x/(x1/\text{Arc Tan } [a_{max}])]] + \text{Cos } [\text{Tan } [x/(x1/\text{Arc Tan } [a_{max}])]]^2 + \text{Sin } [\text{Tan } [x/(x1/\text{Arc Tan } [a_{max}])]]^2]] - 2 \leq e \leq$$

$$\text{Arc Cos } [\text{Sqrt}[n^2-2 \times n \times \text{Cos } [\text{Tan } [x/(x1/\text{Arc Tan } [a_{max}])]] + \text{Cos } [\text{Tan } [x/(x1/\text{Arc Tan } [a_{max}])]]^2]/ \text{sqrt}[n^2-2 \times n \times \text{Cos } [\text{Tan } [x/(x1/\text{Arc Tan } [a_{max}])]] + \text{Cos } [\text{Tan } [x/(x1/\text{Arc Tan } [a_{max}])]]^2 + \text{Sin } [\text{Tan } [x/(x1/\text{Arc Tan } [a_{max}])]]^2]] + 2$$

where e represents the angle between a line perpendicular to the surface of the correction unit and a line perpendicular to the imaging plane, n represents the refractive index of the material forming the correction unit, x represents the distance from the center of the optical axis, x1 represents the distance from the center of the optical axis to the edge, amax represents the maximum incidence angle of the light, and the amax is 20 to 30.

(8)

The imaging device of any of (1) through (7), wherein the correction unit is one of a convertible lens and a shape-variable lens, and has the surface shape controlled by tension stress.

(9)

The imaging device of any of (1) through (7), wherein the correction unit is one of a convertible lens and a shape-variable lens, and is formed with two layers of liquids, the interface shape of one of the liquids being a convex shape, the convex shape being controlled by voltage application.

(10)

The imaging device of (9), wherein the convex shape is a shape that satisfies the following condition:

$$(1.15 \times n-0.38-0.0067473 \times ((n-1.2)^2/0.4^2) \times \text{Arc Sin } [\text{Sin } 30/n1]) \times x1 \leq r \leq (((n-1.35)^2/0.25^2) \times 23.157/(\text{Arc Sin } [\text{Sin } 20/n1]-24.925)^{0.46551} + 44.5978-29 \times n) \times x1$$

where n1 represents the refractive index of a first liquid on the side of the light incidence, n2 represents the refractive index of a second liquid on the side of the photoelectric conversion unit, n is equal to n1/n2, x1 represents the distance from the center of the optical axis of the imaging plane to the edge of the imaging plane, and r represents the radius of the convex shape, the first liquid and the second liquid being the two layers of the liquids.

(11)

The imaging device of (9), wherein the convex shape is a shape that satisfies the following condition:

$$(1.15 \times n-0.38-0.0067473 \times ((n-1.2)^2/0.4^2) \times \text{Arc Sin } [\text{Sin } 20/n1]) \times x1 \leq r \leq (((n-1.35)^2/0.25^2) \times 23.157/(\text{Arc Sin } [\text{Sin } 30/n1]-24.925)^{0.46551} + 44.5978-29 \times n) \times x1$$

where n1 represents the refractive index of a first liquid on the side of the light incidence, n2 represents the refractive index of a second liquid on the side of the photoelectric conversion unit, n is equal to n1/n2, x1 represents the distance from the center of the optical axis of the imaging plane to the edge of the imaging plane, and r represents the radius of the convex shape, the first liquid and the second liquid being the two layers of the liquids.

(12)

The imaging device of (9), wherein the convex shape is a shape that satisfies the following condition:

$$(0.1733+1.7 \times n-0.02993 \times ((n-0.9)^2) \times \text{Arc Sin } [\text{Sin } 30/n1]) \times x1 \leq r \leq (((n-1.1)^2/0.5^2) \times 9.2769/(\text{Arc Sin } [\text{Sin } 20/n1]-19.206)^{0.3767}+9.94712-6.5 \times n) \times x1$$

where n1 represents the refractive index of a first liquid on the side of the light incidence, n2 represents the refractive index of a second liquid on the side of the photoelectric conversion unit, n is equal to n1/n2, x1 represents the distance from the center of the optical axis of the imaging plane to the edge of the imaging plane, and r represents the radius of the convex shape, the first liquid and the second liquid being the two layers of the liquids.

(13)

The imaging device of (9), wherein the convex shape is a shape that satisfies the following condition:

$$(0.1733+1.7 \times n-0.02993 \times ((n-0.9)^2) \times \text{Arc Sin } [\text{Sin } 20/n1]) \times x1 \leq r \leq (((n-1.1)^2/0.5^2) \times 9.2769/(\text{Arc Sin } [\text{Sin } 30/n1]-19.206)^{0.3767}+9.94712-6.5 \times n) \times x1$$

where n1 represents the refractive index of a first liquid on the side of the light incidence, n2 represents the refractive index of a second liquid on the side of the photoelectric conversion unit, n is equal to n1/n2, x1 represents the distance from the center of the optical axis of the imaging plane to the edge of the imaging plane, and r represents the radius of the convex shape, the first liquid and the second liquid being the two layers of the liquids.

(14)

The imaging device of (9), wherein the convex shape is a shape that satisfies the following condition:

$$d_{max}'=\text{Arc Sin } [n1 \times \text{Sin } [c_{max}']/n2]-b'$$

$$\text{Arc Cos } [\text{Sqrt}[n^2-2 \times n \times \text{Cos } [\text{Tan } [x/(x1/\text{Arc Tan } [d_{max}'])]] + \text{Cos } [\text{Tan } [x/(x1/\text{Arc Tan } [d_{max}'])]]^2]/ \text{sqrt}[n^2-2 \times n \times \text{Cos } [\text{Tan } [x/(x1/\text{Arc Tan } [d_{max}'])]] + \text{Cos } [\text{Tan } [x/(x1/\text{Arc Tan } [d_{max}'])]]^2 + \text{Sin } [\text{Tan } [x/(x1/\text{Arc Tan } [d_{max}'])]]^2]]-5 \leq e \leq$$

$$\text{Arc Cos } [\text{Sqrt}[n^2-2 \times n \times \text{Cos } [\text{Tan } [x/(x1/\text{Arc Tan } [d_{max}'])]] + \text{Cos } [\text{Tan } [x/(x1/\text{Arc Tan } [d_{max}'])]]^2]/ \text{sqrt}[n^2-2 \times n \times \text{Cos } [\text{Tan } [x/(x1/\text{Arc Tan } [d_{max}'])]] + \text{Cos } [\text{Tan } [x/(x1/\text{Arc Tan } [d_{max}'])]]^2 + \text{Sin } [\text{Tan } [x/(x1/\text{Arc Tan } [d_{max}'])]]^2]]+5$$

where e represents the angle between a line perpendicular to the surface of the correction unit and a line perpendicular to the imaging plane, n1 represents the refractive index of a first liquid on the side of the light incidence, n2 represents the refractive index of a second liquid on the side of the photoelectric conversion unit, n is equal to n1/n2, x represents the distance from the center of the optical axis, x1 represents the distance from the center of the optical axis to the edge, cmax' represents the maximum incidence angle of the light incident on the second liquid, and $d_{max}'$ represents the maximum incidence angle of the light in the second liquid, the first liquid and the second liquid being the two layers of the liquids.

(15)

The imaging device of (9), wherein the convex shape is a shape that satisfies the following condition:

$$d_{max}'=\text{Arc Sin } [n1 \times \text{Sin } [c_{max}']/n2]-b'$$

$$\text{Arc Cos } [\text{Sqrt}[n^2-2 \times n \times \text{Cos } [\text{Tan } [x/(x1/\text{Arc Tan } [d_{max}'])]] + \text{Cos } [\text{Tan } [x/(x1/\text{Arc Tan } [d_{max}'])]]^2]/ \text{sqrt}[n^2-2 \times n \times \text{Cos } [\text{Tan } [x/(x1/\text{Arc Tan } [d_{max}'])]] + \text{Cos } [\text{Tan } [x/(x1/\text{Arc Tan } [d_{max}'])]]^2 + \text{Sin } [\text{Tan } [x/(x1/\text{Arc Tan } [d_{max}'])]]^2]]-2 \leq e \leq$$

Arc Cos [Sqrt[$n^2-2\times n\times$Cos [Tan [$x/(x1/$Arc Tan [$d_{max}'$])]]+Cos [Tan [$x/(x1/$Arc Tan [$d_{max}'$])]]$^2$]/ sqrt[$n^2-2\times n\times$Cos [Tan [$x/(x1/$Arc Tan [$d_{max}'$])]]+ Cos [Tan [$x/(x1/$Arc Tan [$d_{max}'$])]]$^2$+Sin [Tan [$x/(x1/$Arc Tan [$d_{max}'$])]]$^2$]]+2 where e represents the angle between a line perpendicular to the surface of the correction unit and a line perpendicular to the imaging plane, n1 represents the refractive index of a first liquid on the side of the light incidence, n2 represents the refractive index of a second liquid on the side of the photoelectric conversion unit, n is equal to n1/n2, x represents the distance from the center of the optical axis, x1 represents the distance from the center of the optical axis to the edge, cmax' represents the maximum incidence angle of the light incident on the second liquid, and $d_{max}'$ represents the maximum incidence angle of the light in the second liquid, the first liquid and the second liquid being the two layers of the liquids.

(16)

An apparatus for manufacturing an imaging device including:
a photoelectric conversion unit; and
a correction unit that corrects the angle of light incident on the photoelectric conversion unit, the correction unit being located on the side of the light incident on the photoelectric conversion unit,
wherein the correction unit is designed to have a curved surface, the surface shape of the curved surface being a spherical surface, the surface shape being a shape that satisfies one of the following conditions:

$$(1.15\times n-0.38-0.0067473\times((n-1.2)^2/0.4^2)\times 30)\times x1 \leq r \leq (((n-1.35)^2/0.25^2)\times 23.157/(20-24.925)^{0.46551}+44.5978-29\times n)\times x1$$

or $$(1.15\times n-0.38-0.0067473\times((n-1.2)^2/0.4^2)\times 20)\times x1 \leq r \leq (((n-1.35)^2/0.25^2)\times 23.157/(30-24.925)^{0.46551}+44.5978-29\times n)\times x1$$

where r represents the radius of the spherical surface, x1 represents the distance from the center of the optical axis of the imaging plane to the edge of the imaging plane, and n represents the refractive index of the material forming the correction unit.

(17)

An apparatus for manufacturing an imaging device including:
a photoelectric conversion unit; and
a correction unit that corrects the angle of light incident on the photoelectric conversion unit, the correction unit being located on the side of the light incident on the photoelectric conversion unit,
wherein the correction unit is designed to have a curved surface, the surface shape of the curved surface being a spherical surface, the surface shape being a shape that satisfies one of the following conditions:

$$(0.1733+1.7\times n-0.02993\times((n-0.9)^2)\times 30)\times x1 \leq r \leq (((n-1.1)^2/0.5^2)\times 9.2769/(20-19.206)^{0.3767}+9.94712-6.5\times n)\times x1$$

or $$(0.1733+1.7\times n-0.02993\times((n-0.9)^2)\times 20)\times x1 \leq r \leq (((n-1.1)^2/0.5^2)\times 9.2769/(30-19.206)^{0.3767}+9.94712-6.5\times n)\times x1$$

where r represents the radius of the spherical surface, x1 represents the distance from the center of the optical axis of the imaging plane to the edge of the imaging plane, and n represents the refractive index of the material forming the correction unit.

(18)

An apparatus for manufacturing an imaging device including:
a photoelectric conversion unit; and
a correction unit that corrects the angle of light incident on the photoelectric conversion unit, the correction unit being located on the side of the light incident on the photoelectric conversion unit,
wherein the correction unit is designed to have a curved surface, the surface shape of the curved surface being an aspherical surface, the surface shape being a shape that satisfies one of the following conditions:

Arc Cos [Sqrt[$n^2-2\times n\times$Cos [Tan [$x/(x1/$Arc Tan [$a_{max}$])]]+Cos [Tan [$x/(x1/$Arc Tan [$a_{max}$])]]$^2$]/ sqrt[$n^2-2\times n\times$Cos [Tan [$x/(x1/$Arc Tan [$a_{max}$])]]+ Cos [Tan [$x/(x1/$Arc Tan [$a_{max}$])]]$^2$+Sin [Tan [$x/(x1/$Arc Tan [$a_{max}$])]]$^2$]]$-5 \leq e \leq$ Arc Cos [Sqrt[$n^2-2\times n\times$Cos [Tan [$x/(x1/$Arc Tan [$a_{max}$])]]+Cos [Tan [$x/(x1/$Arc Tan [$a_{max}$])]]$^2$]/ sqrt[$n^2-2\times n\times$Cos [Tan [$x/(x1/$Arc Tan [$a_{max}$])]]+ Cos [Tan [$x/(x1/$Arc Tan [$a_{max}$])]]$^2$+Sin [Tan [$x/(x1/$Arc Tan [$a_{max}$])]]$^2$]]+5 or

Arc Cos [Sqrt[$n^2-2\times n\times$Cos [Tan [$x/(x1/$Arc Tan [$a_{max}$])]]+Cos [Tan [$x/(x1/$Arc Tan [$a_{max}$])]]$^2$]/ sqrt[$n^2-2\times n\times$Cos [Tan [$x/(x1/$Arc Tan [$_{max}$])]]+ Cos [Tan [$x/(x1/$Arc Tan [$_{max}$])]]$^2$+Sin [Tan [$x/(x1/$Arc Tan [$_{max}$])]]$^2$]]$-2 \leq e \leq$ Arc Cos [Sqrt[$n-2\times n\times$Cos [Tan [$x/(x1/$Arc Tan [$a_{max}$])]]+Cos [Tan [$x/(x1/$Arc Tan [$a_{max}$])]]$^2$]/ sqrt[$n^2-2\times n\times$Cos [Tan [$x/(x1/$Arc Tan [$a_{max}$])]]+ Cos [Tan [$x/(x1/$Arc Tan [$_{max}$])]]$^2$+Sin [Tan [$x/(x1/$Arc Tan [$a_{max}$])]]$^2$]]+2 where e represents the angle between a line perpendicular to the surface of the correction unit and a line perpendicular to the imaging plane, n represents the refractive index of the material forming the correction unit, x represents the distance from the center of the optical axis, x1 represents the distance from the center of the optical axis to the edge, amax represents the maximum incidence angle of the light, and the amax is 20 to 30.

(19)

A method of manufacturing an apparatus for manufacturing an imaging device including:
a photoelectric conversion unit; and
a correction unit that corrects the angle of light incident on the photoelectric conversion unit, the correction unit being located on the side of the light incident on the photoelectric conversion unit,
the method including:
manufacturing the correction unit that is one of a correction unit having a curved surface, the surface shape of the curved surface being a spherical surface, and a correction unit having an aspherical surface, wherein the surface shape is a shape that satisfies one of the following conditions:

$$(1.15\times n-0.38-0.0067473\times((n-1.2)^2/0.4^2)\times a_{max})\times x1 \leq r \leq (((n-1.35)^2/0.25^2)\times 23.157/(a_{max}-24.925)^{0.46551}+44.5978-29\times n)\times x1$$

$$(0.1733+1.7\times n-0.02993\times((n-0.9)^2)\times a_{max})\times x1 \leq r \leq (((n-1.1)^2/0.5^2)\times 9.2769/(a_{max}-19.206)^{0.3767}+9.94712-6.5\times n)\times x1$$

$$\text{Arc Cos } [\text{Sqrt}[n^2-2\times n\times\text{Cos }[a]+\text{Cos }[a]^2]/\text{sqrt}[n^2-2\times n\times\text{Cos }[a]+\text{Cos }[a]^2+\text{Sin }[a]^2]]-5\leq e\leq \text{Arc Cos } [\text{Sqrt}[n^2-2\times n\times\text{Cos }[a]+\text{Cos }[a]^2]/\text{sqrt}[n^2-2\times n\times\text{Cos }[a]+\text{Cos }[a]^2+\text{Sin }[a]^2]]+5$$

or $$\text{Arc Cos } [\text{Sqrt}[n^2-2\times n\times\text{Cos }[a]+\text{Cos }[a]^2]/\text{sqrt}[n^2-2\times n\times\text{Cos }[a]+\text{Cos }[a]^2+\text{Sin }[a]^2]]-2\leq e\leq \text{Arc Cos } [\text{Sqrt}[n^2-2\times n\times\text{Cos }[a]+\text{Cos }[a]^2]/\text{sqrt}[n^2-2\times n\times\text{Cos }[a]+\text{Cos }[a]^2+\text{Sin }[a]^2]]+2$$

where r represents the radius of the spherical surface, x1 represents the distance from the center of the optical axis of the imaging plane to the edge of the imaging plane, n represents the refractive index of the material forming the correction unit, amax represents the maximum incidence angle of the light, a represents the incidence angle of the light, and e represents the angle between a line perpendicular to the surface of the correction unit and a line perpendicular to the imaging plane.

The present disclosure can also take the following forms:

(20)
An imaging device comprising:
a photoelectric conversion unit; and
a correction unit configured to correct an angle of light incident on the photoelectric conversion unit, wherein the correction unit is located on a light incident side of the photoelectric conversion unit.

(21)
The imaging device of (20), wherein the correction unit has a curved surface, wherein a surface shape of the curved surface is a spherical surface, and wherein the surface shape satisfies the following condition:

$$(1.15\times n-0.38-0.0067473\times((n-1.2)^2/0.4^2)\times30)\times x1\leq r\leq (((n-1.35)^2/0.25^2)\times23.157/(20-24.925)^{0.46551}+44.5978-29\times n)\times x1$$

where r represents a radius of the spherical surface, x1 represents a distance from the center of an optical axis of an imaging plane to an edge of the imaging plane, and n represents a refractive index of a material forming the correction unit.

(22)
The imaging device of (20), wherein the correction unit has a curved surface, wherein a surface shape of the curved surface is a spherical surface, and wherein the surface shape satisfies the following condition:

$$(1.15\times n-0.38-0.0067473\times((n-1.2)^2/0.4^2)\times20)\times x1\leq r\leq (((n-1.35)^2/0.25^2)\times23.157/(30-24.925)^{0.46551}+44.5978-29\times n)\times x1$$

where r represents a radius of the spherical surface, x1 represents a distance from the center of an optical axis of an imaging plane to an edge of the imaging plane, and n represents a refractive index of a material forming the correction unit.

(23)
The imaging device of (20), wherein the correction unit has a curved surface, wherein a surface shape of the curved surface is a spherical surface, and wherein the surface shape satisfies the following condition:

$$(0.1733+1.7\times n-0.02993\times((n-0.9)^2)\times30)\times x1\leq r\leq (((n-1.1)^2/0.5^2)\times9.2769/(20-19.206)^{0.3767}+9.94712-6.5\times n)\times x1$$

where r represents a radius of the spherical surface, x1 represents a distance from the center of an optical axis of an imaging plane to an edge of the imaging plane, and n represents a refractive index of a material forming the correction unit.

(24)
The imaging device of (20), wherein the correction unit has a curved surface, wherein a surface shape of the curved surface is a spherical surface, and wherein the surface shape satisfies the following condition:

$$(0.1733+1.7\times n-0.02993\times((n-0.9)^2)\times20)\times x1\leq r\leq (((n-1.1)^2/0.5^2)\times9.2769/(30-19.206)^{0.3767}+9.94712-6.5\times n)\times x1$$

where r represents a radius of the spherical surface, x1 represents a distance from the center of an optical axis of an imaging plane to an edge of the imaging plane, and n represents a refractive index of a material forming the correction unit.

(25)
The imaging device of (20), wherein the correction unit has a curved surface, wherein a surface shape of the curved surface is an aspherical surface, and wherein the surface shape satisfies the following condition:

$$\text{Arc Cos }[\text{Sqrt}[n^2-2\times n\times\text{Cos }[\text{Tan }[x/(x1/\text{Arc Tan }[a_{max}])]]+\text{Cos }[\text{Tan }[x/(x1/\text{Arc Tan }[a_{max}])]]^2]/\text{sqrt}[n^2-2\times n\times\text{Cos }[\text{Tan }[x/(x1/\text{Arc Tan }[a_{max}])]]+\text{Cos }[\text{Tan }[x/(x1/\text{Arc Tan }[a_{max}])]]^2+\text{Sin }[\text{Tan }[x/(x1/\text{Arc Tan }[a_{max}])]]^2]]-5\leq e\leq $$

$$\text{Arc Cos }[\text{Sqrt}[n^2-2n\times\text{Cos }[\text{Tan }[x/(x1/\text{Arc Tan }[a_{max}])]]+\text{Cos }[\text{Tan }[x/(x1/\text{Arc Tan }[a_{max}])]]^2]/\text{sqrt}[n^2-2\times n\times\text{Cos }[\text{Tan }[x/(x1/\text{Arc Tan }[a_{max}])]]+\text{Cos }[\text{Tan }[x/(x1/\text{Arc Tan }[a_{max}])]]^2+\text{Sin }[\text{Tan }[x/(x1/\text{Arc Tan }[a_{max}])]]^2]]+5$$

where e represents an angle between a line perpendicular to a surface of the correction unit and a line perpendicular to an imaging plane, n represents a refractive index of a material forming the correction unit, x represents a distance from the center of an optical axis, x1 represents a distance from the center of the optical axis to an edge, $a_{max}$ represents a maximum incidence angle of the light, and $a_{max}$ is from 20 to 30 degrees.

(26)
The imaging device of (20), wherein the correction unit has a curved surface, wherein a surface shape of the curved surface is an aspherical surface, and wherein the surface shape satisfies the following condition:

$$\text{Arc Cos }[\text{Sqrt}[n^2-2\times n\times\text{Cos }[\text{Tan }[x/(x1/\text{Arc Tan }[a_{max}])]]+\text{Cos }[\text{Tan }[x/(x1/\text{Arc Tan }[_{max}])]]^2]/\text{sqrt}[n^2-2\times n\times\text{Cos }[\text{Tan }[x/(x1/\text{Arc Tan }[a_{max}])]]+\text{Cos }[\text{Tan }[x/(x1/\text{Arc Tan }[a_{max}])]]^2+\text{Sin }[\text{Tan }[x/(x1/\text{Arc Tan }[a])]]^2]]-2\leq e\leq $$

$$\text{Arc Cos }[\text{Sqrt}[n^2-2\times n\times\text{Cos }[\text{Tan }[x/(x1/\text{Arc Tan }[a_{max}])]]+\text{Cos }[\text{Tan }[x/(x1/\text{Arc Tan }[a_{max}])]]^2]/\text{sqrt}[n^2-2\times n\times\text{Cos }[\text{Tan }[x/(x1/\text{Arc Tan }[a_{max}])]]+\text{Cos }[\text{Tan }[x/(x1/\text{Arc Tan }[_{max}])]]^2+\text{Sin }[\text{Tan }[x/(x1/\text{Arc Tan }[a_{max}])]]^2]]+2$$

where e represents an angle in degrees between a line perpendicular to a surface of the correction unit and a line perpendicular to an imaging plane, n represents a refractive index of a material forming the correction unit, x represents a distance from the center of an optical axis, x1 represents a distance from the center of the optical axis to an edge, $a_{max}$ represents a maximum incidence angle of the light, and $a_{max}$ is from 20 to 30 degrees.

(27)
The imaging device of (20), wherein the correction unit is one of a convertible lens and a shape-variable lens, and wherein the surface shape of the correction unit is controlled by a tension stress.

(28)

The imaging device of (20), wherein the correction unit is one of a convertible lens and a shape-variable lens, wherein the correction unit is formed with two layers of liquids, wherein one of the liquids has a convex interference shape, and wherein the convex interference shape of the one of the liquids is controlled by a voltage application.

(29)

The imaging device of (28), wherein the convex interference shape is a shape satisfying the following condition:

$$(1.15 \times n - 0.38 - 0.0067473 \times ((n-1.2)^2/0.4^2) \times \text{Arc Sin}$$
$$[\text{Sin } 30/n1]) \times x1 \leq r \leq (((n-1.35)^2/0.25^2) \times 23.157/$$
$$(\text{Arc Sin } [\text{Sin } 20/n1] - 24.925)^{0.46551} + 44.5978 -$$
$$29 \times n) \times x1$$

where n is equal to n1/n2, n1 represents a refractive index of a first liquid on a side of the light incidence, n2 represents a refractive index of a second liquid on a side of the photoelectric conversion unit, x1 represents a distance from the center of an optical axis of an imaging plane to an edge of the imaging plane, and r represents a radius of the convex shape, the first liquid and the second liquid being the two layers of liquids.

(30)

The imaging device according of (28), wherein the convex interference shape is a shape satisfying the following condition:

$$(1.15 \times n - 0.38 - 0.0067473 \times ((n-1.2)^2/0.4^2) \times \text{Arc Sin}$$
$$[\text{Sin } 20/n1]) \times x1 \leq r \leq (((n-1.35)^2/0.25^2) \times 23.157/$$
$$(\text{Arc Sin } [\text{Sin } 30/n1] - 24.925)^{0.46551} + 44.5978 -$$
$$29 \times n) \times x1$$

where n is equal to n1/n2, n1 represents a refractive index of a first liquid on a side of the light incidence, n2 represents a refractive index of a second liquid on a side of the photoelectric conversion unit, x1 represents a distance from the center of an optical axis of an imaging plane to an edge of the imaging plane, and r represents a radius of the convex shape, the first liquid and the second liquid being the two layers of liquids.

(31)

The imaging device of (28), wherein the convex interference shape is a shape satisfying the following condition:

$$(0.1733 + 1.7 \times n - 0.02993 \times ((n-0.9)^2) \times \text{Arc Sin } [\text{Sin }$$
$$30/n1]) \times x1 \leq r \leq (((n-1.1)^2/0.5^2) \times 9.2769/(\text{Arc Sin }$$
$$[\text{Sin } 20/n1] - 19.206)^{0.3767} + 9.94712 - 6.5 \times n) \times x1$$

where n is equal to n1/n2, n1 represents a refractive index of a first liquid on a side of the light incidence, n2 represents a refractive index of a second liquid on a side of the photoelectric conversion unit, x1 represents a distance from the center of an optical axis of an imaging plane to an edge of the imaging plane, and r represents a radius of the convex shape, the first liquid and the second liquid being the two layers of the liquids.

(32)

The imaging device of (28), wherein the convex interference shape is a shape satisfying the following condition:

$$(0.1733 + 1.7 \times n - 0.02993 \times ((n-0.9)^2) \times \text{Arc Sin } [\text{Sin }$$
$$20/n1]) \times x1 \leq r \leq (((n-1.1)^2/0.5^2) \times 9.2769/(\text{Arc Sin }$$
$$[\text{Sin } 30/n1] - 19.206)^{0.3767} + 9.94712 - 6.5 \times n) \times x1$$

where n is equal to n1/n2, n1 represents a refractive index of a first liquid on a side of the light incidence, n2 represents a refractive index of a second liquid on a side of the photoelectric conversion unit, x1 represents a distance from the center of an optical axis of an imaging plane to an edge of the imaging plane, and r represents a radius of the convex shape, the first liquid and the second liquid being the two layers of the liquids, (33)

The imaging device of (28), wherein the convex interference shape is a shape satisfying the following condition:

$$d_{max}' = \text{Arc Sin } [n1 \times \text{Sin } [c_{max}']/n2] - b'$$

$$\text{Arc Cos } [\text{Sqrt}[n^2 - 2 \times n \times \text{Cos } [\text{Tan } [x/(x1/\text{Arc Tan } [d_{max}'])]] + \text{Cos } [\text{Tan } [x/(x1/\text{Arc Tan } [d_{max}'])]]^2]/$$
$$\text{sqrt}[n^2 - 2 \times n \times \text{Cos } [\text{Tan } [x/(x1/\text{Arc Tan } [d_{max}'])]] +$$
$$\text{Cos } [\text{Tan } [x/(x1/\text{Arc Tan } [d_{max}'])]]^2 + \text{Sin } [\text{Tan }$$
$$[x/(x1/\text{Arc Tan } [d_{max}'])]]^2]] - 5 \leq e \leq$$

$$\text{Arc Cos } [\text{Sqrt}[n^2 - 2 \times n \times \text{Cos } [\text{Tan } [x/(x1/\text{Arc Tan } [d_{max}'])]] + \text{Cos } [\text{Tan } [x/(x1/\text{Arc Tan } [d_{max}'])]]^2]/$$
$$\text{sqrt}[n^2 - 2 \times n \times \text{Cos } [\text{Tan } [x/(x1/\text{Arc Tan } [d_{max}'])]] +$$
$$\text{Cos } [\text{Tan } [x/(x1/\text{Arc Tan } [d_{max}'])]]^2 + \text{Sin } [\text{Tan }$$
$$[x/(x1/\text{Arc Tan } [d_{max}'])]]^2]] + 5$$

where e represents an angle between a line perpendicular to a surface of the correction unit and a line perpendicular to an imaging plane, n is equal to n1/n2, n1 represents a refractive index of a first liquid on a side of the light incidence, n2 represents a refractive index of a second liquid on a side of the photoelectric conversion unit, x represents a distance from the center of an optical axis, x1 represents a distance from the center of the optical axis to an edge, cmax' represents a maximum incidence angle of the light incident on the second liquid, and $d_{max}'$ represents a maximum incidence angle of the light in the second liquid, the first liquid and the second liquid being the two layers of the liquids.

(34)

The imaging device of (28), wherein the interference convex shape is a shape satisfying the following condition:

$$d_{max}' = \text{Arc Sin } [n1 \times \text{Sin } [c_{max}']/n2] - b'$$

$$\text{Arc Cos } [\text{Sqrt}[n^2 - 2 \times n \times \text{Cos } [\text{Tan } [x/(x1/\text{Arc Tan } [d_{max}'])]] + \text{Cos } [\text{Tan } [x/(x1/\text{Arc Tan } [d_{max}'])]]^2]/$$
$$\text{sqrt}[n^2 - 2 \times n \times \text{Cos } [\text{Tan } [x/(x1/\text{Arc Tan } [d_{max}'])]] +$$
$$\text{Cos } [\text{Tan } [x/(x1/\text{Arc Tan } [d_{max}'])]]^2 + \text{Sin } [\text{Tan }$$
$$[x/(x1/\text{Arc Tan } [d_{max}'])]]^2]] - 2 \leq e \leq$$

$$\text{Arc Cos } [\text{Sqrt}[n^2 - 2 \times n \times \text{Cos } [\text{Tan } [x/(x1/\text{Arc Tan } [d_{max}'])]] + \text{Cos } [\text{Tan } [x/(x1/\text{Arc Tan } [d_{max}'])]]^2]/$$
$$\text{sqrt}[n^2 - 2 \times n \times \text{Cos } [\text{Tan } [x/(x1/\text{Arc Tan } [d_{max}'])]] +$$
$$\text{Cos } [\text{Tan } [x/(x1/\text{Arc Tan } [d_{max}'])]]^2 + \text{Sin } [\text{Tan }$$
$$[x/(x1/\text{Arc Tan } [d_{max}'])]]^2]] + 2$$

where e represents an angle between a line perpendicular to a surface of the correction unit and a line perpendicular to an imaging plane, n is equal to n1/n2, n1 represents a refractive index of a first liquid on a side of the light incidence, n2 represents a refractive index of a second liquid on a side of the photoelectric conversion unit, x represents a distance from the center of an optical axis, x1 represents a distance from the center of the optical axis to an edge, cmax' represents a maximum incidence angle of the light incident on the second liquid, and $d_{max}'$ represents a maximum incidence angle of the light in the second liquid, the first liquid and the second liquid being the two layers of the liquids.

(35)

An apparatus for manufacturing an imaging device including:
a photoelectric conversion unit; and
a correction unit configured to correct an angle of light incident on the photoelectric conversion unit, the correction unit being located on a light incident side of the photoelectric conversion unit,
wherein the correction unit has a curved surface, wherein a surface shape of the curved surface is spherical, and wherein the surface shape satisfies one of the following conditions:

$(1.15 \times n - 0.38 - 0.0067473 \times ((n-1.2)^2/0.4^2) \times 30) \times x1 \leq r \leq (((n-1.35)^2/0.25^2) \times 23.157/(20-24.925)^{0.46551} + 44.5978 - 29 \times n) \times x1$ or $(1.15 \times n - 0.38 - 0.0067473 \times ((n-1.2)^2/0.4^2) \times 20) \times x1 \leq r \leq (((n-1.35)^2/0.25^2) \times 23.157/(30-24.925)^{0.46551} + 44.5978 - 29 \times n) \times x1$ where r represents a radius of the spherical surface, x1 represents a distance from the center of an optical axis of an imaging plane to an edge of the imaging plane, and n represents a refractive index of a material forming the correction unit.

(36)

An apparatus for manufacturing an imaging device including:
a photoelectric conversion unit; and
a correction unit configured to correct an angle of light incident on the photoelectric conversion unit, the correction unit being located on a light incident side of the photoelectric conversion unit,
wherein the correction unit has a curved surface, wherein a surface shape of the curved surface is spherical, and wherein the surface shape satisfies one of the following conditions:

$(0.1733 + 1.7 \times n - 0.02993 \times ((n-0.9)^2) \times 30) \times x1 \leq r \leq (((n-1.1)^2/0.5^2) \times 9.2769/(20-19.206)^{0.3767} + 9.94712 - 6.5 \times n) \times x1$ or $(0.1733 + 1.7 \times n - 0.02993 \times ((n-0.9)^2) \times 20) \times x1 \leq r \leq (((n-1.1)^2/0.5^2) \times 9.2769/(30-19.206)^{0.3767} + 9.94712 - 6.5 \times n) \times x1$ where r represents a radius of the spherical surface, x1 represents a distance from the center of an optical axis of an imaging plane to an edge of the imaging plane, and n represents a refractive index of a material forming the correction unit.

(37)

An apparatus for manufacturing an imaging device including:
a photoelectric conversion unit; and
a correction unit configured to correct an angle of light incident on the photoelectric conversion unit, wherein the correction unit is located on a light incident side of the photoelectric conversion unit,
wherein the correction unit has a curved surface, wherein a surface shape of the curved surface is aspherical, and wherein the surface shape satisfies one of the following conditions:

Arc Cos $[Sqrt[n^2 - 2 \times n \times Cos [Tan [x/(x1/Arc Tan [a_{max}])]] + Cos [Tan [x/(x1/Arc Tan [a_{max}])]]^2]/sqrt[n^2 - 2 \times n \times Cos [Tan [x/(x1/Arc Tan [a_{max}])]] + Cos [Tan [x/(x1/Arc Tan [a_{max}])]]^2 + Sin [Tan [x/(x1/Arc Tan [a_{max}])]]^2]] - 5 \leq e \leq$ Arc Cos $[Sqrt[n^2 - 2 \times n \times Cos [Tan [x/(x1/Arc Tan [a_{max}])]] + Cos [Tan [x/(x1/Arc Tan [a_{max}])]]^2]/sqrt[n^2 - 2 \times n \times Cos [Tan [x/(x1/Arc Tan [a_{max}])]] + Cos [Tan [x/(x1/Arc Tan [a_{max}])]]^2 + Sin [Tan [x/(x1/Arc Tan [a_{max}])]]^2]] + 5$ or Arc Cos $[Sqrt[n^2 - 2 \times n \times Cos [Tan [x/(x1/Arc Tan [a_{max}])]] + Cos [Tan [x/(x1/Arc Tan [a_{max}])]]^2]/sqrt[n^2 - 2 \times n \times Cos [Tan [x/(x1/Arc Tan [a_{max}])]] + Cos [Tan [x/(x1/Arc Tan [a_{max}])]]^2 + Sin [Tan [x/(x1/Arc Tan [a_{max}])]]^2]] - 2 \leq e \leq$ Arc Cos $[Sqrt[n^2 - 2 \times n \times Cos [Tan [x/(x1/Arc Tan [a_{max}])]] + Cos [Tan [x/(x1/Arc Tan [a_{max}])]]^2]/sqrt[n^2 - 2 \times n \times Cos [Tan [x/(x1/Arc Tan [a_{max}])]] + Cos [Tan [x/(x1/Arc Tan [a_{max}])]]^2 + Sin [Tan [x/(x1/Arc Tan [a_{max}])]]^2]] + 2$ where e represents an angle between a line perpendicular to a surface of the correction unit and a line perpendicular to an imaging plane, n represents a refractive index of a material forming the correction unit, x represents a distance from the center of an optical axis, x1 represents a distance from the center of the optical axis to an edge, $a_{max}$ represents a maximum incidence angle of the light, and the $a_{max}$ is from 20 to 30 degrees.

(38)

A method of manufacturing an apparatus for manufacturing an imaging device including:
a photoelectric conversion unit; and
a correction unit configured to correct an angle of light incident on the photoelectric conversion unit, the correction unit being located on a light incident side of the photoelectric conversion unit,
the method comprising:
manufacturing the correction unit, the correction unit having one of: 1) a spherical surface shape; and 2) an aspherical surface shape,
wherein the surface shape satisfies one of the following conditions:

$(1.15 \times n - 0.38 - 0.0067473 \times ((n-1.2)^2/0.4^2) \times a_{max}) \times x1 \leq r \leq (((n-1.35)^2/0.25^2) \times 23.157/(a_{max} - 24.925)^{0.46551} + 44.5978 - 29 \times n) \times x1$ $(0.1733 + 1.7 \times n - 0.02993 \times ((n-0.9)^2) \times a_{max}) \times x1 \leq r \leq (((n-1.1)^2/0.5^2) \times 9.2769/(a_{max} - 19.206)^{0.3767} + 9.94712 - 6.5 \times n) \times x1$ Arc Cos $[Sqrt[n^2 - 2 \times n \times Cos [a] + Cos [a]^2]/sqrt[n^2 - 2 \times n \times Cos [a] + Cos [a]^2 + Sin [a]^2]] - 5 \leq e \leq$ Arc Cos $[Sqrt[n^2 - 2 \times n \times Cos [a] + Cos [a]^2]/sqrt[n^2 - 2 \times n \times Cos [a] + Cos [a]^2 + Sin [a]^2]] + 5$ or Arc Cos $[Sqrt[n^2 - 2 \times n \times Cos [a] + Cos [a]^2]/sqrt[n^2 - 2 \times n \times Cos [a] + Cos [a]^2 + Sin [a]^2]] - 2 \leq e \leq$ Arc Cos $[Sqrt[n^2 - 2 \times n \times Cos [a] + Cos [a]^2]/sqrt[n2 - 2 \times n \times Cos [a] + Cos [a]^2 + Sin [a]^2]] + 2$ where r represents a radius of the spherical surface, x1 represents a distance from the center of an optical axis of an imaging plane to an edge of the imaging plane, n represents a refractive index of a material forming the correction unit, $a_{max}$ represents a maximum incidence angle of the light, a represents the incidence angle of the light, and e represents an angle between a line perpendicular to a surface of the correction unit and a line perpendicular to the imaging plane.

(39)

An electronic apparatus comprising:
an imaging device including:
a photoelectric conversion unit; and
a correction unit configured to correct an angle of light incident on the photoelectric conversion unit, the correction unit being located on a light incident side of the photoelectric conversion unit; and
a signal processing unit configured to perform signal processing on a pixel signal, the pixel signal being output from the photoelectric conversion unit.

(40)

An electronic apparatus including:
an imaging device including:
a photoelectric conversion unit; and a correction unit that corrects the angle of light incident on the photoelectric conversion unit, the correction unit being located on the side of the light incident on the photoelectric conversion unit; and a signal processing unit that performs signal processing on a pixel signal that is output from the photoelectric conversion unit.

It should be understood by those skilled in the art that various modifications, combinations, sub-combinations and alterations may occur depending on design requirements and other factors insofar as they are within the scope of the appended claims or the equivalents thereof.

REFERENCE SIGNS LIST

10 Imaging device
11 Microlens
12 Color filter layer
13 Light shielding layer
14 Photodiode
31 Correcting lens
101 Lens unit
121 Transforming unit
151 Liquid lens
152 Aqueous solution
153 Oil
154 Electrode

The invention claimed is:

1. An imaging device, comprising:
a photoelectric conversion unit that includes at least one micro lens and at least one photodiode;
a correction unit that converts a first angle of light incident on the at least one micro lens in an oblique direction with respect to an imaging plane into a second angle of the light incident in a perpendicular direction with respect to the imaging plane,
wherein the at least one micro lens is in between the correction unit and the at least one photodiode, and
wherein the correction unit is on a light incident side of the photoelectric conversion unit; and
a transparent material between the correction unit and the photoelectric conversion unit,
wherein the transparent material attaches the at least one micro lens to the correction unit.

2. The imaging device according to claim 1,
wherein the correction unit has a curved surface,
wherein a surface shape of the curved surface is a spherical surface, and
wherein the surface shape satisfies following condition:

$$(1.15 \times n - 0.38 - 0.0067473 \times ((n-1.2)^2/0.4^2) \times 30) \times x1 \leq r \leq (((n-1.35)^2/0.25^2) \times 23.157/(20-24.925)^{0.46551} + 44.5978 - 29 \times n) \times x1$$

where r represents a radius of the spherical surface, x1 represents a distance from a center of an optical axis of the imaging plane to an edge of the imaging plane, and n represents a refractive index of a material of the correction unit.

3. The imaging device according to claim 1,
wherein the correction unit has a curved surface,
wherein a surface shape of the curved surface is a spherical surface, and
wherein the surface shape satisfies following condition:

$$(1.15 \times n - 0.38 - 0.0067473 \times ((n-1.2)^2/0.4^2) \times 30) \times x1 \leq r \leq (((n-1.35)^2/0.25^2) \times 23.157/(30-24.925)^{0.46551} + 44.5978 - 29 \times n) \times x1$$

where r represents a radius of the spherical surface, x1 represents a distance from a center of an optical axis of the imaging plane to an edge of the imaging plane, and n represents a refractive index of a material of the correction unit.

4. The imaging device according to claim 1,
wherein the correction unit has a curved surface,
wherein a surface shape of the curved surface is a spherical surface, and
wherein the surface shape satisfies following condition:

$$(0.1733 + 1.7 \times n - 0.02993 \times ((n-0.9)^2) \times 30) \times x1 \leq r \leq (((n-1.1)^2/0.5^2) \times 9.2769/(20-19.206)^{0.3767} + 9.94712 - 6.5 \times n) \times x1$$

where r represents a radius of the spherical surface, x1 represents a distance from a center of an optical axis of the imaging plane to an edge of the imaging plane, and n represents a refractive index of a material of the correction unit.

5. The imaging device according to claim 1,
wherein the correction unit has a curved surface,
wherein a surface shape of the curved surface is a spherical surface, and
wherein the surface shape satisfies following condition:

$$(0.1733 + 1.7 \times n - 0.02993 \times ((n-0.9)^2) \times 20) \times x1 \leq r \leq (((n-1.1)^2/0.5^2) \times 9.2769/(30-19.206)^{0.3767} + 9.94712 - 6.5 \times n) \times x1$$

where r represents a radius of the spherical surface, x1 represents a distance from a center of an optical axis of the imaging plane to an edge of the imaging plane, and n represents a refractive index of a material of the correction unit.

6. The imaging device according to claim 1,
wherein the correction unit has a curved surface,
wherein a surface shape of the curved surface is an aspherical surface, and
wherein the surface shape satisfies following condition:

$$\text{Arc Cos}[\text{Sqrt}[n^2 - 2 \times n \times \text{Cos}[\text{Tan}[x/(x1/\text{Arc Tan}[a_{max}])]] + \text{Cos}[\text{Tan}[x/(x1/\text{Arc Tan}[a_{max}])]]^2] / \text{sqrt}[n^2 - 2 \times n \times \text{Cos}[\text{Tan}[x/(x1/\text{Arc Tan}[a_{max}])]] + \text{Cos}[\text{Tan}[x/(x1/\text{Arc Tan}[a_{max}])]]^2 + \text{Sin}[\text{Tan}[x/(x1/\text{Arc Tan}[a_{max}])]]^2]] - 5 \leq e \leq$$

$$\text{Arc Cos}[\text{Sqrt}[n^2 - 2 \times n \times \text{Cos}[\text{Tan}[x/(x1/\text{Arc Tan}[a_{max}])]] + \text{Cos}[\text{Tan}[x/(x1/\text{Arc Tan}[a_{max}])]]^2] / \text{sqrt}[n^2 - 2 \times n \times \text{Cos}[\text{Tan}[x/(x1/\text{Arc Tan}[a_{max}])]] + \text{Cos}[\text{Tan}[x/(x1/\text{Arc Tan}[a_{max}])]]^2 + \text{Sin}[\text{Tan}[x/(x1/\text{Arc Tan}[a_{max}])]]^2]] + 5$$

where e represents an angle between a line perpendicular to a surface of the correction unit and a line perpendicular to the imaging plane, n represents a refractive index of a material of the correction unit, x represents a distance from a center of an optical axis, x1 represents a distance from the center of the optical axis to an edge, $a_{max}$ represents a maximum incidence angle of the light, and the $a_{max}$ is from 20 to 30 degrees.

7. The imaging device according to claim 1,
wherein the correction unit has a curved surface,
wherein a surface shape of the curved surface is an aspherical surface, and
wherein the surface shape satisfies following condition:

$$\text{Arc Cos}[\text{Sqrt}[n^2 - 2 \times n \times \text{Cos}[\text{Tan}[x/(x1/\text{Arc Tan}[a_{max}])]] + \text{Cos}[\text{Tan}[x/(x1/\text{Arc Tan}[a_{max}])]]^2] / \text{sqrt}[n^2 - 2 \times n \times \text{Cos}[\text{Tan}[x/(x1/\text{Arc Tan}[a_{max}])]] + \text{Cos}[\text{Tan}[x/(x1/\text{Arc Tan}[a_{max}])]]^2 + \text{Sin}[\text{Tan}[x/(x1/\text{Arc Tan}[a_{max}])]]^2]] - 2 \leq e \leq \text{Arc Cos}[\text{Sqrt}[n^2 - 2 \times n \times \text{Cos}[\text{Tan}[x/(x1/\text{Arc Tan}[a_{max}])]] + \text{Cos}[\text{Tan}[x/(x1/\text{Arc Tan}[a_{max}])]]^2] / \text{sqrt}[n^2 - 2 \times n \times \text{Cos}$$

$[\text{Tan } [x/(x1/\text{Arc Tan } [a_{max}])]]+\text{Cos } [\text{Tan } [x/(x1/\text{Arc Tan } [a_{max}])]]^2+\text{Sin } [\text{Tan } [x/(x1/\text{Arc Tan } [a_{max}])]]2]]+2$ where e represents an angle in degrees between a line perpendicular to a surface of the correction unit and a line perpendicular to the imaging plane, n represents a refractive index of a material of the correction unit, x represents a distance from a center of an optical axis, x1 represents a distance from the center of the optical axis to an edge, $a_{max}$ represents a maximum incidence angle of the light, and $a_{max}$ is from 20 to 30 degrees.

8. The imaging device according to claim 1,
wherein the correction unit is at least one of a convertible lens or a shape-variable lens, and
wherein a surface shape of the correction unit is controlled by a tension stress.

9. The imaging device according to claim 1,
wherein the correction unit is one of a convertible lens and a shape-variable lens,
wherein the correction unit includes two layers of liquids,
wherein one layer of liquid of the two layers of the liquids has a convex interference shape, and
wherein the convex interference shape of the one layer of the liquid is controlled by a voltage application.

10. The imaging device according to claim 9,
wherein the convex interference shape is a shape that satisfies following condition:

$(1.15 \times n-0.38-0.0067473 \times ((n-1.2)^2/0.4^2) \times \text{Arc Sin} [\text{Sin } 30/n1]) \times x1 \leq r \leq (((n-1.35)^2/0.25^2) \times 23.157/(\text{Arc Sin } [\text{Sin } 20/n1]-24.925)^{0.46551}+44.5978-29 \times n) \times x1$ where n is equal to n1/n2, n1 represents a first refractive index of a first liquid of the liquids on a side of light incidence, n2 represents a second refractive index of a second liquid of the liquids on a side of the photoelectric conversion unit, x1 represents a distance from a center of an optical axis of the imaging plane to an edge of the imaging plane, and r represents a radius of the convex interference shape.

11. The imaging device according to claim 9,
wherein the convex interference shape is a shape that satisfies following condition:

$(1.15 \times n-0.38-0.0067473 \times ((n-1.2)^2/0.4^2) \times \text{Arc Sin} [\text{Sin } 20/n1]) \times x1 \leq r \leq (((n-1.35)^2/0.25^2) \times 23.157/(\text{Arc Sin } [\text{Sin } 30/n1]-24.925)^{0.46551}+44.5978-29 \times n) \times x1$ where n is equal to n1/n2, n1 represents a first refractive index of a first liquid of the liquids on a side of light incidence, n2 represents a second refractive index of a second liquid of the liquids on a side of the photoelectric conversion unit, x1 represents a distance from a center of an optical axis of the imaging plane to an edge of the imaging plane, and r represents a radius of the convex interference shape.

12. The imaging device according to claim 9,
wherein the convex interference shape is a shape that satisfies following condition:

$(0.1733+1.7 \times n-0.02993 \times ((n-0.9)^2) \times \text{Arc Sin} [\text{Sin } 30/n1]) \times x1 \leq r \leq (((n-1.1)^2/0.5^2) \times 9.2769/(\text{Arc Sin } [\text{Sin } 20/n1]-19.206)^{0.3767}+9.94712-6.5 \times n) \times x1$ where n is equal to n1/n2, n1 represents a first refractive index of a first liquid of the liquids on a side of light incidence, n2 represents a second refractive index of a second liquid of the liquids on a side of the photoelectric conversion unit, x1 represents a distance from a center of an optical axis of the imaging plane to an edge of the imaging plane, and r represents a radius of the convex interference shape.

13. The imaging device according to claim 9,
wherein the convex interference shape is a shape that satisfies following condition:

$(0.1733+1.7 \times n-0.02993 \times ((n-0.9)^2) \times \text{Arc Sin} [\text{Sin } 20/n1]) \times x1 \leq r \leq (((n-1.1)^2/0.5^2) \times 9.2769/(\text{Arc Sin } [\text{Sin } 30/n1]-19.206)^{0.3767}+9.94712-6.5 \times n) \times x1$ where n is equal to n1/n2, n1 represents a first refractive index of a first liquid of the liquids on a side of light incidence, n2 represents a second refractive index of a second liquid of the liquids on a side of the photoelectric conversion unit, x1 represents a distance from a center of an optical axis of the imaging plane to an edge of the imaging plane, and r represents a radius of the convex interference shape.

14. The imaging device according to claim 9,
wherein the convex interference shape is a shape that satisfies following condition:

$d_{max}'=\text{Arc Sin } [n1 \times \text{Sin } [c_{max}']/n2]-b'$ $\text{Arc Cos } [\text{Sqrt}[n^2-2 \times n \times \text{Cos } [\text{Tan } [x/(x1/\text{Arc Tan } [d_{max}'])]]+\text{Cos } [\text{Tan } [x/(x1/\text{Arc Tan } [d_{max}'])]]^2]/\text{sqrt}[n^2-2 \times n \times \text{Cos } [\text{Tan } [x/(x1/\text{Arc Tan } [d_{max}'])]]+\text{Cos } [\text{Tan } [x/(x1/\text{Arc Tan } [d_{max}'])]]^2+\text{Sin } [\text{Tan } [x/(x1/\text{Arc Tan } [d_{max}'])]]2]]-5 \leq e \leq$ $\text{Arc Cos } [\text{Sqrt}[n^2-2 \times n \times \text{Cos } [\text{Tan } [x/(x1/\text{Arc Tan } [d_{max}'])]]+\text{Cos } [\text{Tan } [x/(x1/\text{Arc Tan } [d_{max}'])]]^2]/\text{sqrt}[n^2-2 \times n \times \text{Cos } [\text{Tan } [x/(x1/\text{Arc Tan } [d_{max}'])]]+\text{COS } [\text{Tan } [x/(x1/\text{Arc Tan } [d_{max}'])]]^2+\text{Sin } [\text{Tan } [x/(x1/\text{Arc Tan } [d_{max}'])]]]]+5$ where e represents an angle between a line perpendicular to a surface of the correction unit and a line perpendicular to the imaging plane, n is equal to n1/n2, n1 represents a first refractive index of a first liquid of the liquids on a side of light incidence, n2 represents a second refractive index of a second liquid of the liquids on a side of the photoelectric conversion unit, x represents a distance from a center of an optical axis, x1 represents a distance from the center of the optical axis to an edge, $c_{max}'$ represents a maximum incidence angle of the light incident on the second liquid, and $d_{max}'$ represents a maximum incidence angle of the light in the second liquid.

15. The imaging device according to claim 9,
wherein the convex interference shape is a shape that satisfies following condition:

$d_{max}'=\text{Arc Sin } [n1 \times \text{Sin } [c_{max}']/n2]-b'$ $\text{Arc Cos } [\text{Sqrt}[n^2-2 \times n \times \text{Cos } [\text{Tan } [x/(x1/\text{Arc Tan } [d_{max}'])]]+\text{Cos } [\text{Tan } [x/(x1/\text{Arc Tan } [d_{max}'])]]^2]/\text{sqrt}[n^2-2 \times n \times \text{Cos } [\text{Tan } [x/(x1/\text{Arc Tan } [d_{max}'])]]+\text{Cos } [\text{Tan } [x/(x1/\text{Arc Tan } [d_{max}'])]]^2+\text{Sin } [\text{Tan } [x/(x1/\text{Arc Tan } [d_{max}'])]]^2]]-2 \leq e \leq$ $\text{Arc Cos } [\text{Sqrt}[n^2-2 \times n \times \text{Cos } [\text{Tan } [x/(x1/\text{Arc Tan } [d_{max}'])]]+\text{Cos } [\text{Tan } [x/(x1/\text{Arc Tan } [d_{max}'])]]^2]/\text{sqrt}[n^2-2 \times n \times \text{Cos } [\text{Tan } [x/(x1/\text{Arc Tan } [d_{max}'])]]+\text{Cos } [\text{Tan } [x/(x1/\text{Arc Tan } [d_{max}'])]]^2+\text{Sin } [\text{Tan } [x/(x1/\text{Arc Tan } [d_{max}'])]]^2]]+2$ where e represents an angle between a line perpendicular to a surface of the correction unit and a line perpendicular to the imaging plane, n is equal to n1/n2, n1 represents a first refractive index of a first liquid of the liquids on a side of light incidence, n2 represents a second refractive index of a second liquid of the liquids on a side of the photoelectric conversion unit, x represents a distance from a center of an optical axis, x1 represents a distance from the center of the optical axis to an edge, $c_{max}'$ represents a maximum incidence angle of the light incident on the second liquid, and $d_{max}'$ represents a maximum incidence angle of the light in the second liquid.

16. An apparatus, comprising:

a photoelectric conversion unit that includes at least one micro lens and at least one photodiode;

a correction unit that converts a first angle of light incident on the at least one micro lens in an oblique direction with respect to an imaging plane into a second angle of the light incident on the at least one micro lens in a perpendicular direction with respect to the imaging plane, wherein the at least one micro lens is in between the correction unit and the at least one photodiode, wherein the correction unit is on a light incident side of the photoelectric conversion unit, wherein the correction unit has a curved surface, wherein a surface shape of the curved surface is a spherical shape, and wherein the surface shape satisfies one of following conditions:

$$(1.15 \times n - 0.38 - 0.0067473 \times ((n-1.2)^2/0.4^2) \times 30) \times x1 \leq r \leq (((n-1.35)^2/0.25^2) \times 23.157/(20-24.925)^{0.46551} + 44.5978 - 29 \times n) \times x1$$

or $$(1.15 \times n - 0.38 - 0.0067473 \times ((n-1.2)^2/0.4^2) \times 20) \times x1 \leq r \leq (((n-1.35)^2/0.25^2) \times 23.157/(30-24.925)^{0.46551} + 44.5978 - 29 \times n) \times x1$$

where r represents a radius of the spherical shape of the curved surface, x1 represents a distance from a center of an optical axis of the imaging plane to an edge of the imaging plane, and n represents a refractive index of a material of the correction unit; and a transparent material between the correction unit and the photoelectric conversion unit, wherein the transparent material attaches the at least one micro lens to the correction unit.

17. An apparatus, comprising:

a photoelectric conversion unit that includes at least one micro lens and at least one photodiode;

a correction unit that converts a first angle of light incident on the at least one micro lens in an oblique direction with respect to an imaging plane into a second angle of the light incident on the at least one micro lens in a perpendicular direction with respect to the imaging plane, wherein the at least one micro lens is in between the correction unit and the at least one photodiode of the photoelectric conversion unit, wherein the correction unit is on a light incident side of the photoelectric conversion unit, wherein the correction unit has a curved surface, wherein a surface shape of the curved surface is a spherical shape, and wherein the surface shape satisfies one of following conditions:

$$(0.1733 + 1.7 \times n - 0.02993 \times ((n-0.9)^2) \times 30) \times x1 \leq r \leq (((n-1.1)^2/0.5^2) \times 9.2769/(20-19.206)^{0.3767} + 9.94712 - 6.5 \times n) \times x1$$

or $$(0.1733 + 1.7 \times n - 0.02993 \times ((n-0.9)^2) \times 20) \times x1 \leq r \leq (((n-1.1)^2/0.5^2) \times 9.2769/(30-19.206)^{0.3767} + 9.94712 - 6.5 \times n) \times x1$$

where r represents a radius of the spherical shape of the curved surface, x1 represents a distance from a center of an optical axis of the imaging plane to an edge of the imaging plane, and n represents a refractive index of a material of the correction unit; and a transparent material between the correction unit and the photoelectric conversion unit, wherein the transparent material attaches the at least one micro lens to the correction unit.

18. An apparatus, comprising:

a photoelectric conversion unit that includes at least one micro lens and at least one photodiode;

a correction unit that converts a first angle of light incident on the at least one micro lens in an oblique direction with respect to an imaging plane into a second angle of the light incident on the at least one micro lens in a perpendicular direction with respect to the imaging plane, wherein the at least one micro lens is in between the correction unit and the at least one photodiode, wherein the correction unit is on a light incident side of the photoelectric conversion unit, wherein the correction unit has a curved surface, wherein a surface shape of the curved surface is aspherical, and wherein the surface shape satisfies one of following conditions:

$$\text{Arc Cos } [\text{Sqrt}[n^2 - 2 \times n \times \text{Cos } [\text{Tan } [x/(x1/\text{Arc Tan } [a_{max}])]] + \text{Cos } [\text{Tan } [x/(x1/\text{Arc Tan } [a_{max}])]]^2]/\text{sqrt}[n^2 - 2 \times n \times \text{Cos } [\text{Tan } [x/(x1/\text{Arc Tan } [a_{max}])]] + \text{Cos } [\text{Tan } [x/(x1/\text{Arc Tan } [a_{max}])]]^2 + \text{Sin } [\text{Tan } [x/(x1/\text{Arc Tan } [a_{max}])]]^2]] - 5 \leq e \leq$$

$$\text{Arc Cos } [\text{Sqrt}[n^2 - 2 \times n \times \text{Cos } [\text{Tan } [x/(x1/\text{Arc Tan } [a_{max}])]] + \text{Cos } [\text{Tan } [x/(x1/\text{Arc Tan } [a_{max}])]]^2]/\text{sqrt}[n^2 - 2 \times n \times \text{Cos } [\text{Tan } [x/(x1/\text{Arc Tan } [a_{max}])]] + \text{Cos } [\text{Tan } [x/(x1/\text{Arc Tan } [a_{max}])]]^2 + \text{Sin } [\text{Tan } [x/(x1/\text{Arc Tan } [a_{max}])]]^2]] + 5$$

or $$\text{Arc Cos } [\text{Sqrt}[n^2 - 2 \times n \times \text{Cos } [\text{Tan } [x/(x1/\text{Arc Tan } [a_{max}])]] + \text{Cos } [\text{Tan } [x/(x1/\text{Arc Tan } [a_{max}])]]^2]/\text{sqrt}[n^2 - 2 \times n \times \text{Cos } [\text{Tan } [x/(x1/\text{Arc Tan } [a_{max}])]] + \text{Cos } [\text{Tan } [x/(x1/\text{Arc Tan } [a_{max}])]]^2 + \text{Sin } [\text{Tan } [x/(x1/\text{Arc Tan } [a_{max}])]]^2]] - 2 \leq e \leq$$

$$\text{Arc Cos } [\text{Sqrt}[n^2 - 2 \times n \times \text{Cos } [\text{Tan } [x/(x1/\text{Arc Tan } [a_{max}])]] + \text{Cos } [\text{Tan } [x/(x1/\text{Arc Tan } [a_{max}])]]_2]/\text{sqrt}[n^2 - 2 \times n \times \text{Cos } [\text{Tan } [x/(x1/\text{Arc Tan } [a_{max}])]] + \text{Cos } [\text{Tan } [x/(x1/\text{Arc Tan } [a_{max}])]]^2 + \text{Sin } [\text{Tan } [x/(x1/\text{Arc Tan } [a_{max}])]]^2]] + 2$$

where e represents an angle between a line perpendicular to a surface of the correction unit and a line perpendicular to the imaging plane, n represents a refractive index of a material of the correction unit, x represents a distance from a center of an optical axis, x1 represents a distance from the center of the optical axis to an edge, $a_{max}$ represents a maximum incidence angle of the light, and the $a_{max}$ is from 20 to 30 degrees; and a transparent material between the correction unit and the photoelectric conversion unit, wherein the transparent material attaches the at least one micro lens to the correction unit.

19. A method of manufacturing an apparatus for manufacturing an imaging device, the method comprising:

manufacturing a correction unit, wherein the correction unit includes at least one of a spherical surface shape or an aspherical surface shape, wherein a surface shape of the at least one of the spherical surface shape or the aspherical surface shape satisfies one of following conditions:

$$(1.15 \times n - 0.38 - 0.0067473 \times ((n-1.2)^2/0.4^2) \times a_{max}) \times x1 \leq r \leq (((n-1.35)^2/0.25^2) \times 23.157/(a_{max}-24.925)^{0.46551} + 44.5978 - 29 \times n) \times x1$$

$$(0.1733 + 1.7 \times n - 0.02993 \times ((n-0.9)^2) \times a_{max}) \times x1 \leq r \leq (((n-1.1)^2/0.5^2) \times 9.2769/(a_{max}-19.206)^{0.3767} + 9.94712 - 6.5 \times n) \times x1$$

$$\text{Arc Cos } [\text{Sqrt}[n^2 - 2 \times n \times \text{Cos } [a] + \text{Cos } [a]^2]/\text{sqrt}[n^2 - 2 \times n \times \text{Cos } [a] + \text{Cos } [a]^2 + \text{Sin } [a]^2]] - 5 \leq e \leq \text{Arc Cos } [\text{Sqrt}[n^2 - 2 \times n \times \text{Cos } [a] + \text{Cos } [a]^2]/\text{sqrt}[n^2 - 2 \times n \times \text{Cos } [a] + \text{Cos } [a]^2 + \text{Sin } [a]^2]] + 5$$

or $$\text{Arc Cos } [\text{Sqrt}[n^2 - 2 \times n \times \text{Cos } [a] + \text{Cos } [a]^2]/\text{sqrt}[n^2 - 2 \times n \times \text{Cos } [a] + \text{Cos } [a]^2 + \text{Sin } [a]^2]] - 2 \leq e \leq \text{Arc Cos } [\text{Sqrt}[n^2 - 2 \times n \times \text{Cos } [a] + \text{Cos } [a]^2]/\text{sqrt}[n2 - 2 \times n \times \text{Cos } [a] + \text{Cos } [a]^2 + \text{Sin } [a]^2]] + 2$$

where r represents a radius of the surface shape x1 represents a distance from a center of an optical axis of an imaging plane to an edge of the imaging plane, n represents a refractive index of a material forming the correction unit, $a_{max}$ represents a maximum incidence angle of light, a1 represents an incidence angle of the light, and e represents an angle between a line perpendicular to a surface of the correction unit and a line perpendicular to the imaging plane, wherein the imaging device includes a photoelectric conversion unit, and the correction unit, wherein the photoelectric conversion unit includes at least one micro lens and at least one photodiode wherein the manufactured correction unit converts a first angle of light incident on the at least one micro lens in an oblique direction with respect to the imaging plane into a second angle of the light incident on the at least one micro lens in a perpendicular direction with respect to the imaging plane, wherein the at least one micro lens is in between the correction unit and the at least one photodiode, wherein the correction unit is on a light incident side of the photoelectric conversion unit, wherein a transparent material is between the correction unit and the photoelectric conversion unit, and wherein the transparent material attaches the at least one micro lens to the correction unit.

20. An electronic apparatus, comprising:

an imaging device including:

a photoelectric conversion unit that includes at least one micro lens and at least one photodiode;

a correction unit that converts a first angle of light incident on the at least one micro lens in an oblique direction with respect to an imaging plane into a second angle of the light incident on the at least one micro lens in a perpendicular direction with respect to the imaging plane, wherein the at least one micro lens is in between the correction unit and the at least one photodiode of the photoelectric conversion unit, wherein the correction unit is on a light incident side of the photoelectric conversion unit;

a transparent material between the correction unit and the photoelectric conversion unit, wherein the transparent material attaches the at least one micro lens to the correction unit; and a signal processing unit executes signal processing on a pixel signal, wherein the pixel signal is output from the photoelectric conversion unit.

* * * * *